United States Patent

Tanaka et al.

[11] Patent Number: 5,978,270
[45] Date of Patent: Nov. 2, 1999

[54] SEMICONDUCTOR NON-VOLATILE MEMORY DEVICE AND COMPUTER SYSTEM USING THE SAME

[75] Inventors: Toshihiro Tanaka, Akiruno; Masataka Kato, Koganei; Osamu Tsuchiya, Hamura; Toshiaki Nishimoto, Tachikawa, all of Japan

[73] Assignee: Hitachi, Ltd., Tokyo, Japan

[21] Appl. No.: 09/029,748

[22] PCT Filed: Aug. 29, 1996

[86] PCT No.: PCT/JP96/02419

§ 371 Date: Mar. 2, 1998

§ 102(e) Date: Mar. 2, 1998

[87] PCT Pub. No.: WO97/08707

PCT Pub. Date: Mar. 6, 1997

[30] Foreign Application Priority Data

Aug. 31, 1995 [JP] Japan .................................... 7-223016
Sep. 1, 1995 [JP] Japan .................................... 7-224991
Sep. 8, 1995 [JP] Japan .................................... 7-231025

[51] Int. Cl.$^6$ .................................................. G11C 16/06
[52] U.S. Cl. ................................ 365/185.22; 365/185.11; 365/185.24
[58] Field of Search .......................... 365/185.22, 185.24, 365/185.29, 185.21, 185.11, 218

[56] References Cited

U.S. PATENT DOCUMENTS 5,475,249 12/1995 Watsuji et al. ...................... 365/185.22
5,886,927 3/1999 Takeuchi ............................ 365/185.22

FOREIGN PATENT DOCUMENTS 2-40199 2/1990 Japan .
4-153999 5/1992 Japan .
5-28783 2/1993 Japan .

(List continued on next page.)

OTHER PUBLICATIONS

Kobayashi et al., "Memory Array Architecture and Decoding Scheme for 3V Only Sector Erasable DINOR Flash Memory", Symposium on VLSI Circuits Digest of Technical Papers (1993), pp. 97–98.

Umezawa et al., "A New Self–Data–Refresh Scheme for a Sector Erasable 16–Mb Flash EEPROM", Symposium on VLSI Circuits Digest of Tecnical Papers (1993), pp. 99–100.

Takashima et al., "Stand–by/Active Mode Logic for Sub–1 V 1G/4Gb DRAMs", Symposium on VLSI Circuits Digest of Technical Papers (1993), pp. 83–84.

(List continued on next page.)

*Primary Examiner*—Trong Q. Phan
*Attorney, Agent, or Firm*—Antonelli, Terry, Stout & Kraus, LLP

[57] ABSTRACT

After decreasing the threshold voltages of a plurality of memory cells collectively or selectively, the presence or absence of any memory cell of which the threshold voltage has dropped below a predetermined voltage verified collectively for each of memory cell groups connected to word line (low-threshold value verification), and any memory cell of which the threshold voltage has excessively dropped is selectively written. Also, the well of each of memory cell is formed in the region of an element isolation layer for isolating it from the substrate of a memory apparatus, and a negative voltage is supplied to the memory well distributively with a positive voltage applied as a word line voltage, thus supplying them as erase operation voltages. The absolute value of the memory well voltage is set substantially equal to or lower than the word line voltage for the read operation. Sectors constituting each memory mat includes a sector (selected sector) selected for the erase operation with each word line thereof supplied with a positive voltage, a sector (non-selected sector) not selected for the erase operation with a word line voltage different from a memory well voltage, and further a sector (completely non-selected sector) not selected for the erase operation with a word line voltage equal to the voltage between a source and a drain of the memory cell.

22 Claims, 46 Drawing Sheets

FOREIGN PATENT DOCUMENTS

| | | |
|---|---|---|
| 5-326891 | 12/1993 | Japan . |
| 6-28875 | 2/1994 | Japan . |
| 6-176587 | 6/1994 | Japan . |
| 7-130888 | 5/1995 | Japan . |
| 7-176705 | 7/1995 | Japan . |
| 8-102198 | 4/1996 | Japan . |

OTHER PUBLICATIONS

Tanaka et al., "High–Speed Programming and Program Verify Methods . . . ", 1994 Symposium on VLSI Circuits Digest of Technical Papers, pp. 61–62.

Hisamune et al., "A High Capacitive–Coupling Ratio (HiCR) Cell for 3 V–Only 64 Mbit and Future Flash Memories", IEEE meeting technical digest 1993. pp. 2.3.1–2.3.4.

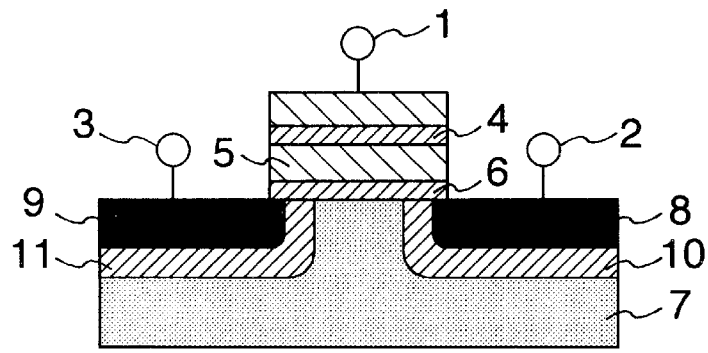
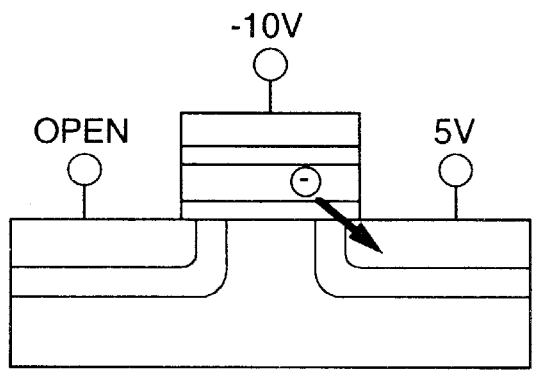
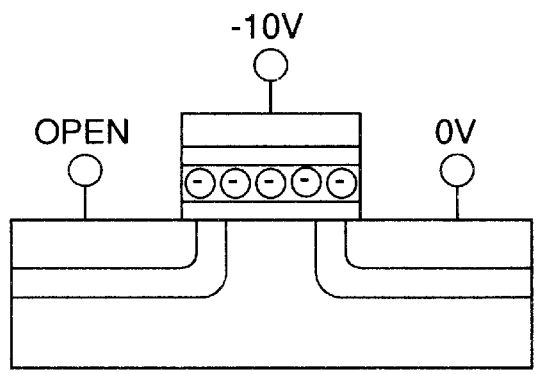
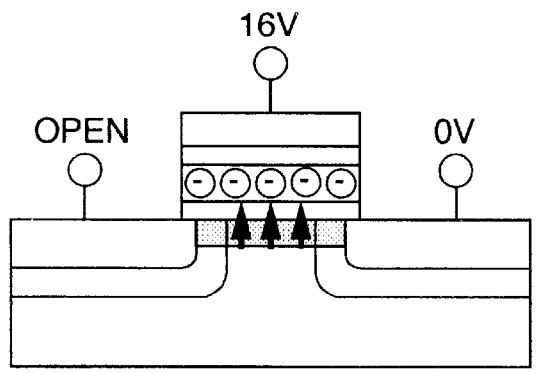
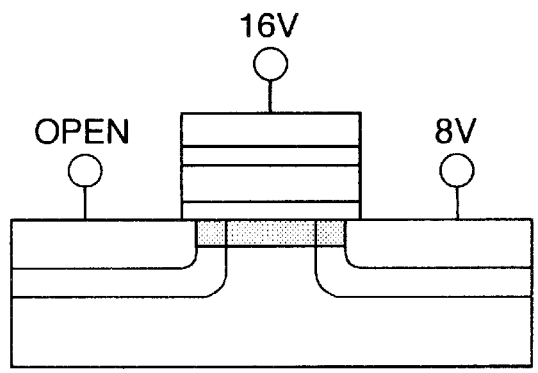

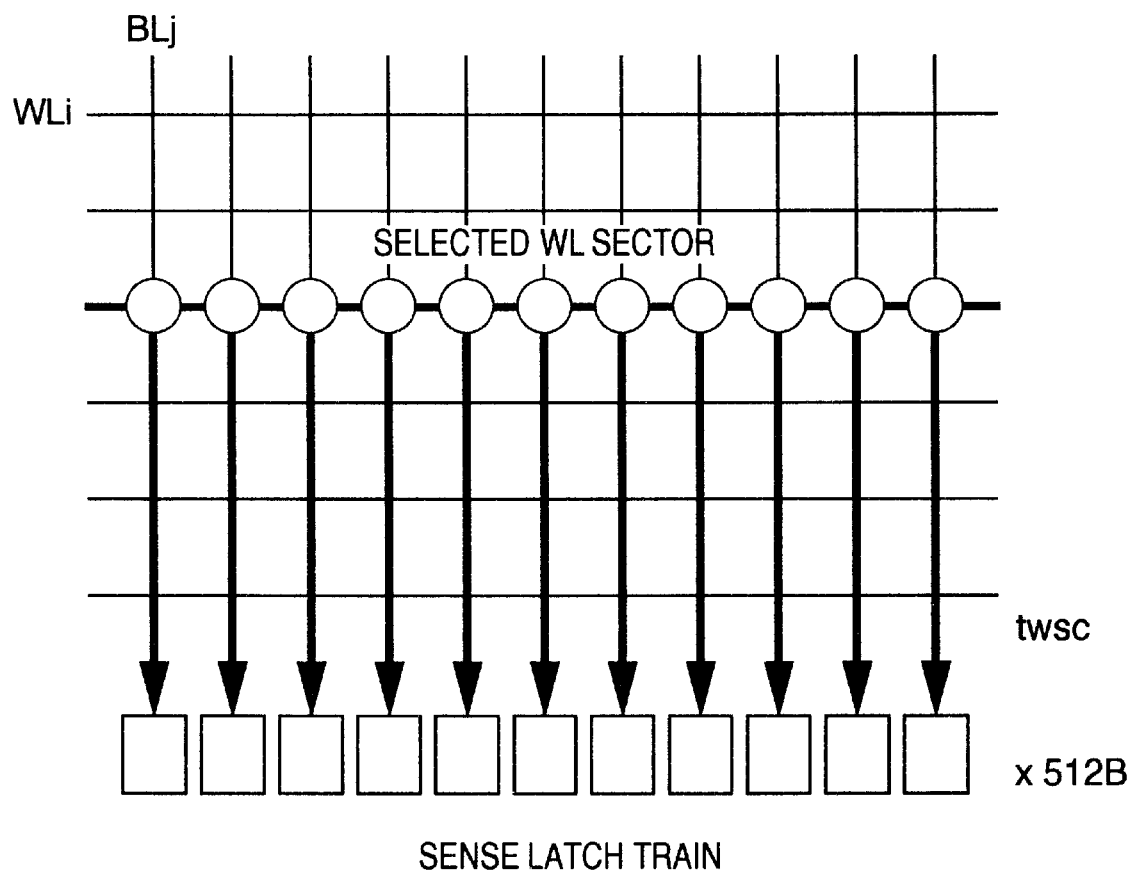

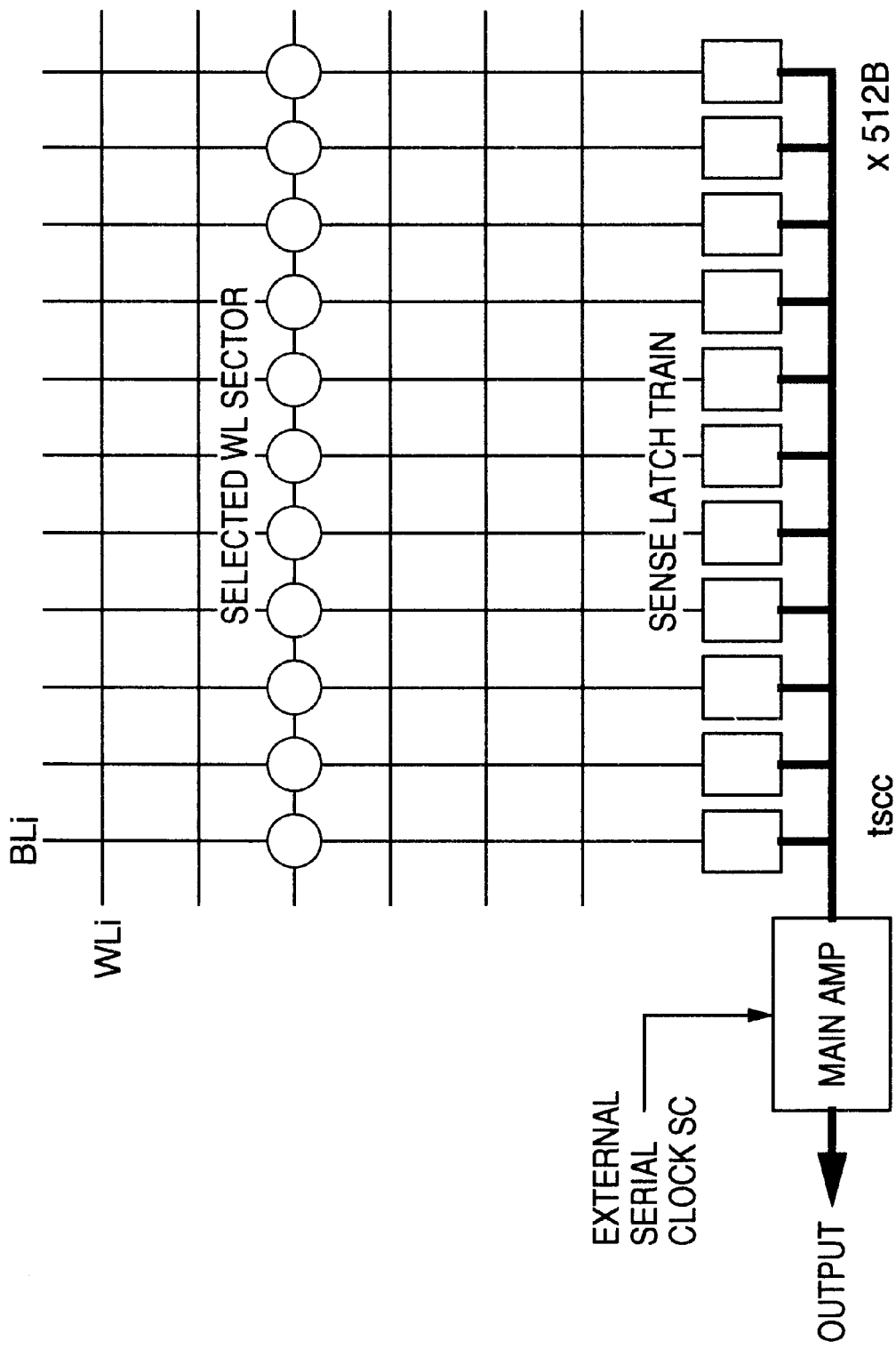

FIG.32

| | READ | ERASE | ERASE VERIFY | WRITE | WRITE VERIFY | LOW THRESHOLD VALUE VERIFICATION | SELECTIVELY RESTORE | HIGH THRESHOLD VALUE VERIFICATION | RESELECTIVE WRITE |
|---|---|---|---|---|---|---|---|---|---|
| SELECTED WORD LINE | Vcc | 16V | 4.2V | -10V | 1.5V | 0.5V | 16V | 1.5V | -10V |
| NON-SELECTED WORD LINE | Vss | Vss | Vss | Vcc | Vss | Vss | Vss | Vss | Vcc |
| SELECT GATE 1 | Vcc | Vcc | Vcc | 6V | Vcc | Vcc | 9V | Vcc | 6V |
| SELECT GATE 2 | Vcc | Vcc | Vcc | Vss | Vcc | Vcc | Vss | Vcc | Vss |
| SELECTED BIT LINE | 1V | open | 1V | 5V | 1V | 1V | 8V | 1V | 5V |
| NON-SELECTED BIT LINE | — | — | Vss | Vss | Vss | Vss | Vss | Vss | Vss |
| SOURCE LINE | Vss | Vss | Vss | Vss | Vss | Vss | Vss | Vss | Vss |

COMMON SL (M1)

Bn (M2 OR MORE)

COMMON SL (M2 OR MORE)

COMMON SL (M1)

Bn (M2 OR MORE)

SEMICONDUCTOR NON-VOLATILE MEMORY DEVICE AND COMPUTER SYSTEM USING THE SAME

TECHNICAL FIELD

The present invention relates to a semiconductor nonvolatile memory apparatus comprising transistors of which a threshold voltage can be electrically rewritten, or in particular to a semiconductor nonvolatile memory apparatus suitably used for electrically rewriting the threshold voltage frequently and a computer system using such an apparatus, or more in particular to a technical field in which a stable read operation of the semiconductor nonvolatile memory apparatus driven by a single source voltage is possible and the size of a semiconductor nonvolatile memory apparatus driven by a single source voltage can be reduced.

BACKGROUND ART

A semiconductor nonvolatile memory apparatus of a single-transistor-per-cell configuration which can collectively erase the stored information electrically is a flash memory. The flash memory has such a configuration that the area occupied for each bit is small and high integration is possible. For this reason, this memory has been closely watched recently and various research and development efforts are made actively on the structure and the method of driving it.

A first example that has thus far been suggested is a DINOR type described in "Symposium on VLSI Circuits Digest of Technical Papers", pp.97–98, 1993; a second example is a NOR type described in the same papers, pp.99–100, 1993; a third example is an AND type described in the same papers, pp.61–62, 1994; and a fourth example is a HICR type described in "International Electron Devices Meeting Tech. Dig.", pp.19–22.

With each of the above-mentioned types, at the time of the read operation, the word line potential is set to a source voltage Vcc and a low voltage of about 1 V is applied as a bit line potential to prevent weak electrons from being drawn, while information is read from memory cells by a sense amplifier circuit. Let the state in which electrons are stored in a floating gate be defined as an erase mode. In erase mode, the threshold voltage of the memory cell increases. Even if a word line is selected at the time of read operation, therefore, no drain current flows and the bit line potential is held at a precharge potential of 1 V. Let the state in which no electrons are injected (electrons are discharged) be defined as a write mode, on the other hand. In write mode, the threshold voltage value of the memory cell drops. When a word line is selected, therefore, a current begins to flow, and the bit line potential decreases below the precharge potential 1V. The bit line potential is amplified by a sense amplifier thereby to judge a "0" or a "1" state of the information.

A first example so far suggested is an AND type described in "International Electron Devices Meeting Tech. Dig." pp.991–993, 1992, and a second example is a HICR type described in the same papers, pp.19–22, 1993.

In each of these types, the operation of increasing the threshold voltage of a memory cell in the sector representing a unit of each word line is defined as an erase operation.

In the AND type described in "Symposium on VLSI Circuits Digest of Technical Papers", pp.61–62, 1994, a high positive voltage of 16 V is applied to a selected sector, i.e., a selected word line as an erase operation voltage, and the drain and source terminal voltages of the memory cell are set to the ground voltage Vss of 0 V. A voltage difference occurs between the channel and the floating gate of the memory cell in the selected sector, and the electrons in the channel are injected into the floating gate by the Fowler-Nordheim tunnel phenomenon. An erase operation thus is made possible for increasing the threshold voltage of the memory cell.

With the flash memories of the above-mentioned types, a read error is caused when the threshold voltage of the memory cell assumes a negative value. It is therefore necessary to control the threshold voltage of the memory cell not to assume a negative value. For this purpose, the write operation sequence shown in FIG. 29 is executed in the prior art. In the write operation for the AND type constituting the third prior art described above, for example, a unit write time is set for a memory cell group (sector) connected to a predetermined word line in a memory cell array and data are written collectively, after which the data are read from the memory cells. If there is any memory cell in which data are not sufficiently written, a rewrite operation (verify operation) is performed. The word line potential at the time of the verify operation for checking whether the threshold voltage of a memory cell has reached a write threshold voltage or not is set to 1.5 V, for example, as a value at which the threshold voltage of none of the memory cells of the memory cell group in the sector assumes a negative voltage, taking the expansion of the distribution of the write threshold voltage into consideration.

"Symposium on VLSI Technology Digest of Technical Papers" pp.83–84, 1993, discloses an erratic imperfection, a phenomenon in which the electrons in the floating gate are injected or discharged through a tunnel film making up an insulation film, and therefore the internal electric field of the tunnel film is strengthened with the trap level in the tunnel film charged to a positive voltage with the result that the electrons are locally apt to be discharged from the floating gate, or a phenomenon in which the trap level is charged or not charged to a positive voltage depending on the number of rewrite operations. The above-mentioned conventional techniques cannot detect an erratic imperfection that occurs during the write operation as shown in FIG. 26 and thus poses the problem that upon occurrence of an erratic imperfection, accurate information cannot be read out from the semiconductor nonvolatile memory apparatus.

The write operation according to each of the above-mentioned types is for decreasing the threshold voltage of a selected memory cell. The AND-type apparatus, as described in the related papers, comprises a sense latch circuit for performing the operation of latching the write data for each bit line of a memory cell and performs the write operations for each sector collectively. A negative voltage of −9 V is applied to the control gate, i.e., a word line of the memory cell, and the drain terminal voltage of the memory cell is set to 4 V for the selected cell and to 0 V for the non-selected cells according to the data of the sense latch circuit. A voltage difference occurs between the floating gate and the drain of the selected memory cell so that the electrons in the floating gate are drawn toward the drain by the Fowler-Nordheim tunnel phenomenon. In the non-selected memory cells, the voltage difference between the floating gate and the drain is so small that the electrons are prevented from being discharged from the floating gate.

In the write operation, on the other hand, the threshold voltage of the memory cells in the non-selected sectors slightly drops depending on the selected drain terminal voltage. In order to prevent this, a source voltage Vcc is applied to the non-selected word lines.

For the conventional semiconductor nonvolatile memory apparatus of AND type, the breakdown voltage of the MOS transistors making up the apparatus is required to be not less than 16 V providing a word line voltage not for the write operation but for the erase operation at which the potential difference is highest. In order to secure this breakdown voltage, the gate insulation film of each MOS transistor is increased to the thickness of not less than 25 nm, for example, to reduce the field strength applied to the gate oxide film while at the same time making a diffusion layer structure of a high breakdown voltage, and even when using a minimum rule of 0.4 μm, the gate length is required to be 1.5 μm or more, for example. As a result, the layout area of the MOS transistor is increased, thereby leading to the problem of an increased chip size of the semiconductor nonvolatile memory apparatus.

As such a flash memory, a flash memory of AND type is suggested in JP-A-7-176705, for example. FIG. 19 is a connection diagram of memory cells, and FIG. 20 is a schematic diagram showing a layout according to JP-A-7-176705 shown in FIG. 1. A plurality of memory cells are connected along the columns as a unit block. The drain of each memory cell is connected to a bit line through a MOS transistor, and the source of each memory cell is connected to a common source line through a MOS transistor. Also, the bit line is connected with a plurality of unit blocks. As shown in FIG. 20, a common source line is formed of a diffusion layer in the vertical direction between the bit lines as designated by L (SL), and further, is wired using a metal line M1 (SL) in the same layer as the bit lines in the direction parallel to a plurality of the bit lines.

With the conventional flash memory of AND type described above, the read operation and the verify operation for the threshold voltage of the memory cell after the rewrite operation are performed collectively for each sector of the memory cells connected to the word lines. In view of the fact that the common source line L (SL) is formed of a diffusion layer, a voltage effect occurs in the common source line L (SL) by the memory cell current flowing in the common source line L (SL) as shown in the equivalent circuit of a memory cell array of FIG. 53. Consequently, a substrate bias is effectively applied to the memory cells to change the threshold voltage thereof. The amount of change of the threshold voltage varies depending on the information pattern stored in each memory cell and the position of the memory cell. The subsource lines are formed also of a diffusion layer. Since a current of an amount corresponding to not more than a single memory cell flows, however, the variations in the threshold voltage of the memory cells of a sector are not caused.

FIG. 56 shows the threshold voltage dependency on the position of a memory cell on a bit line. The substrate bias has the greatest effect on a memory cell farther from the source line so that the threshold voltage of the memory cell is increased by the substrate bias. The substrate bias becomes maximum in the case where all the bits of the memory cell are write bits, i.e., in the case where the threshold voltage is so low that a cell current flows. The threshold voltage takes the lowest value, on the other hand, in the case where only one bit of the cell adjacent to the source line is a write cell. This threshold voltage difference ΔVth causes variations of the threshold voltage among the memory cells in the sector.

For reading the memory information, it is necessary to reduce the threshold voltage difference Δ Vth and to stabilize the read operation. For this purpose, the common source line M1 (SL) shown in FIG. 20 is required for each 32 bit lines. This, however, poses the problem that the area of the memory array section increases by 3% or more.

In view of this, an object of the present invention is to provide an electrically-rewritable semiconductor nonvolatile memory apparatus and a computer system using such a memory apparatus, in which an operation sequence is newly set, the erratic phenomenon is suppressed in the apparatus and the rewrite resistance can be improved.

Another object of the invention is to provide an electrically-rewritable semiconductor nonvolatile memory apparatus and a computer system using such a memory apparatus, in which the maximum voltage for the erase operation of the electrically-rewritable nonvolatile memory apparatus is reduced to almost the same level as the maximum operating voltage for write operation thereby to reduce the chip size.

Still another object of the invention is to provide an electrically-rewritable semiconductor nonvolatile memory apparatus, in which the operation of reading information is stabilized for each sector, i.e., the variations in threshold voltage are reduced and further the apparatus area is also reduced.

DISCLOSURE OF THE INVENTION

Among the disclosures of the invention in this paten application, representative ones will be briefly described below.

Specifically, a semiconductor nonvolatile memory apparatus for solving the first problem according to the present invention is applied as a representative semiconductor nonvolatile memory apparatus as shown in FIG. 2, comprising transistors of which the threshold voltage can be electrically rewritten (erased and written), in which the write operation (the operation for reducing the threshold voltage) sequence includes an operation sequence for reducing the threshold voltage for memory cells collectively or selectively, verifying the threshold voltages for each memory cell group newly connected to the word lines and then increasing the threshold voltages of all the memory cells collectively in accordance with the threshold voltage for each memory cell.

As shown in the functional block diagram of FIG. 12, there is provided a semiconductor nonvolatile memory apparatus comprising what is called a sense latch circuit including a flip-flop for performing the sense operation and the operation of latching the write data and and the data for increasing the threshold voltage and a circuit for setting recursive data in the flip-flop automatically for each bit in accordance with the threshold voltage of the memory cell after verification, wherein a built-in source voltage circuit generates a voltage for restoring the threshold voltage for a memory cell and a word line voltage for verify operation.

Also, a computer system according to the present invention comprises at least a central processing unit and peripheral circuits thereof in addition to the above-mentioned semiconductor nonvolatile memory apparatus.

In the above-mentioned semiconductor nonvolatile memory apparatus and the computer system using such a nonvolatile memory apparatus, an operation means for automatically verifying the threshold voltages collectively for each memory cell group connected to the word lines and, after that, performing the operation of increasing the threshold voltages collectively in accordance with the threshold voltage for each memory within the apparatus is included the write operation (the operation for reducing the threshold voltage) sequence. In this way, the threshold voltages of the memory cells that have dropped due to the erratic phenomenon can be restored and the threshold voltage distribution can thus be reduced. Further, the threshold voltage affected by the bits depleted by the erratic phenomenon can be restored selectively and thus an erroneous read operation can be prevented by reading the verify word line voltage at the ground potential (Vss).

For example, the threshold voltage of a memory cell is set to 1.5 V after write operation, the discharge of electrons from the floating gate and the verify operation are repeated, and the threshold voltage of all the memory cells to be written is reduced to not more than 1.5 V. After that, the potential of the selected word line is verified (read) at the ground potential (Vss), and the memory cells of which the threshold voltage has been reduced to less than 0 V (depletion) by the erratic phenomenon are selected. The data read from each of them are used as those for the flip-flop of the sense latch circuit, the bit line voltage, i.e., the drain voltage is selectively reduced to the ground potential (Vss), and the potential of the selected word line for which the write operation has been performed is increased to as high as about 16 V. Then, electrons are injected into the floating gate taking advantage of the Fowler-Nordheim tunnel phenomenon over the entire surface of the channel, thereby restoring the threshold voltage of the memory cells selectively. In view of the fact that the data of the flip-flops of the sense latch circuits connected to the memory cells not depleted assume a source voltage, no sufficient difference in field strength occurs between the channel potential (source voltage) and the word line during the operation of increasing the threshold voltage. The threshold voltage of the memory cells thus can be held at 1.5 V after write operation.

Also, according to the present invention, the number of rewrite operations can be remarkably improved without imposing any limitation on the number of rewrite operations taking the erratic phenomenon into consideration.

Further, low voltages can be supplied from a single voltage source by utilizing the Fowler-Nordheim tunnel phenomenon in the operation of restoring the threshold voltage of the memory cells.

As a result, in a semiconductor nonvolatile memory apparatus capable of electric rewrite operation, the write operation sequence including the verify operation in combination with the operation for restoring the threshold value can suppress the erratic phenomenon and thus can improve the breakdown voltage for rewrite operation. Especially, in a computer system or the like using such a memory apparatus, the lower voltage can reduce the power consumption and can improve the reliability.

Also, in the erase operation of a semiconductor nonvolatile memory apparatus for solving the second problem, as compared with the prior art in which a positive high voltage is applied only to a selected word line, the voltage for erase operation is distributed between a positive voltage applied to the word line and a negative voltage applied to the memory well according to the present invention. By the way, the absolute value of the memory well voltage is set to be about equal to or higher than the word line voltage for read operation.

FIG. 33 is a schematic diagram showing a memory mat according to the present invention. The sectors making up the memory mat of a semiconductor nonvolatile memory apparatus include a sector (selected sector) for which the erase operation is selected and a positive voltage is applied to the word line, a sector (non-selected sector) for which the erase operation is not selected and the word line voltage is different from the memory well voltage, and a sector (completely non-selected sector) for which the erase operation is not selected and the word line voltage is equal to the source-drain voltage (channel voltage) of the memory cells.

The completely non-selected sector includes a memory cell in which a negative voltage is applied to the memory well and the channel voltage and the word line voltage assume the ground voltage in erase operation or a memory cell in which the memory well voltage, the channel voltage and the word line voltage all assume the ground voltage. In this case, the memory cells are connected in such a manner that each unit block includes a plurality of parallel-connected memory cells each with the drain thereof connected to the bit line through a MOS transistor and with the source thereof connected to the source line through a MOS transistor. Therefore, the selected sector and the non-selected sector exist in the same unit block, and the sectors making up the other blocks are completely non-selected sectors.

FIG. 35 is a model sectional view of a memory cell of a semiconductor nonvolatile memory apparatus. In order to apply a negative voltage to the memory cell, the DP well of the memory cell, the well of the above-mentioned MOS transistors and the well of a MOS transistor for transferring the potential of the source line and the bit line of the memory cell are formed within the blocking-isolation niso region in order to isolate them from the substrate p-sub of the memory apparatus.

A semiconductor nonvolatile memory apparatus according to the present invention, as shown in the functional block diagram of FIG. 37 thereof, comprises a circuit MWVC for segmenting the memory mat and switching the well voltage of the memory mat without disturbing the sector units, a row decoder circuit XDCR for selecting a word line, i.e., a sector, a sense latch circuit SL for performing the sense operation and the operation of latching the written data, and further a built-in power circuit VS for generating a word line voltage Vh constituting an erase operation voltage, a memory well voltage Vmw, a word line voltage V1 constituting a write operation voltage, a bit line voltage V1b, etc.

Also, the rise waveform of the erase voltage for the erase operation rises within several microseconds to several tens of microseconds with a load capacitance and thus prevents a sudden field strength from being applied to the memory cell. The semiconductor nonvolatile memory apparatus further comprises a mode control circuit MC for setting a timing in such a manner that the time when the memory well voltage rises to a predetermined voltage level is equal to the time when the word line voltage reaches a predetermined voltage level.

A computer system according to the present invention comprises, in addition to the above-mentioned semiconductor nonvolatile memory apparatus, at least a central processing unit and peripheral circuits thereof.

According to this invention, 12 V is applied to a selected word line through the row decoder circuit XDCR and −4 V is applied to the memory well through the memory mat well switching circuit MWVC, thereby achieving the voltage 16V applied to the memory cell considered necessary for the erase operation. As a result, the maximum voltage impressed on the MOS transistor of the row decoder circuit XDCR assumes 12 V. The breakdown voltage can thus be reduced from 16 V to 12 V.

In the write operation, on the other hand, −9 V is applied to the word line of the selected memory cell through the row decoder circuit XDCR and 4 V is applied to the selected bit line according to the data of the sense latch circuit SL thereby to set the non-selected word line to the source voltage Vcc. For this reason, the MOS transistor of the row decoder circuit XDCR is required to select −9 V and the source voltage Vcc, and the breakdown voltage of the MOS transistor is required to be 12.3 V with respect to the source voltage Vcc of 3.3 V.

In a MOS transistor making up the apparatus according to the present invention, therefore, a maximum breakdown voltage of 12.3 V is secured by the erase operation and the write operation described above, and thus the gate length that can be used is about 1 μm.

Also, the memory well voltage of only the non-selected sectors contained in the same block as the selector block is disturbed in a system, in which each unit block includes a plurality of parallel memory cells with a common drain thereof connected to the bit line through a MOS transistor and the source of the particular unit block connected to the source line through a MOS transistor. As a result, the disturb life time can be reduced from 8 k bits (1 k=1024 bits) which is the number of sectors intersecting the bit line to 64 bits which is the number of sectors constituting a unit block, i.e., to $\frac{1}{128}$, thus making it possible to improve the reliability.

FIG. 49 shows a metal wiring layer layout with a plurality of unit blocks arranged along the bit lines for solving the third problem, and FIG. 2 is a model diagram showing a metal wiring layer layout of a memory mat.

The memory mat in a memory cell array for a semiconductor nonvolatile memory apparatus according to the present invention is so configured in layout that a common source line (M1) is arranged in parallel to the word lines but not between the bit lines. The metal wiring layer of the common source line (M1) is formed in the fabrication step before the metal wiring layer used for the bit lines. A common source line (M2 or more) arranged along the columns (parallel to the bit lines) in the same metal wiring layer as the bit lines is configured in a layout at the end of the memory mat including a dummy memory cell column. Also, the width of the common source line is larger than the width of the bit line by a factor of about 100.

In a method of connecting the memory cells according to this invention, unit blocks each including a plurality of memory cells connected to the bit lines through a MOS transistor have the respective sources thereof connected to the common source line (M1).

In a semiconductor nonvolatile memory apparatus according to the present invention with memory mats segmented without affecting the sector units, as shown in the functional block diagram of FIG. 57, comprises a row decoder circuit XDCR for selecting a word line, i.e., a sector, a sense latch circuit SNS for performing the sense operation and the operation of latching the data written, and further a built-in power circuit VS for generating a rewrite operation voltage.

The common source line of the memory cell array mat is connected for each memory cell column of the unit blocks, and no dummy memory cell column is arranged between the bit lines, thereby reducing the size of the memory mat.

Also, in view of the fact that the width of the common source wiring is larger than that of the bit line by a factor of about 100, the substrate bias imposed on the memory cells connected the same word line, i.e., the same sector is constant, and therefore the variations in the threshold voltage decrease. Consequently, the operation of reading information is stabilized for each sector.

BRIEF DESCRIPTION OF THE DRAWINGS

FIG. 5 is a sectional view showing a transistor of a semiconductor nonvolatile memory cell.

FIGS. 6A and 6B are sectional views showing an example of voltage application in the operation for selectively decreasing the threshold voltage of the transistor of a semiconductor nonvolatile memory cell.

FIGS. 7A and 7B are sectional views showing an example of voltage application in the operation for selectively increasing the threshold voltage of the transistor of a semiconductor nonvolatile memory cell.

FIGS. 14A and 14B are output state diagrams for memory cells.

FIG. 32 is a diagram showing voltages applied to the memory cell terminals according to the present invention.

BEST MODE FOR CARRYING OUT THE INVENTION

Embodiments of the present invention will be described in detail below with reference to the drawings below.

Figure 12:
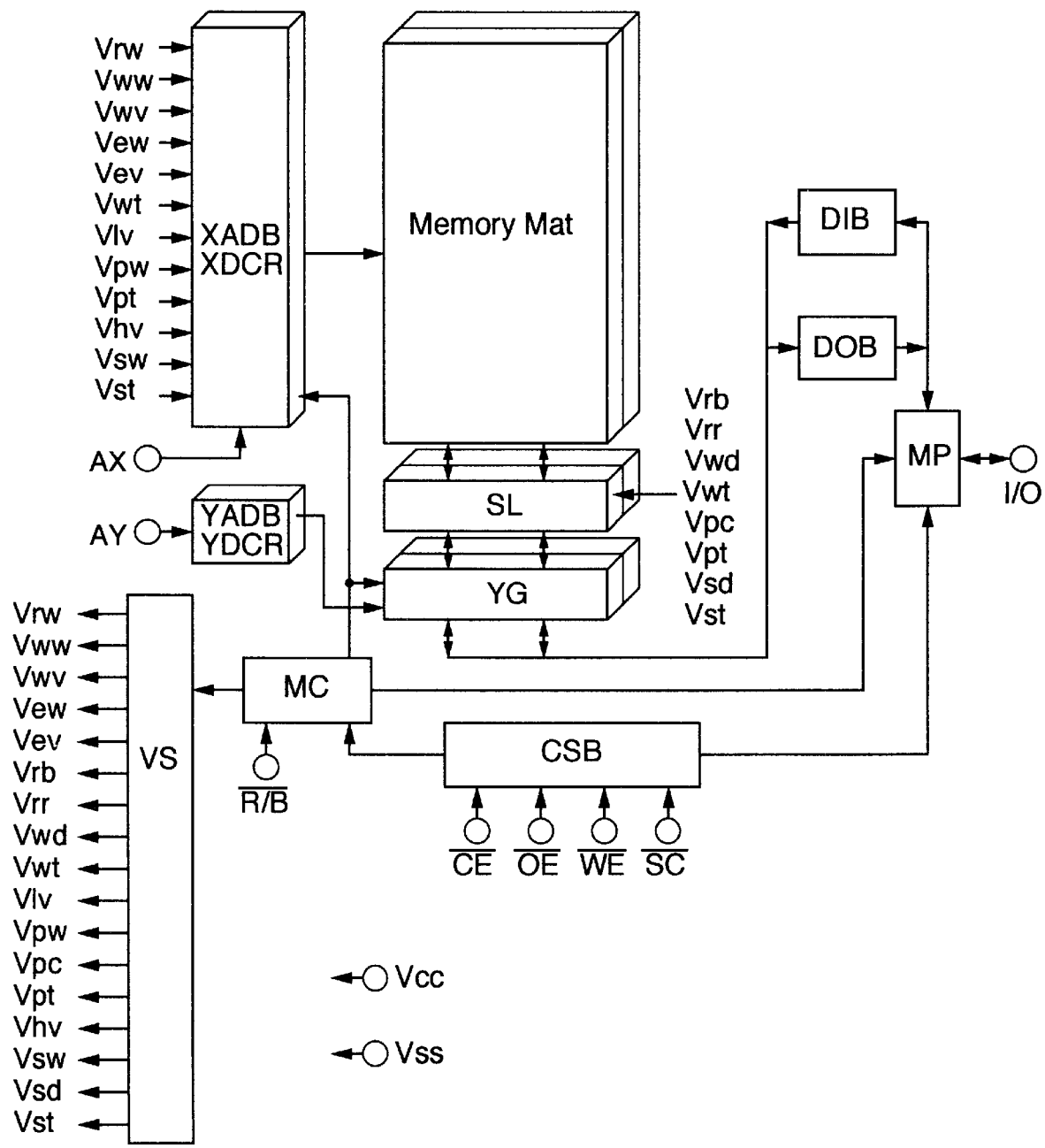
FIG. 12 is a functional block diagram showing a semiconductor nonvolatile memory apparatus according to the present invention.

A basic configuration of a semiconductor nonvolatile memory apparatus according to the present embodiment will be explained with reference to FIG. 12.

The semiconductor nonvolatile memory apparatus according to the present embodiment is assumed to be an EEPROM including, for example, a plurality of memory mats each having a plurality of transistors of which the threshold voltage can be rewritten electrically, and comprises memory mats, a row address buffer XADB, a row address decoder XDCR, sense latch circuits SL used as both a sense amplifier and a data latch, column gate array circuits YG, a column address buffer YADB, a column address decoder YDCR, an input buffer circuit DIB, an output buffer circuit DOB, a multiplexer circuit MP, a mode control circuit MC, a control signal buffer circuit CSB and a built-in power circuit VS.

In this semiconductor nonvolatile memory apparatus, the control signal buffer circuit CSB, though not specifically limited, is supplied with a chip enable signal, an output enable signal, a write enable signal, a serial clock signal, etc. applied to external terminals /CE, /OE, /WE, SC, for example, and in accordance with these signals, generates timing signals as an internal control signal. Also, a ready/busy signal is applied from an external terminal R/ (/B) to the mode control circuit MC. The symbol "/" in /CE, /OE, /WE, etc. in this embodiment indicates a complementary signal.

Further, the built-in power circuit VS, though not specifically limited, is supplied with a source voltage Vcc from an external source, for example, and adapted to generate such signals as a read word line voltage Vrw, a write word line voltage Vww, a write verify word line voltage Vwv, an erase word line voltage Vew, an erase verify word line voltage Vev, a read bit line voltage Vrb, a read reference bit line voltage Vrr, a write drain terminal voltage Vwd, a write transfer gate voltage Vwt, a low threshold value verify word line voltage Vlv, a selective restore word line voltage Vpw, a selective restore non-selected channel-drain voltage Vpc, a selective restore transfer gate voltage Vpt, a high threshold value verify word line voltage Vhv, a reselected write word line voltage Vsw, a reselected write drain terminal voltage Vsd and a reselected write transfer gate voltage Vst. Each of these voltages can alternatively be supplied from an external source.

Of all the voltages thus generated, the read word line voltage Vrw, the write word line voltage Vww, the write verify word line voltage Vwv, the erase word line voltage Vew, the erase verify word line voltage Vev, the write transfer gate voltage Vwt, the low threshold value verify word line voltage Vlv, the selective restore word line voltage Vpw, the selective restore transfer gate voltage Vpt, the high threshold value verify word line voltage Vhv, the reselected write word line voltage Vsw and the reselected write transfer gate voltage Vst are applied to the row address decoder XDCR, whereas the read bit line voltage Vrb, the read reference bit line voltage Vrr, the write drain terminal voltage Vwd, the selective restore non-selected channel-drain voltage Vpc, the reselected write drain terminal voltage Vsd, the write transfer gate voltage Vwt, the selective restore transfer gate voltage Vpt and the reselected write transfer gate voltage Vst are applied to the sense latch circuit SL.

The built-in source voltage can be shared with a source voltage. For example, a source voltage can be shared by the erase word line voltage Vew and the selective restore word line voltage Vpw, by the write word line voltage Vww and the reselected write word line voltage Vsw, by the write drain terminal voltage Vwd and the reselected write drain terminal voltage Vsd, and by the write transfer gate voltage Vwt and the reselected write transfer gate voltage Vst.

In this semiconductor nonvolatile memory apparatus, the complementary address signals formed through the row and column address buffers XADB, YADB for receiving row and column address signals AX and AY supplied from an external terminal are supplied to the row and column address decoders XDCR and YDCR, respectively. Also, though not specifically limited, the row and column address buffers XADB, YADB are activated by the chip enable select signal /CE in the apparatus, fetch the address signals AX, AY from an external terminal, and form complementary address signals including an internal address signal in phase with the address signal supplied from an external terminal and an address signal in opposite phase.

The row address decoder XDCR forms a select signal for the word lines W of a memory cell group corresponding to the complementary address signal of the row address buffer XADB. The column address decoder YDCR, on the other hand, forms a select signal for the bit lines B of a memory cell group corresponding to the complementary address signal of the column address buffer YADB. As a result, an arbitrary word line W and an arbitrary bit line B are designated and the desired memory cell is selected in each memory mat.

Though not specifically limited, 8 or 16 memory cells, for example, are selected by the row address decoder XDCR and the column address decoder YDCR in order to perform the write or read operation in 8 or 16 bits as a unit. Assuming that each data block contains m memory cells along the word lines (along the rows) and n memory cells along the bit lines (along the columns), 8 or 16 data blocks each having m×n memory cells are configured.

Now, with reference to FIGS. 13 to 16, explanation will be made about the case of using a serial memory cell access scheme and the case of using a random memory cell access scheme for selecting an arbitrary memory cell of the memory matrix and reading data from the memory cell thus selected. According to this embodiment, an especially significant effect can be expected by employing the serial access scheme using a sense latch circuit for latching the data temporarily at the time of data output.

Figure 13:
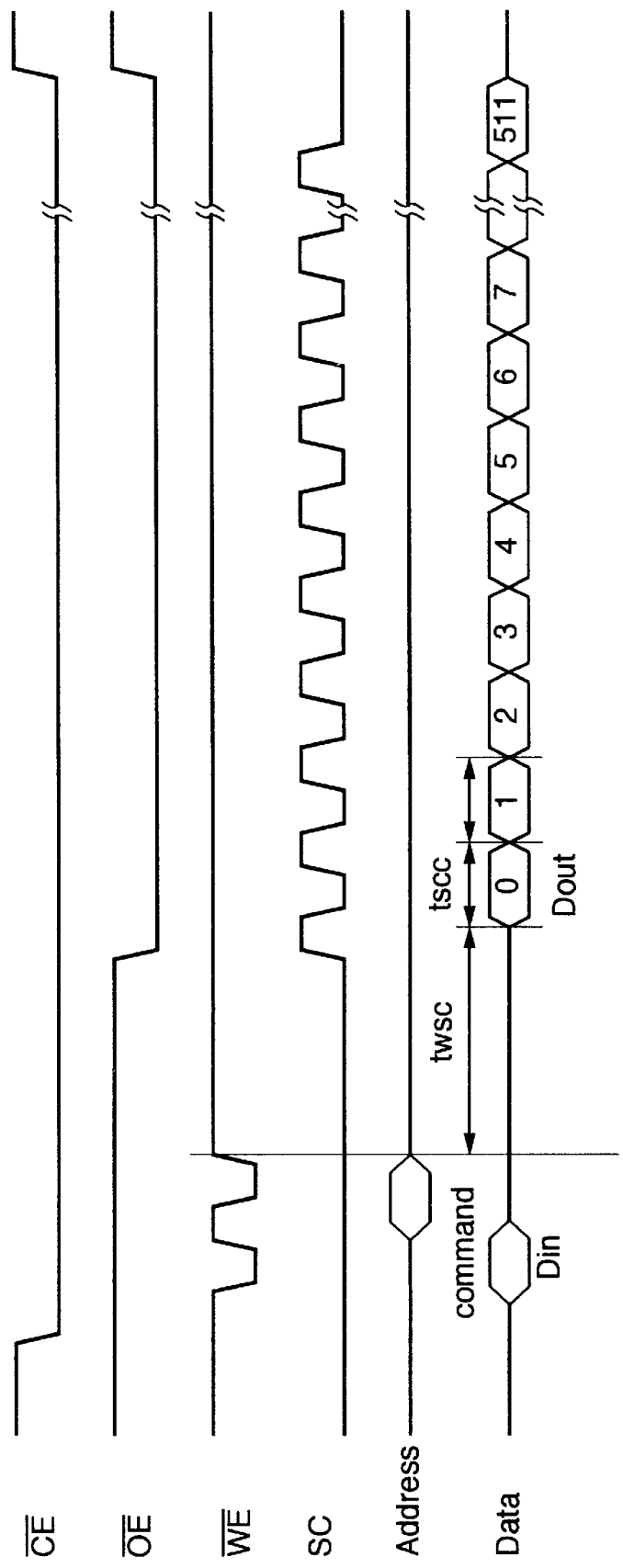
FIG. 13 is a timing chart for a serial access scheme.

In the serial access scheme, for example, a timing chart as shown in FIG. 13 is involved, and data are output in the manner shown in FIGS. 14A, 14B representing a part of the memory matrix. Specifically, upon activation of the chip enable signal /CE, the output enable signal /OE and the write enable signal /WE and upon application of an address signal "Address" following the application of a data input command Din, then the address signal is sequentially incremented or decremented in synchronism with a serial clock signal SC, so that 512-bit data "Data" of 0 to 511 bits, for example, are sequentially output.

In this case, in the memory matrix, as shown in FIG. 14A, upon designation of a word line WLi and upon further designation of each data line DLj sequentially, the memory cells connected to the word lines WLi and the bit lines BLj are sequentially selected, and data are fetched into the sense latch circuit. The data fetched into the sense latch circuit are sequentially output through a main amplifier as shown in FIG. 14B. The time twsc required from the application of the address signal "Address" to the output of the first data, for example, is 1 μs, and the time tscc required for a single data to be output can be 50 ns. A high-speed data read operation thus is made possible.

Figure 15:
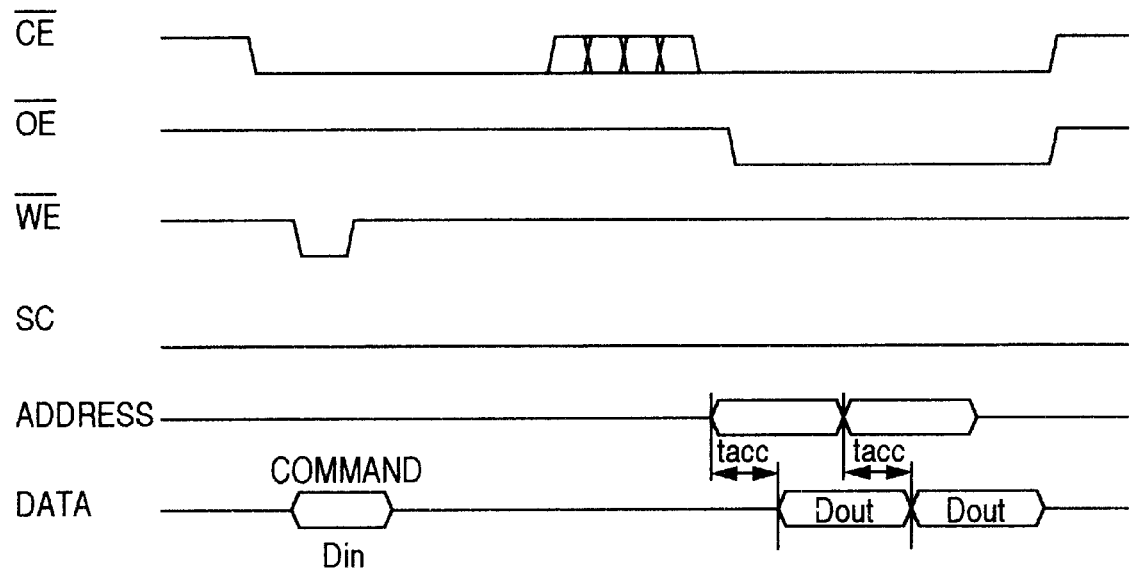
FIG. 15 is a timing chart for a random access scheme.
Figure 16:
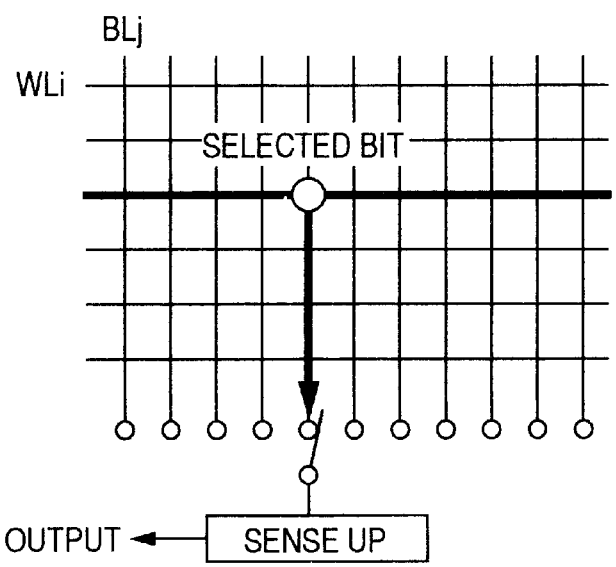
FIG. 16 is an output state diagram of memory cells.

With the random access scheme, in contrast, a timing chart as shown in FIG. 15 is involved. Data are output as shown in FIG. 16 representing a part of the memory matrix. Specifically, upon application of the first address signal "Address", one word line WLi and one bit line BLj are designated in the memory matrix, so that a memory cell connected to the word line WLi and the bit line BLj is selected. The data contained in the memory cell thus selected is output through a sense amplifier. In similar fashion, in response to the next address signal "Address", the data associated with the memory cell selected by the word line WLi and the bit line BLj can be output after the lapse of the time tacc following the application of the same address signal "Address".

The above-mentioned memory cells, though not specifically limited, have a structure analogous to the memory cells of the EPROM, for example, and are well-known memory cells having a control gate and a floating gate, or well-known memory cells having a control gate, a floating gate and a select gate. In the case under consideration, the structure of a memory cell having a control gate and a floating gate will be described below with reference to FIG. 5.

The nonvolatile memory cell shown in FIG. 5 has the same structure as the transistor of the memory cell of the flash memory announced in "International Electron Devices Meeting Tech. Dig." pp.560–563, issued in 1987, for example. This memory cell, though not specifically limited, is formed on a semiconductor substrate made of single crystal P-type silicon, for example.

Specifically, this nonvolatile memory cell, as shown in FIG. 5, constitutes a single EEPROM cell of flash erase type with a single transistor element including a control gate electrode 1, a drain electrode 2, a source electrode 3, a floating gate 4, a layer insulation film 5, a tunnel insulation film 6, a P-type substrate 7, N-type diffusion layers 8, 9 of high impurities concentration in the drain-source regions, a N-type diffusion layer 10 of low impurities concentration on drain side and a P-type diffusion layer 11 of low impurities concentration on source side.

Various example connections of a memory cell group having a plurality of these memory cells have been proposed. Though not specifically limited, they include the NOR type, the DINOR type, the AND type and the HICR type, for example, as shown in FIGS. 17 to 20, which will be explained one by one below.

Figure 17:
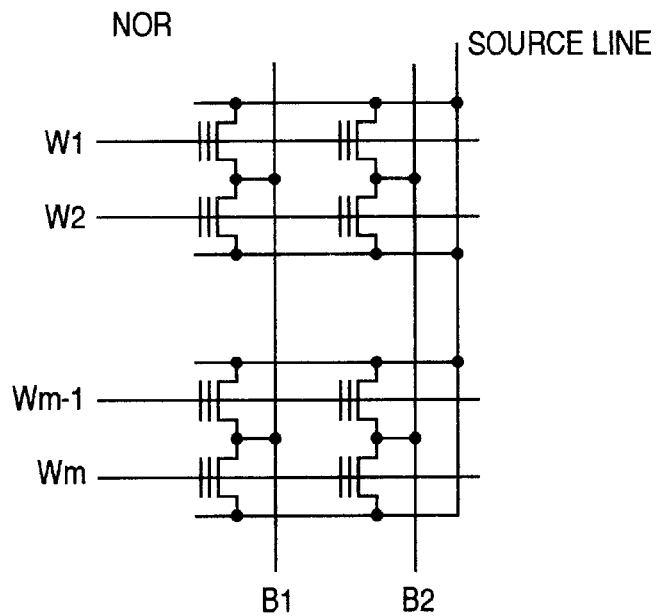
FIG. 17 is a circuit diagram showing an example connection (NOR) of memory cells making up a memory mat.

FIG. 17 shows an example of memory cells connected as NOR type, in which the MOS transistors of the memory cells are connected to word lines W1, . . . , Wm, bit lines B1, . . . , Bn and further a source line, through which the rewrite (write and erase) operation or the read operation is performed. In other words, the word lines W1, . . . , Wm are connected to the gate of each of the MOS transistors, the bit lines B1, . . . , Bn are connected to the drain of each of the MOS transistors, and the source line is connected to the source of each of the MOS transistors.

Figure 18:
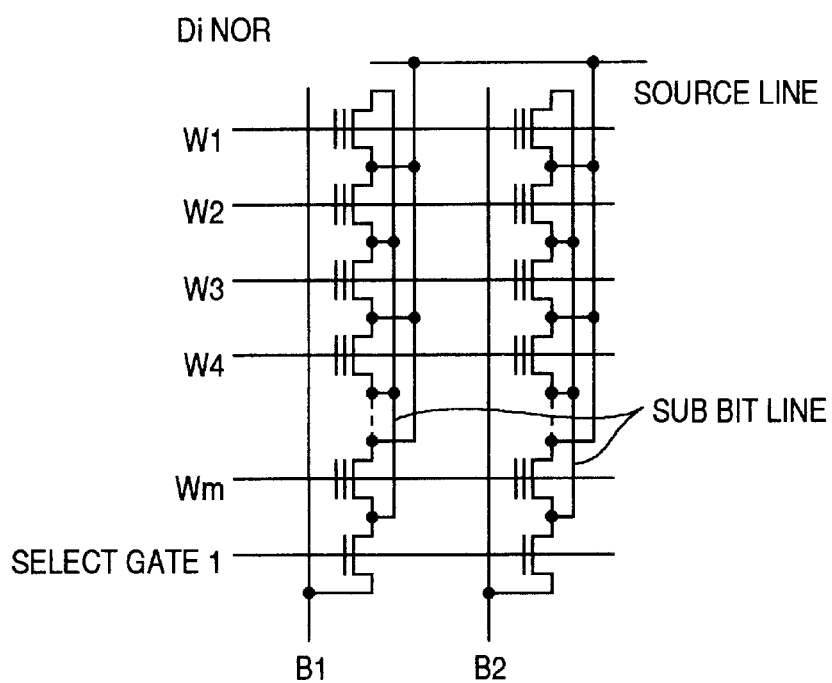
FIG. 18 is a circuit diagram showing an example connection (DINOR) of memory cells making up a memory mat.

FIG. 18 shows an example of connecting memory cells according to DINOR type, in which a select gate and sub-bit lines are added, and the source of each of the MOS transistors of the select gate is connected to the bit lines B1, . . . , Bn. Also, the drain of each of the MOS transistors is connected to the drain of each of the MOS transistors of the respective memory cells through the sub-bit lines.

Figure 19:
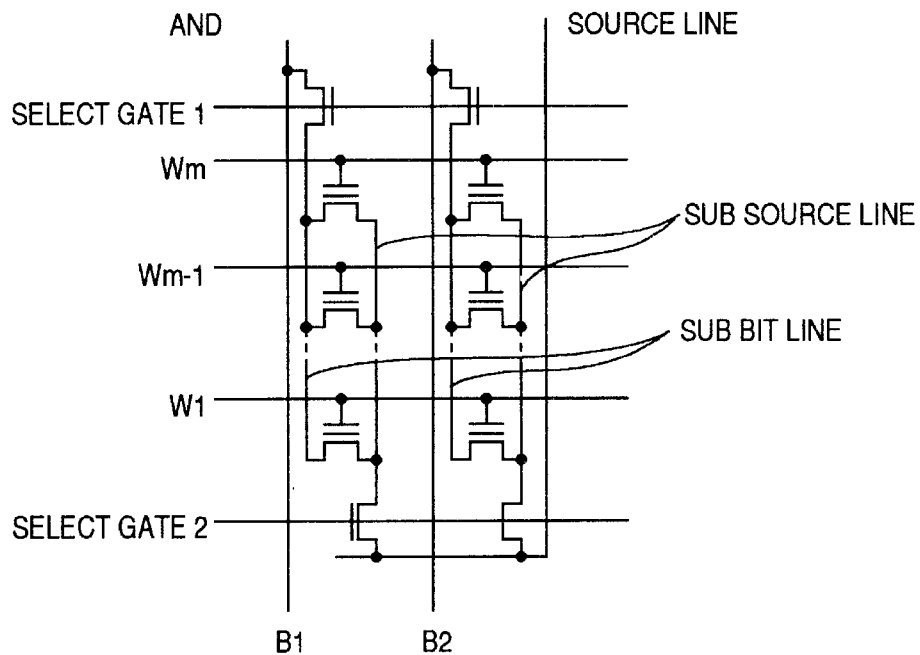
FIG. 19 is a circuit diagram showing an example connection (AND) of memory cells making up a memory mat.

FIG. 19 shows an example of connection according to AND type. This example includes a select gate 1, a select gate 2 and further sub-source lines. The source of each of the MOS transistors on the select gate 1 is connected to the bit lines B1, . . . , Bn. Further, the drain of this MOS transistor is connected through sub-bit lines to the drain of each of the MOS transistors of the memory cells. Also, the source of the MOS transistors of the select gate 2 is connected to the source line, and further the drain of these MOS transistor is connected through sub-source lines to the source of the MOS transistor of each memory cell.

Figure 20:
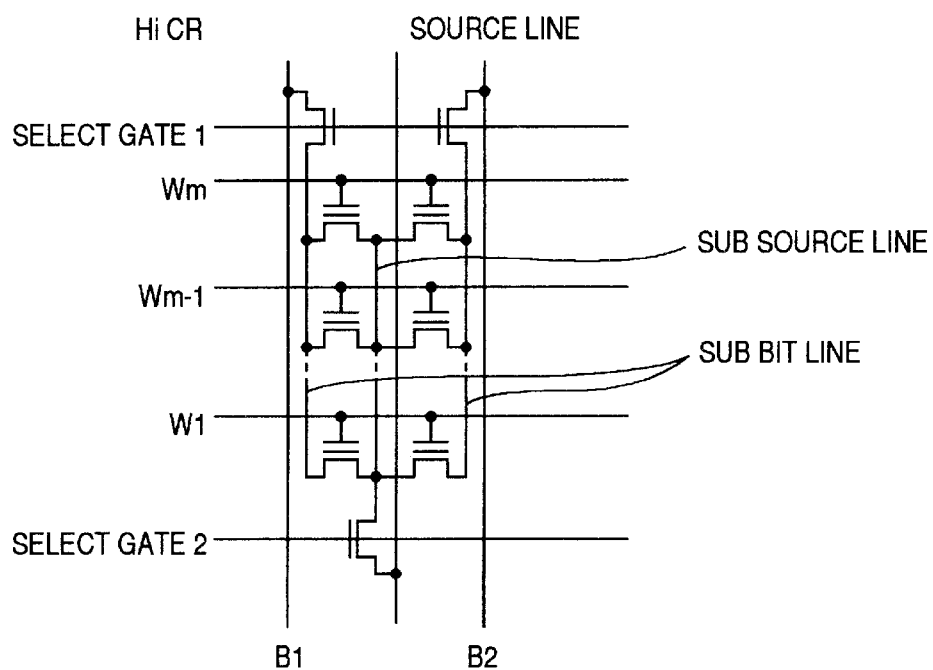
FIG. 20 is a circuit diagram showing an example connection (HICR) of memory cells making up a memory mat.

FIG. 20 shows an example of connection according to HICR type. The source of the MOS transistors of the select gate 1 is connected to the bit lines B1, . . . , Bn. Further, the drain of these MOS transistors is connected through the sub-bit lines to the drain of the MOS transistors of each memory cell. Also, the source of each of the MOS transistors of the select gate 2 is connected to the source lines, and further the drain of these MOS transistors is connected through the sub-source lines to the source of the MOS transistor of each memory cell.

A method of operation for selectively increasing or decreasing the threshold voltage of the memory cells, i.e., the rewrite operation, will be explained with reference to model sectional views of the memory cell and voltages applied to the terminals thereof shown in FIGS. 6A, 6B, and FIGS. 7A, 7B.

FIGS. 6A, 6B show the operation for selectively decreasing the threshold voltage of the memory cell. FIGS. 6A, 6B each show one of the memory cells with the control gates connected to a common word line. The voltages applied to the terminals in FIG. 6A represent the ones for decreasing the threshold voltage of the memory cell, while the voltages applied to the terminals in FIG. 6B show the ones in the case of holding the threshold voltage of the memory cell. Assume, for example, that the word line to which the control gates of FIGS. 6A, 6B are both connected is impressed with a negative voltage of, say, about −10 V and that the drain terminal of the memory cell in FIG. 6A is selectively impressed with a voltage of, say, 5 V. A voltage difference occurs between the floating gate and the drain, so that the electrons in the floating gate are drawn to the drain side by the Fowler-Nordheim tunnel phenomenon. Upon application of 0 V to the drain terminal of the memory cell in FIG. 6B, on the other hand, the voltage difference between the floating gate and the drain is reduced thereby to prevent the electrons from being discharged from within the floating gate.

Incidentally, in the operation for decreasing the threshold voltage of the memory cell, each non-selected word line is impressed with a positive voltage in order to prevent the disturbance (discharge of electrons) due to the drain voltage. As a result, in the rewrite operation, a steady current flow is prevented by opening the source electrode.

FIGS. 7A, 7B show the operation for selectively increasing the threshold voltage of the memory cell. The memory cells shown in FIGS. 7A, 7B have the respective control gates thereof connected to a common word line. The voltages applied to the terminals in FIG. 7A are for increasing the threshold voltage of the memory cell, while the voltages applied to the terminals in FIG. 7B are for holding the threshold voltage of the memory cell. Assume, for example, that the common word line to which both the control gates of FIGS. 7A, 7B are connected is impressed with a high voltage of, say, about 16 V and that the drain terminal of the memory cell in FIG. 7A is impressed selectively with a voltage of, say, 0 V. A voltage difference occurs between the floating gate and the channel, so that the electrons in the channel are injected into the floating gate by the Fowler-Nordheim tunnel phenomenon. Upon application of, say, about 8 V to the drain terminal of the memory cell in FIG. 7B, the voltage difference between the floating gate and the channel is reduced thereby to prevent the electrons from being injected into the floating gate.

It is also possible to reduce the voltage at the control gate, i.e., the voltage of the word line by reducing the drain voltage, i.e., the channel voltage to a negative value in the operation of increasing the threshold voltage of the memory cell.

As apparent from FIGS. 6A, 6B, 7A, 7B, the threshold voltage of a memory cell can be selectively rewritten by selectively controlling the voltage value applied to the drain terminal of the memory cell. The voltage value applied to the drain terminal of a memory cell can be selectively controlled, as described later, by connecting a sense latch circuit having a flip-flop to each bit line connected with the drain terminal of the memory cell and by allowing the sense latch circuit to hold the voltage information of the drain terminal.

Figure 21:
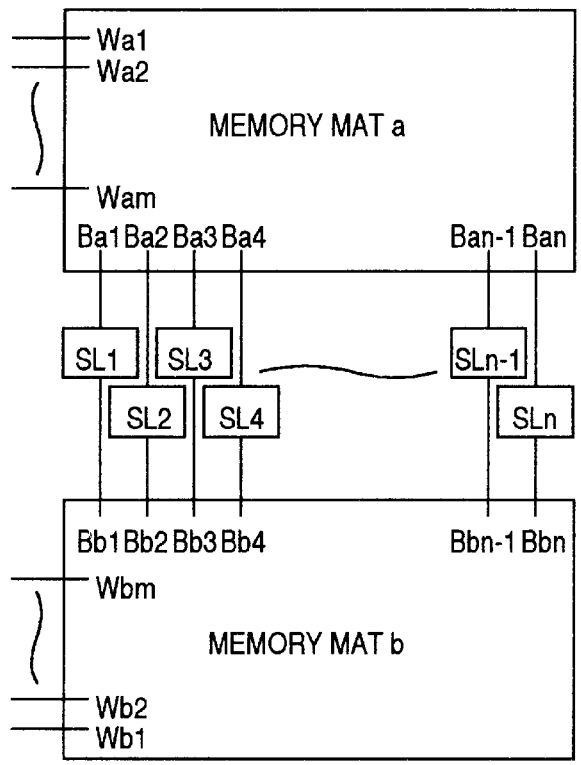
FIG. 21 is a block diagram showing a sense latch circuit of open bit line type with respect to memory mats according to the invention.
Figure 22:
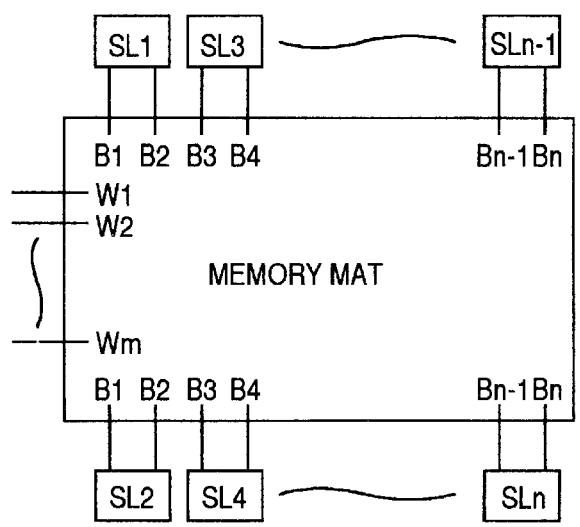
FIG. 22 is a block diagram showing a sense latch circuit of wraparound bit line type with respect to memory mats according to the invention.

The connection between the memory mats and the sense latch circuits SL according to this embodiment will be briefly explained with reference to FIGS. 21 and 22. The feature of this embodiment is that one sense latch circuit SL is provided for each of the bit lines B1 to Bn. As shown in FIG. 21, for example, sense latch circuits SL1 to SLn are arranged in an open-bit-line fashion to bit lines Ba1 to Ban on the one hand and to bit lines Bb1 to Bbn on the other hand, of the memory mats a and b. Thus, as shown in FIG. 22, each two of the bit lines B1 to Bn are provided with two sense latch circuits SL in a wraparound bit line arrangement.

Next, a detailed circuit diagram of the sense latch circuit SL will be described. A circuit diagram of a sense latch circuits SL is shown in FIG. 23 in the case where the memory mats and the sense latch circuits SL are connected in the open bit line arrangement of FIG. 21.

Figure 23:
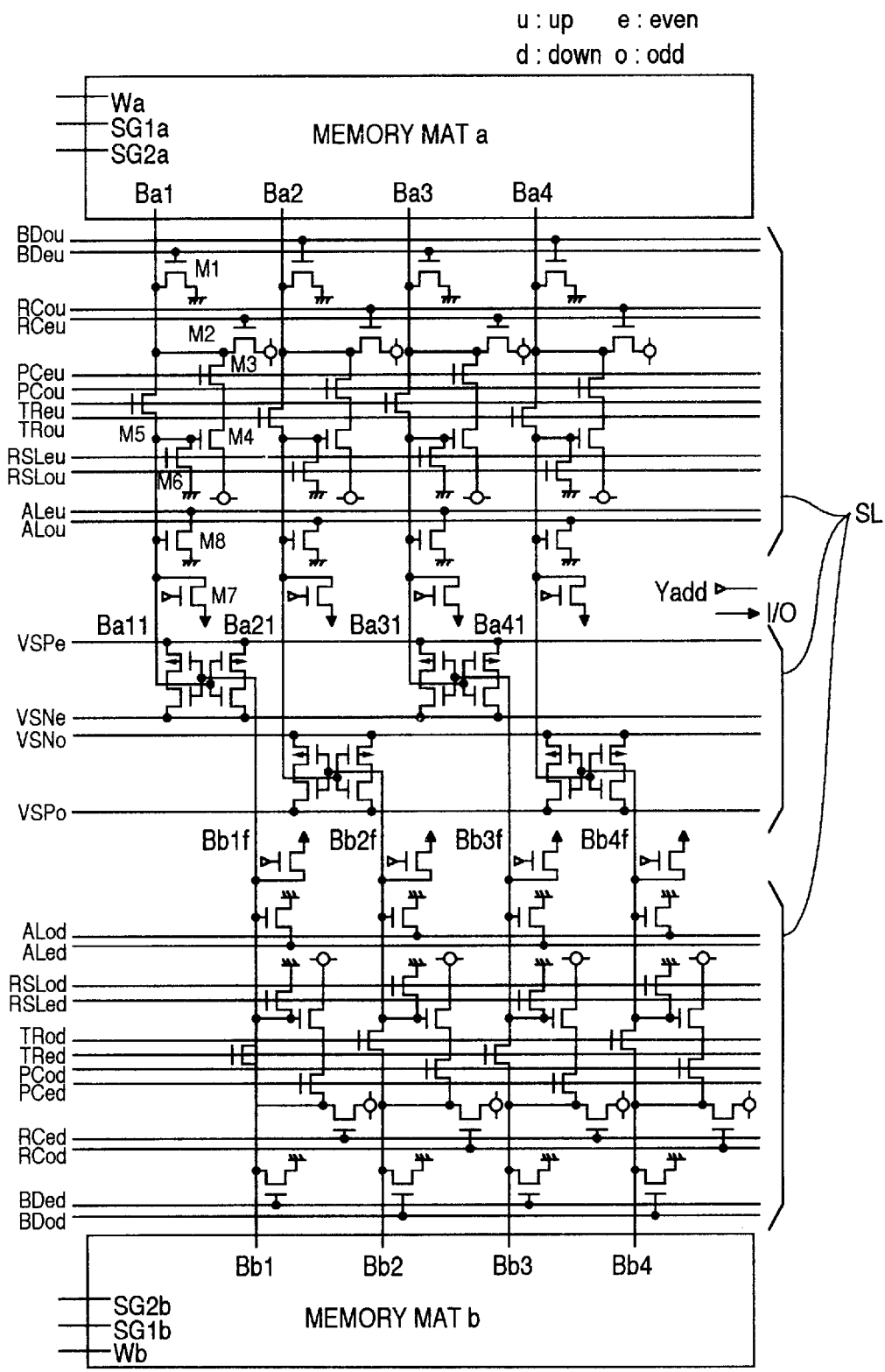
FIG. 23 is a circuit diagram showing a sense latch circuit in detail according to the present invention.

The sense latch circuits SL shown in this FIG. 23 each including a flip-flop are connected to bit lines Ban and Bbn, and have an identical (equivalent) configuration for connection to the bit lines Ban and Ban and the bit lines Bbn-1, Bbn. Further, the sense latch circuits SL use different control signals for even-numbered and odd-numbered bit lines, and have an identical (equivalent) configuration for connection to the bit line Ban-1 and the bit line Bbn. This is in order to prevent the capacitance between parasitic lines of the bit lines from having an effect on the sense operation. During the sense operation of a memory cell connected to an even-numbered bit line (hereinafter referred to as "the even side"), for example, the memory cell on even side is read at a constant value of the capacitance between parasitic lines with the potential on an odd-numbered bit line (hereinafter referred to as "the odd side") set to Vss.

By way of explanation, take the bit line Ba1 of the memory mat a as an example. The bit line Ba1 is connected with a MOS transistor M1 input with a gate signal BDeu for discharging the potential of the bit line to the ground voltage Vss, a MOS transistor M2 input with a gate signal RCeu for precharging the potential of the bit line, and a MOS transistor M3 gated with a precharge signal PCeu through a MOS transistor M4 having flip-flop information as a gate input signal. The connection between M3 and M4 is not limited to this example, but M3 can be on the source voltage Vcc side and M4 can be on the bit line side. A MOS transistor M5 input with a gate signal TReu is connected between the bit line Ba1 and the flip-flop-side wiring Ba1f. The flip-flop-side wiring Ba1f is connected to a MOS transistor M6 input with a gate signal RSLeu for discharging the potential of the flip-flop to the ground voltage Vss, a MOS transistor M7 input with a column gate signal Yadd in accordance with a column address for producing the flip-flop information as a data output, and a MOS transistor M8 having a gate input signal as flip-flop information. The drain of the MOS transistor M8 provides a common signal ALeu and the source thereof the ground voltage Vss, thus making up a multi-stage NOR circuit connection. Specifically, it is a MOS transistor for judging that the information of all the flip-flops connected constitutes the ground voltage Vss.

A basic configuration of a semiconductor nonvolatile memory apparatus according to this embodiment was described above. Now, the operation (write operation) sequence for decreasing the threshold voltage constituting a feature of the present embodiment will be described with reference to the operation sequence shown in FIGS. 1 to 4.

By the way, the operation sequence for performing the operation of decreasing the threshold voltage shown in FIGS. 1 to 4 can also be applied to the erase sequence.

Figure 1:
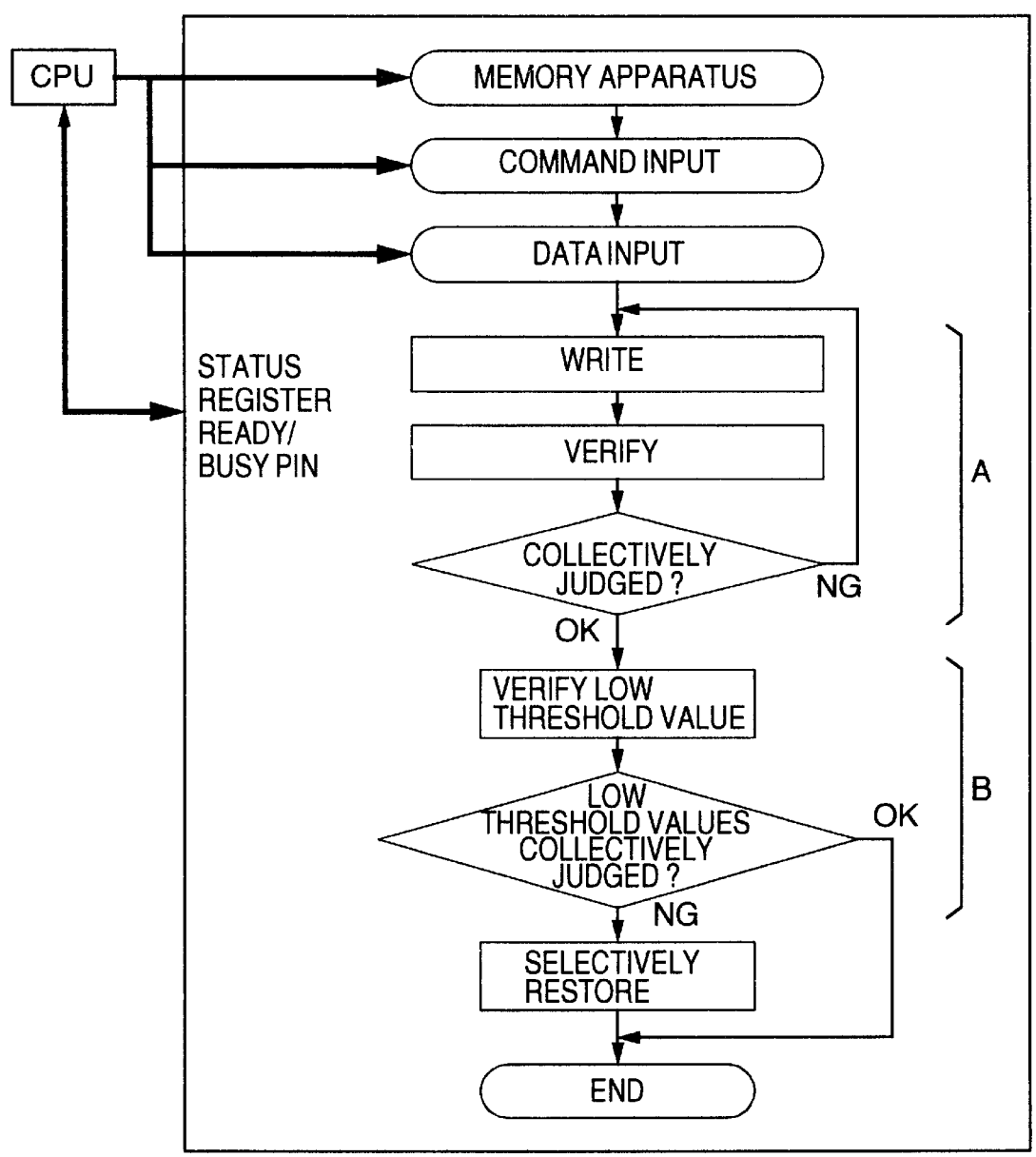
FIG. 1 is a flowchart showing the write operation (the operation for reducing the threshold voltage of the memory cell) according to a first embodiment of the present invention.
Figure 29:
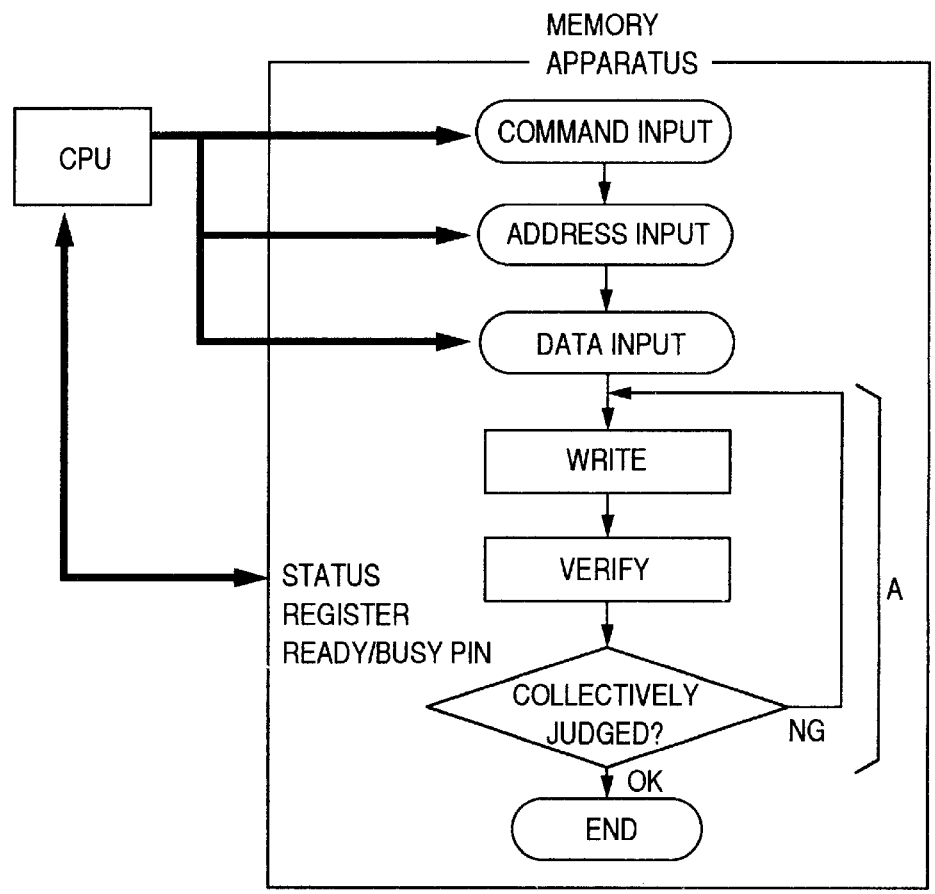
FIG. 29 is a flowchart showing the write operation (the operation for decreasing the threshold voltage of the memory cell) according to the prior art.
Figure 30:
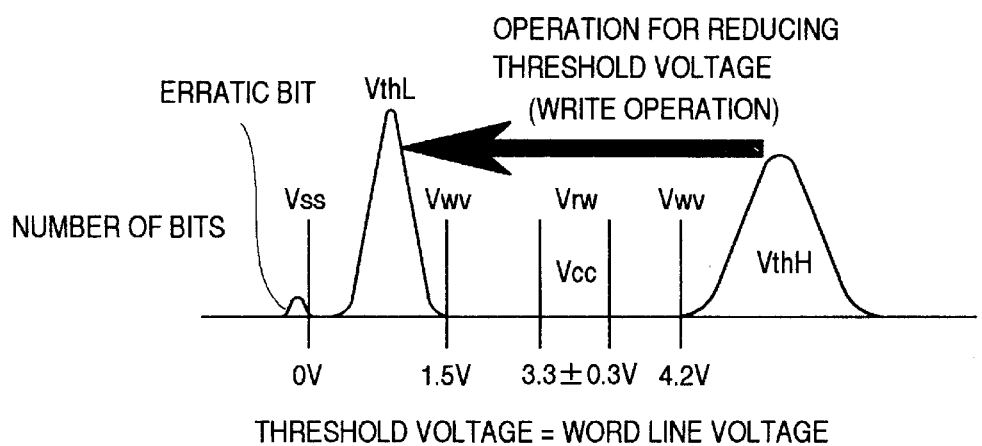
FIG. 30 is a diagram showing the written state in which the operation of decreasing the threshold voltage of the memory cell (write operation) is performed according to the prior art.

The operation sequence according to the first embodiment of the invention is shown in FIG. 1. According to this embodiment, a B sequence is added after the A sequence that is the operation sequence of FIG. 29 described above. Specifically, in the B sequence, data is read out of the memory cells and the low threshold verify operation is performed for checking whether there is any memory cell written over a predetermined level (hereinafter referred to as "a low-threshold memory cell"), and the threshold voltage of a low-threshold memory cell is selectively restored (selective restore operation).

Figure 31A:
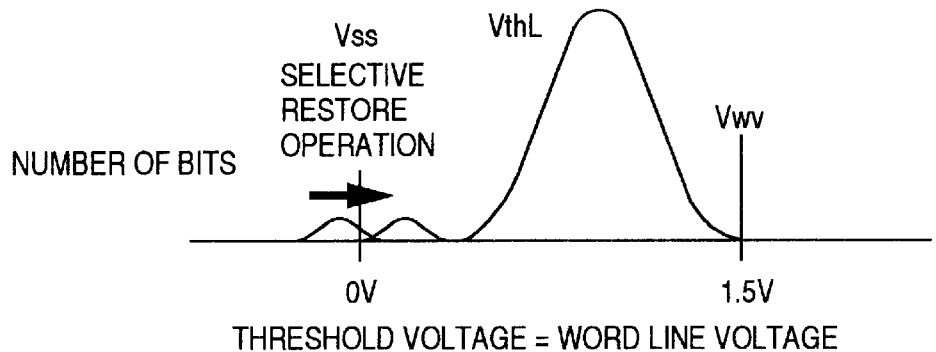
FIGS. 31A, 31B, 31C are diagrams showing the written state in which the operation for decreasing the threshold voltage of the memory cell (write operation) is performed according to the present invention.

The B sequence will be explained in detail with reference to FIG. 31A. At the time of the operation of verifying the low threshold value, the potential of the word line is set to the ground voltage or the like voltage at which the threshold voltage of the memory cell assumes no negative value. A current flows when a word line connected to a low-threshold memory cell with the threshold voltage of Vss or less is selected, and therefore the presence or absence of a low-threshold memory cell can be checked. In the presence of a low-threshold memory cell, a unit restoration time is set, and the threshold voltage of the low-threshold memory cell is restored to a threshold value of not less than Vss selectively in a single session of operation by the Fowler-Nordheim tunnel phenomenon over the entire surface of the channel shown in FIG. 7.

Figure 2:
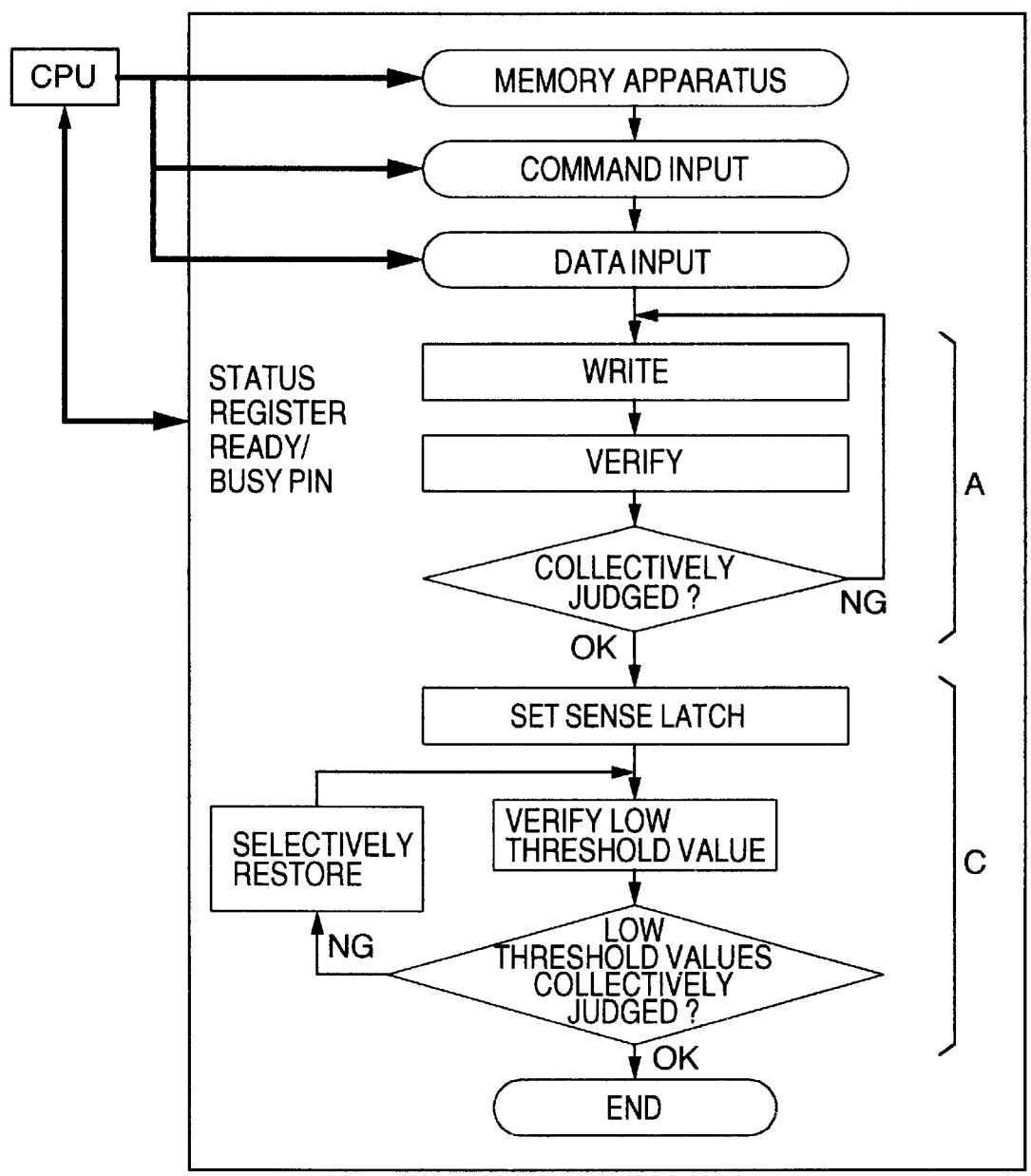
FIG. 2 is a flowchart for the write operation according to a second embodiment of the invention.

The operation sequence according to a second embodiment is shown in FIG. 2. In contrast with the first embodiment in which the selective restore operation is accomplished in a single session, the second embodiment is such that the C sequence, in which the low threshold verify operation and the selective restore operation are performed in a plurality of sessions, is carried out after the A sequence. The memory cell which has restored the threshold voltage, i.e., the memory cell which has ceased to be a low-threshold memory cell while the C sequence is iterated is not subjected to the C-sequence operation. Such a memory cell thus is set so as not to be subjected to the unnecessary selective restore operation.

Figure 31B:
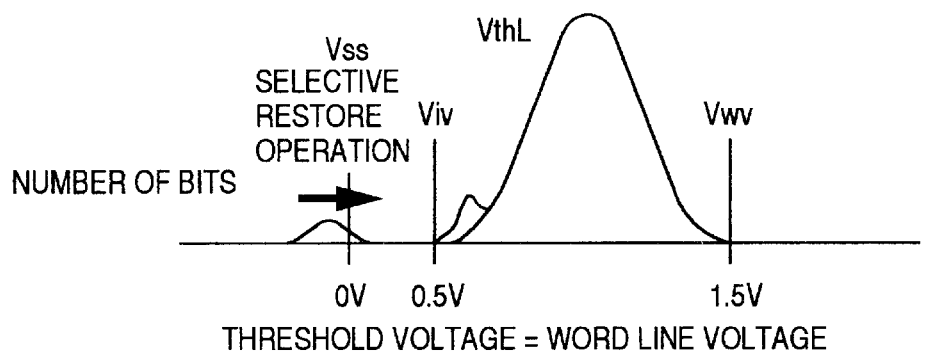
Figure 31C:
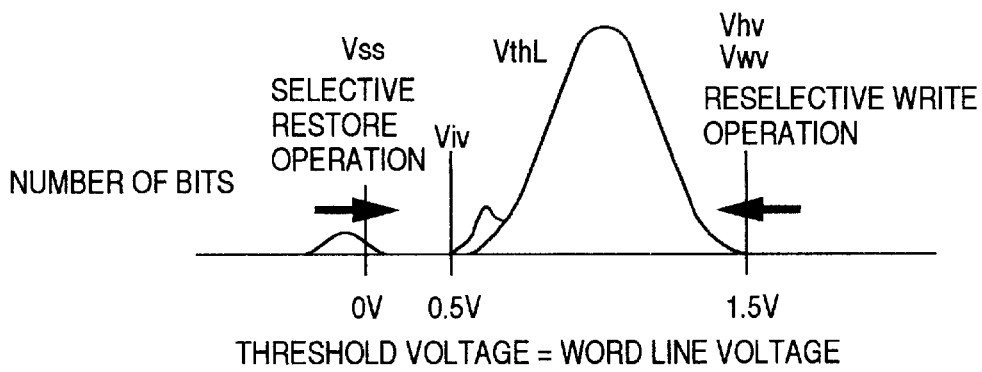

Incidentally, in the C sequence, the word line voltage at the time of the first verification of a low threshold value is not necessarily coincident with the word line voltage at the second and subsequent verifications of a low threshold. For example, the word line voltage for the first low-threshold verify session is set to the ground voltage Vss, and a depleted memory cell is judged as in the B sequence described above. Then, a unit restoration time is set, and the threshold voltage of the low-threshold memory cell is restored to not less than Vss selectively in one session of operation. The word line voltage for the second and subsequent sessions of the low-threshold verification can be set to, say, 0.5 V as shown in FIG. 31B thereby to restore the threshold voltage of the memory cell to not less than 0.5 V.

Figure 3:
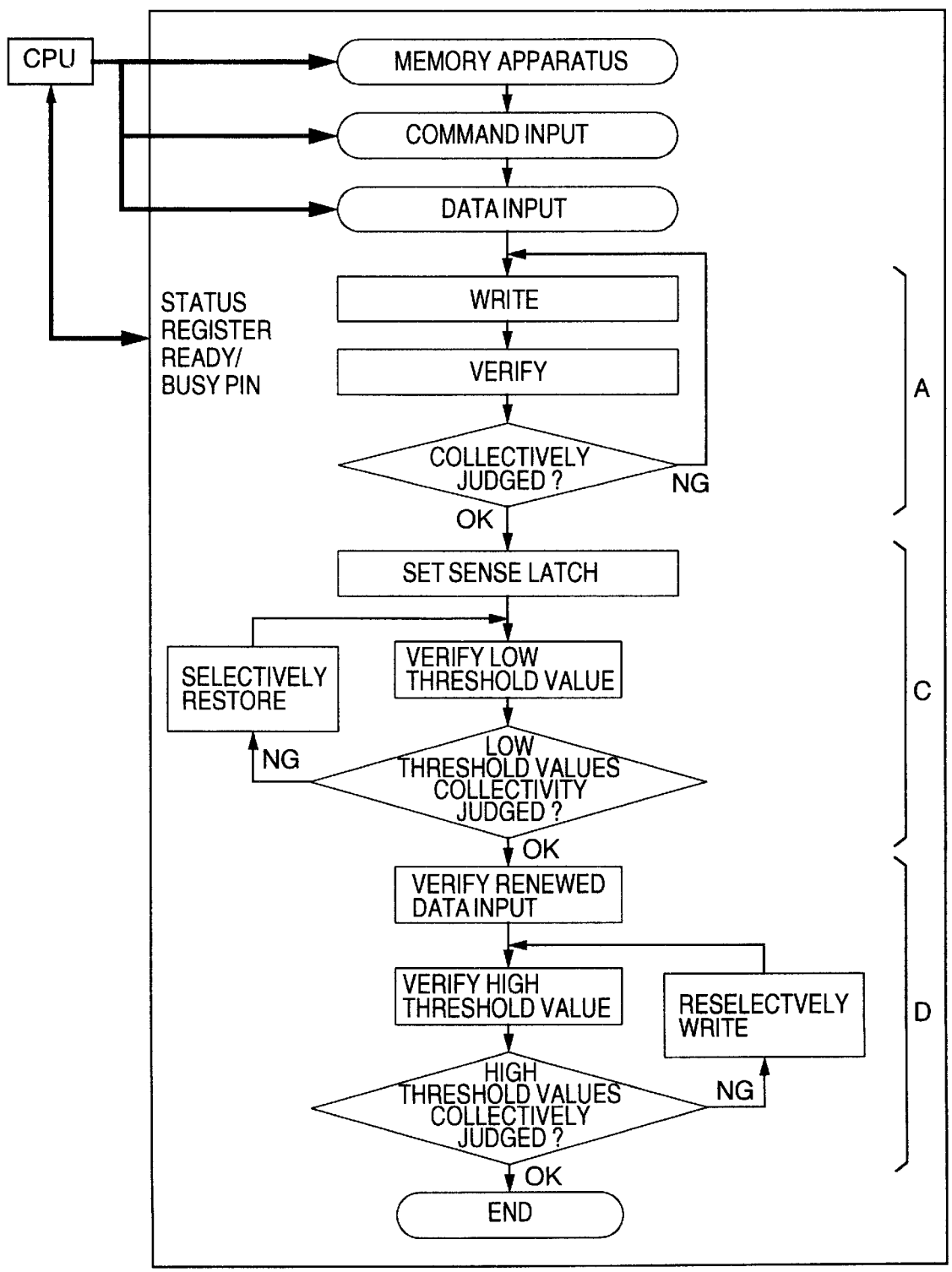
FIG. 3 is a flowchart for the write operation according to a third embodiment of the invention.

The operation sequence according to a third embodiment is shown in FIG. 3. According to the third embodiment, after performing the low-threshold verify operation and the selective restore operation, a high-threshold verify operation is performed for checking the presence or absence of a memory cell that has not yet reached a predetermined level for write operation (hereinafter referred to as "a high-threshold memory cell"). In the presence of a high-threshold memory cell, the operation of selectively writing a threshold voltage (hereinafter referred to as "the reselective write") is performed for the particular memory cell. The operation for decreasing the threshold voltage is performed between the selective restore operation and the reselective write operation, and therefore the operation is required for verifying the data input again. This is in order to distinguish between the memory cells maintaining the threshold voltage and the memory cells of which the threshold voltage has changed slightly.

A voltage of about 2 V is applied as a word line voltage for verifying data input again to latch the written data in a flip-flop. As described later, a memory cell for which the reselective write operation is performed is determined in accordance with this written data and the result of the high-threshold verify operation. A voltage of, say, about 1.5 V is applied as a word line voltage for the high-threshold verify operation, so that the threshold voltage of a cell to be written is set to not more than 1.5 V. The reselective write operation can be realized by a sequence similar to that for the write operation.

This sequence permits the threshold voltage level for write operation to be settled between the word line voltage of 0.5 V for the low-threshold verify operation and the word line voltage of 1.5 V for the high-threshold verify operation.

Figure 4:
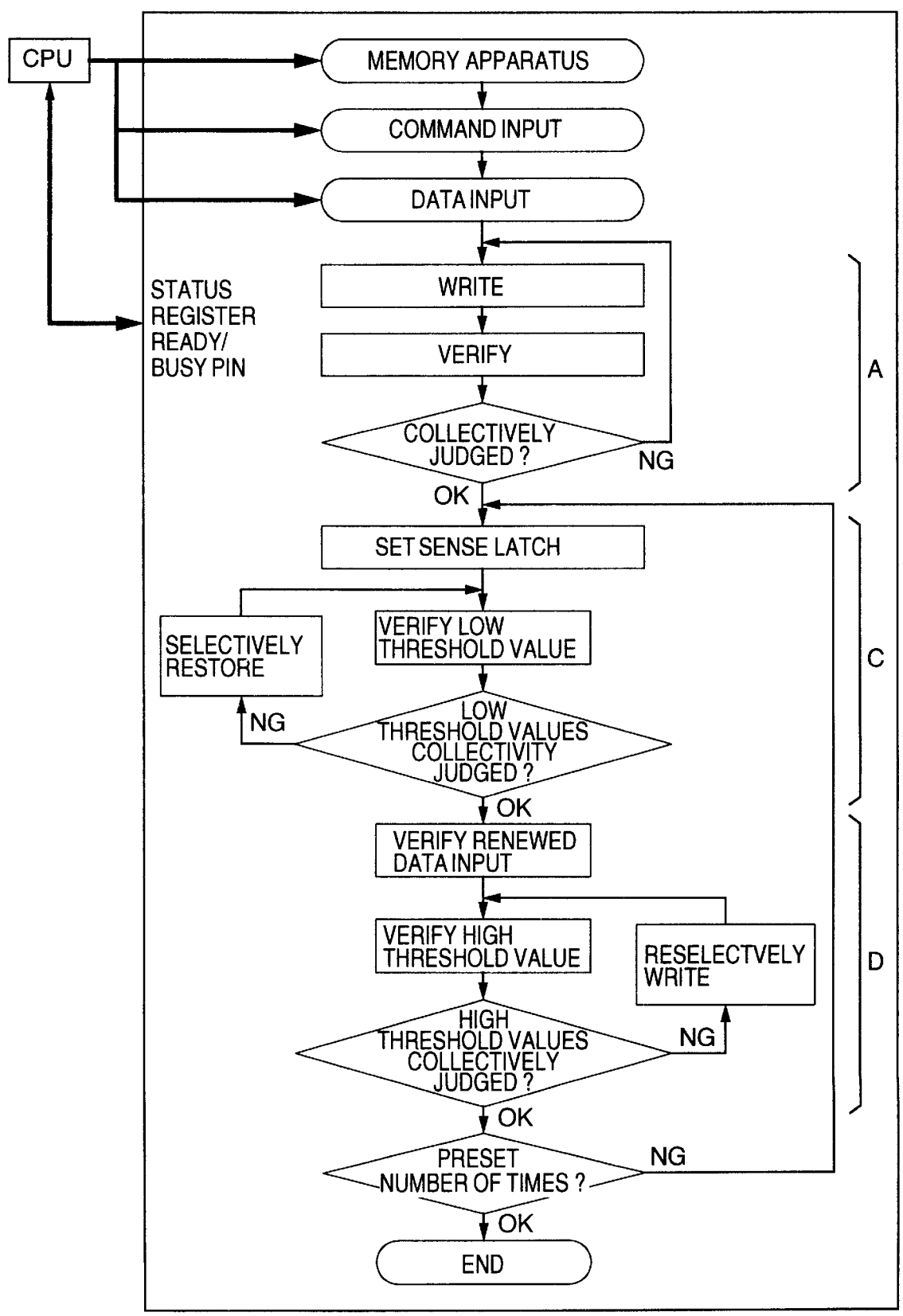
FIG. 4 is a flowchart for the write operation according to a fourth embodiment of the invention.

The operation sequence according to a fourth embodiment is shown in FIG. 4. The operation sequence according to the fourth embodiment includes a C sequence and a D sequence. In other words, this operation sequence repeats a selective restore operation and a reselective write operation a preset number of times.

The above-mentioned A, B, C and D sequences will be described in more detail below.

The data in the flip-flops in the sense latch circuits SL for executing the A, B, C and D sequences described in FIGS. 1 to 4 according to this embodiment are shown in FIGS. 8, 9, 10 and 11, respectively. Also, timing waveform diagrams of the internal signals of the sense latch circuits SL of FIG. 23 for executing the A, B, C and D sequences are shown in FIGS. 24, 25, 26 and 27, respectively. The flip-flop data "0""0" described in FIGS. 8 to 11 is defined as a state (erase state) where the threshold voltage of the memory cells connected to the flip-flop is high, and where the flip-flop data is the ground voltage Vss. The flip-flop data "1", on the other hand, is defined as a state (write state) where the threshold voltage of the memory cells is low. The flip-flop data represents an external source voltage Vcc, for example, during the rewrite operation, gives the write drain terminal voltage Vwd of the internal boosted potential, the selective restore non-selected channel-drain voltage Vpc, and the reselective write drain terminal voltage Vsd.

The timing waveform diagrams of FIGS. 24 to 27 represent the case in which a memory cell group (sector) on the memory mat a (the memory mat involved) is selected. The waveforms shown by solid line indicate control signals with a suffix u in FIG. 23 and the waveforms shown by dashed line indicate control signals with suffix d in FIG. 19.

Figure 8:
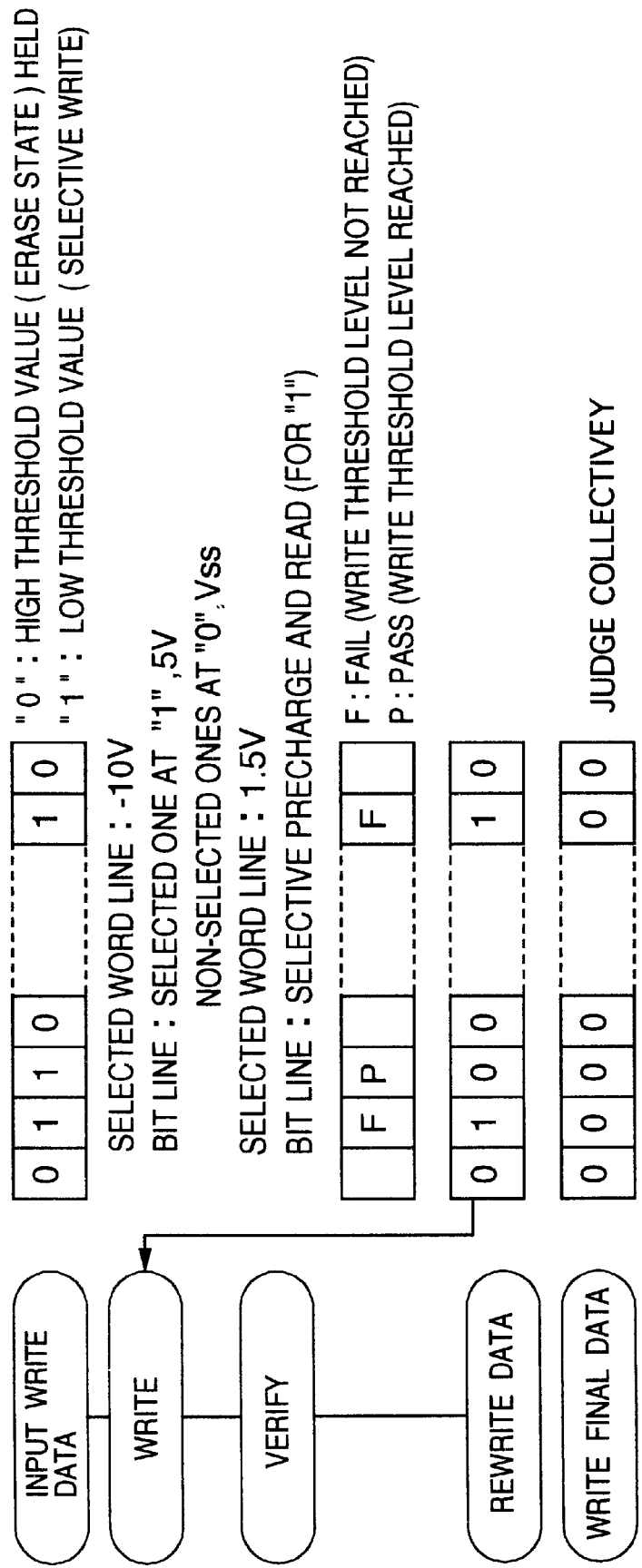
FIG. 8 is a diagram showing data of a flip-flop in a sense latch circuit for performing the operation (write operation) for selectively decreasing the threshold voltage of the memory cell according to the present invention.

First, the write operation sequence (A sequence) will be explained with reference to FIG. 8. Data is input such that the flip-flop in the sense latch circuit connected through the bit line to each memory cell holding the state of a high threshold level (erase state) is set to "0", while the flip-flop connected through the bit line to each memory cell rewritten into a low threshold value (write state) is set to "1". After that, the electrons in the floating gate are drawn by the Fowler-Nordheim tunnel phenomenon at the drain edge shown in FIG. 6. In the verify operation, the voltage of the selected word line is set to 1.5 V, and only the bit lines corresponding to the flip-flop data "1" are selectively precharged. In each memory cell that has reached the write threshold voltage level, i.e., the word line voltage 1.5 V for verification, a cell current flows in "Pass" mode thereby to discharge the potential of the bit line. Consequently, the flip-flop data is rewritten to "0". In the memory cells that have not yet reached 1.5 V, on the other hand, no cell current flows in "Fail" mode, so that the potential of the bit line holds the precharged voltage and the flip-flop data is held at "1". With the flip-flop data after verification as data to be rewritten, the write operation and the verify operation are repeated. As soon as all the data of the flip-flops have come to assume "0", the write operation is completed. This overall judgement is automatically effected in the chip.

Figure 24:
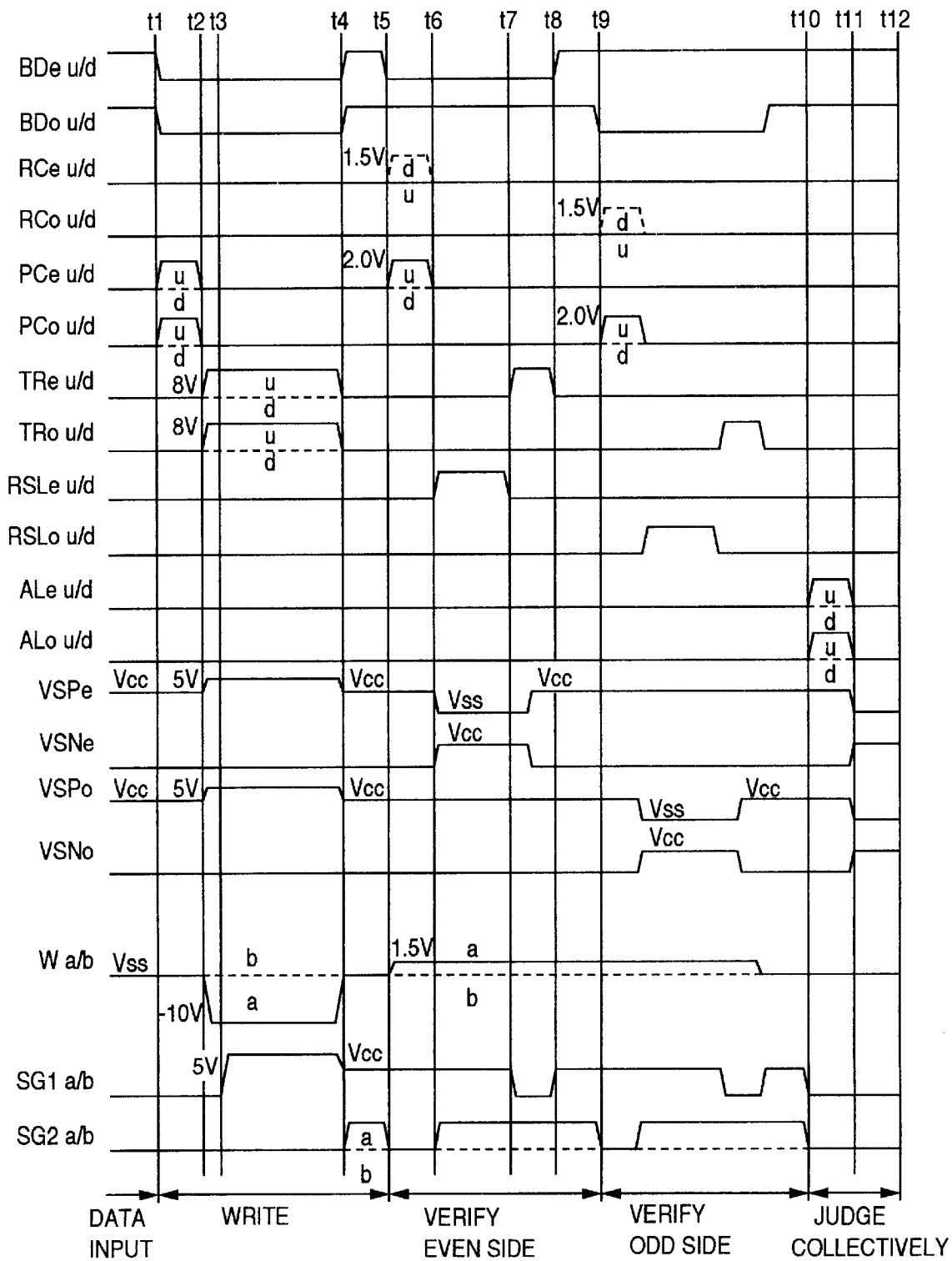
FIG. 24 is a waveform diagram showing the timings of the operation (write operation) for selectively decreasing the threshold voltage according to the prior art.

FIG. 24 shows a timing waveform diagram of the internal signals of the sense latch circuit SL at the time of the write operation sequence (A sequence).

The data to be written is input to the flip-flop in the sense latch circuit SL until time t1, the write operation is performed during the time from t1 to t5, the verify operation on even side is performed during the time from t5 to t9, the verify operation on odd side is performed during the time from t9 to t11, and judgement on the execution for all the bits of the memory cell threshold voltage is made during the time from t11 to t13. As described above, the write data input operation up to t1 is performed in such a manner that the data in the flip-flops connected to the bit lines B1, . . . , Bn corresponding to the memory cells of which the threshold voltage is desirably decreased is set to high level, and the data of which the threshold voltage is desirably not decreased is set to the ground voltage Vss.

PCeu, PCou are selected during the time from t1 to t2, whereby the flip-flop data are selectively transferred to the bit lines B1, . . . , Bn. After that, during the time from t2 to t4, TReu, TRou are selected and the write drain voltage is supplied. The reason why PCeu, PCou are selected before TReu, TRou is that if only TReu, TRou are selected, the fact that the capacitance of the bit lines B1, . . . , Bn is larger than the capacitance of B1f, . . . , Bnf on flip-flop side would destroy the data in the flip-flops. The potential of TReu, TRou and SG1 a/b is set to 6 V is for the purpose of transferring the drain voltage 5 V (VSPe and VSPo) for write operation. In the case where the drain voltage is increased, the gate potential of the TReu, TRou and SG1 a/b is set considering the threshold voltage of the MOS transistor of the drain-side select gate 1 of TReu, TRou and the gate signal SG1 a/b. SG1 a/b is selected (t3) after the fall (t2) of the potential of the selected word line voltage Wa by reason of the fact that the delay time of the word line is large compared with that for the drain-side select gate 1. The net write time is between t3 and t4, so that by setting the word line to a negative voltage of −10 V and by setting the bit line voltage selectively to 5 V, an electric field is generated in the floating gate of the desired memory cell and electrons are discharged.

During the time from t4 to t5, BDe u/d, BDo u/d, the gate signal SG1 a/b of the drain-side select gate 1 and the gate signal SG2 a/b of the source-side select gate 2 are selected in order to discharge the potential of the bit lines B1, . . . , Bn, the sub-bit lines and the sub-source lines to the ground voltage Vss During the time from t5 to t6, on the other hand, PCeu and RCed are selected for dual purpose of precharging the bit lines by the flip-flop data selectively and supplying a reference potential to the bit lines of the non-selected bit mat. In the case where the precharge potential is set to 1.0 V taking the threshold voltage of the MOS transistor into account, the PCeu potential is set to 2.0 V, while in the case where the reference potential is set to 0.5 V, the RCed potential is set to 1.5 V.

During the time up to t6, the internal source voltages VSP e/o, VSN e/o are activated in order to hold the data in the flip-flop. During the time from t5 to t10, the potential of the selected word line assumes the verify voltage of 1.5 V.

The time during which the memory cells are discharged for verify operation on even side lasts from time point t6 when the gate signal SG2a of the source-side select gate 2 is selected to the time point t7 when the gate signal SG1a of the drain-side select gate 1 is deactivated. In the meantime, the flip-flops on even side are reset by the activation of the RSLe u/d signal. After that, during the time from t7 to t8, TRe u/d is selected and the source voltages VSPe, VSNe of the flip-flops on even side are reactivated. In this way, the information in the memory cells after verification can be fetched into the flip-flops on even side. Specifically, depending on whether the threshold voltage of the memory cell is in low state or high state, the potential of the bit line is discharged or holds a precharge voltage.

During the time from t8 to t9, the potential of the bit line Bn-1 for verification on even side, the sub-bit lines and the sub-source lines are discharged to the ground voltage Vss.

Next, the verify operation on odd side is performed during the time from t9 to t10 in a similar fashion to the verify operation on even side. After that, during the time from T11 to t13, the completion for all the bits of the threshold voltage of the memory cells is judged. If the threshold voltages of all the memory cells are found to have dropped, the flip-flop data is the ground voltage Vss. Thus, Vss is judged. After ALeu and ALou are activated (during the time from t11 to t12), the potentials thereof are verified. If the potentials are the ground voltage Vss, the process is returned to t1 to continue the write operation. In the case where ALeu, ALou are at high level, on the other hand, the write operation is terminated.

Figure 9:
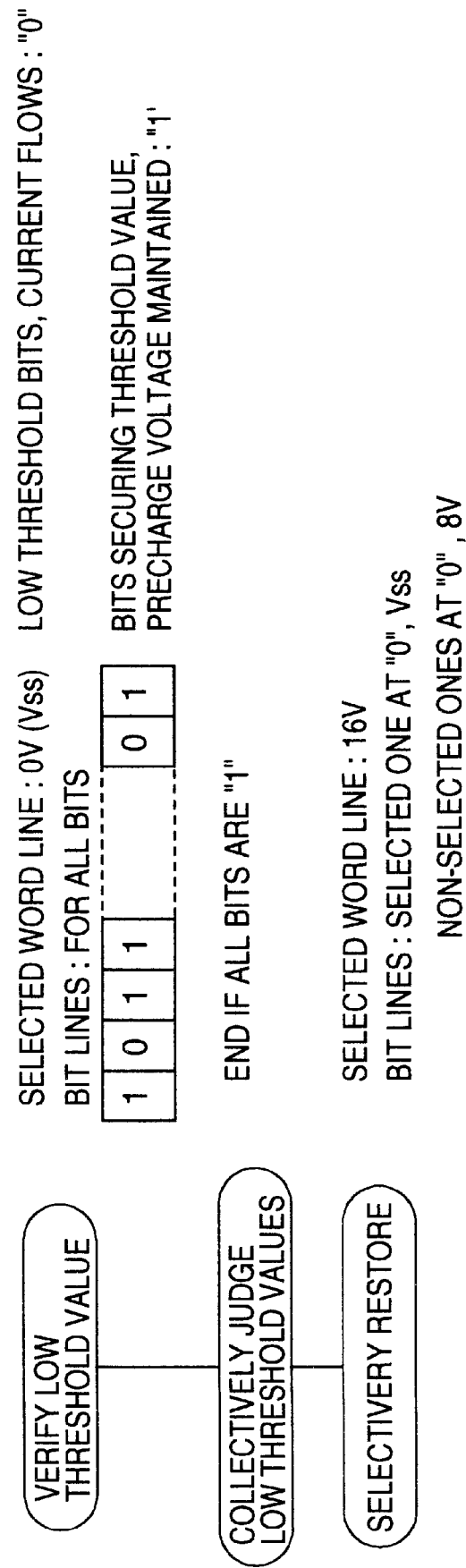
FIG. 9 is a diagram showing data of a flip-flop in a sense latch circuit for performing the operation of selectively restoring the threshold voltage of the memory cell in a single session according to the invention.

FIG. 9 shows data in the flip-flop in the sense latch circuit for the B sequence. After complete write operation (A sequence) according to the prior art, all the memory cells connected to the word line involved in the write operation are subjected to the above-mentioned low-threshold verify operation. The word line voltage for the low-threshold verify operation is set to the ground voltage Vss, for example, and is precharged for all the bits. For the bits (depletion bits) for which the threshold voltage is lower than the verify word line voltage, a cell current flows so that the flip-flop data drops to "0". For the bits that secure the threshold voltage, on the other hand, the precharge voltage is maintained at "1". After that, the flip-flop data are judged. If all the data are "1", the operation is terminated. In the case where at least one of the bits is "0", i.e., in the presence of a bit (depletion bit) for which the threshold voltage is lower than the word line voltage for low-threshold verify operation, then the selective restore operation is performed. The potential of the word line involved in the write operation is set to a voltage as high as 16 V, and the channel of the memory cell selected by the flip-flop data is set to the ground voltage Vss, so that the selective restore operation is performed with the channel-drain voltage Vpc of the non-selected memory cells se to, say, 8 V.

Figure 25:
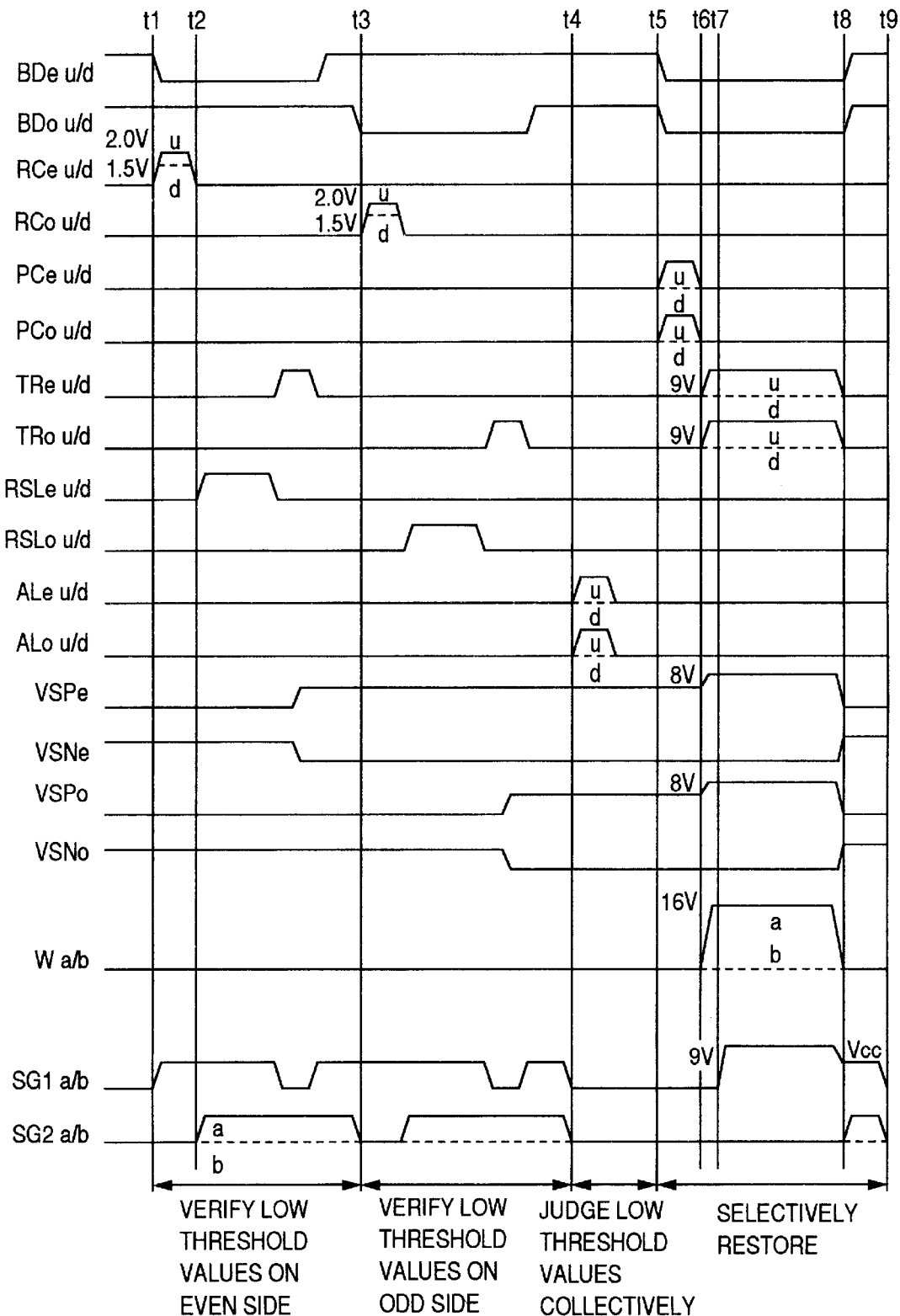
FIG. 25 is a waveform diagram showing the timings of the operation for restoring the threshold voltage of the memory cell selectively in a single session.

FIG. 25 shows timing waveforms of the internal signals of the sense latch circuit SL for the B sequence. The low-threshold verify operation is performed on even side during the time from t1 to t3, and on odd side during the time from t3 to t4. Judgement is made as to whether the selective restore operation is to be performed during the time from t4 to t5, and the selective restore operation is performed during the time from t6 to t9.

The difference from the verify operation in the A sequence described with reference to FIG. 24 lies in that all the bits are involved in the verify operation and therefore the precharge voltage for the bit lines and the reference voltage during the time from t1 to t2 are supplied with the RCeu potential set to 2.0 V and the RCed potential set to 1.5 V.

In the selective restore operation, first, PCeu, PCou are activated during the time from t5 to t6 so that the flip-flop data are transferred to the bit lines. After that, as in the write operation, the signal line is activated thereby to execute the selective restore operation. In this case, however, a high voltage of 16 V, for example, is applied as the word line voltage Vpw for the selective restore operation, a non-selected channel-drain voltage Vpc of, say, 8 V for the selective restoration is applied as a flip-flop source voltage VSP e/o, and further, the potential of the gate signals TRe u/d, TRO u/d and SG1 u/d of the MOS transistors for transferring the drain voltage is set to the transfer gate voltage Vpt of, say, 9 V for the selective restore operation.

Figure 10:
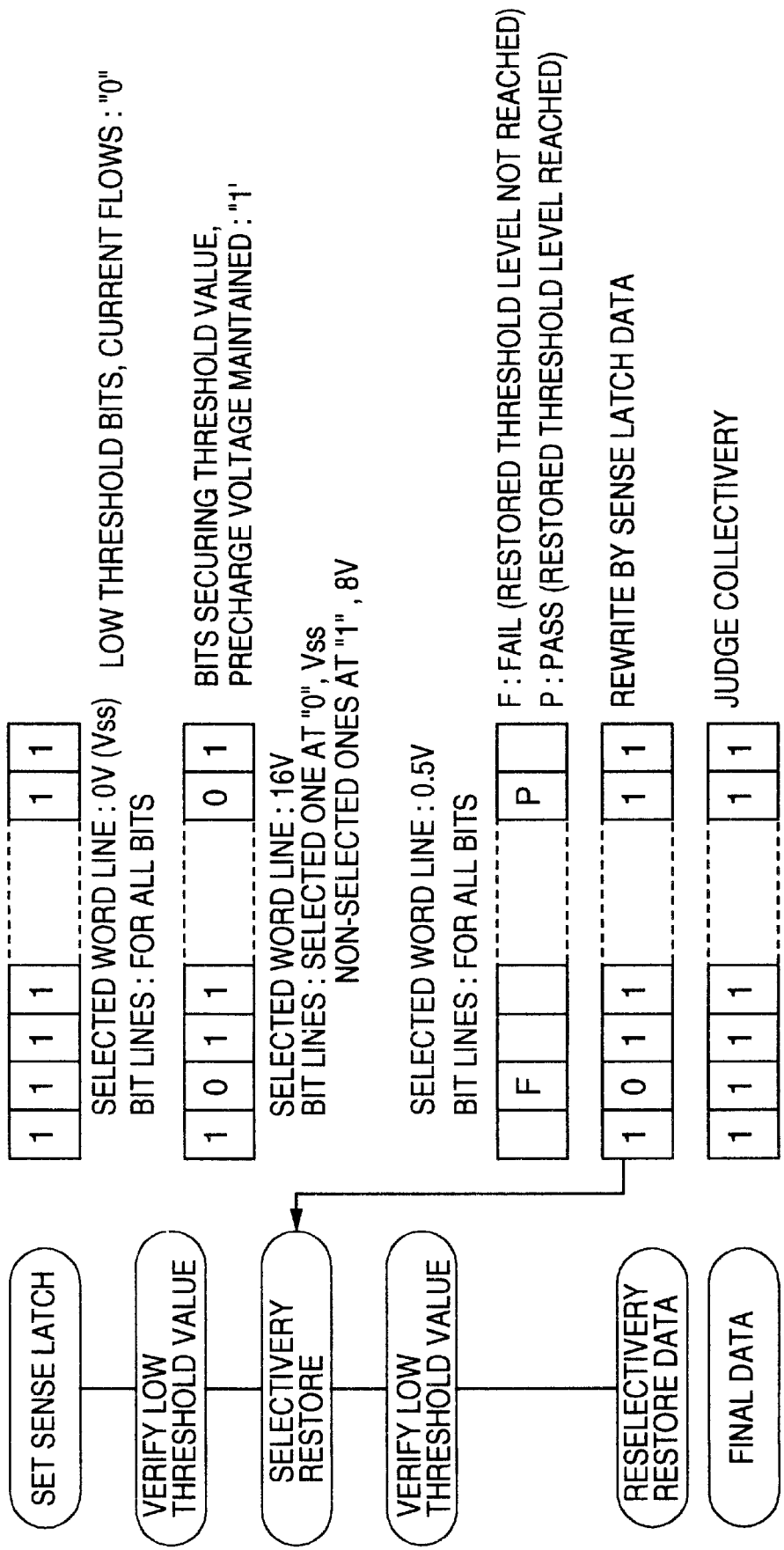
FIG. 10 is a diagram showing data of a flip-flop for restoring the threshold voltage of the memory cell selectively in accordance with the data of the flip-flop in a sense latch circuit.

FIG. 10 shows the data in the flip-flop in the sense latch circuit for the C sequence. After completing the conventional write operation (A sequence), the low-threshold verify operation is performed for the memory cells connected to the word line involved in the write operation in the same manner as in FIG. 9. In the presence of a bit (depletion bit) with a low threshold voltage, the selective restore operation is performed. After that, the low-threshold verify operation is performed again at a voltage where the restoration of the threshold voltage is desired. For example, assume that the word line voltage for low-threshold verify operation is 0.5 V. The threshold voltage of the memory cell can be increased to not less than 0.5 V.

Description will be made about the case in which the voltage of the selected word line is set to 0.5 V in the iterative verification of the low threshold value. First, all the memory cells on bit line side are selected and precharged. In the memory cells where the voltage has not reached 0.5 V representing the selective restore threshold voltage level, i.e., the word line voltage for verify operation, a cell current flows in "Fail" mode, so that the potential on the bit lines is discharged. Thus, the data in the flip-flop holds "0". For the memory cells that have reached 0.5 V, on the other hand, no cell current flows and therefore the "Pass" mode presents itself, so that the potential of the bit lines holds the precharged voltage. The memory cells are thus rewritten to the data of "1" in the flip-flop. With the post-verification flip-flop data as a reselective restore data, the selective restore operation and the low-threshold verify operation are repeated. The operation is terminated when the data of all the flip-flops assume "1". This overall judgement is automatically performed in the chip.

Figure 26:
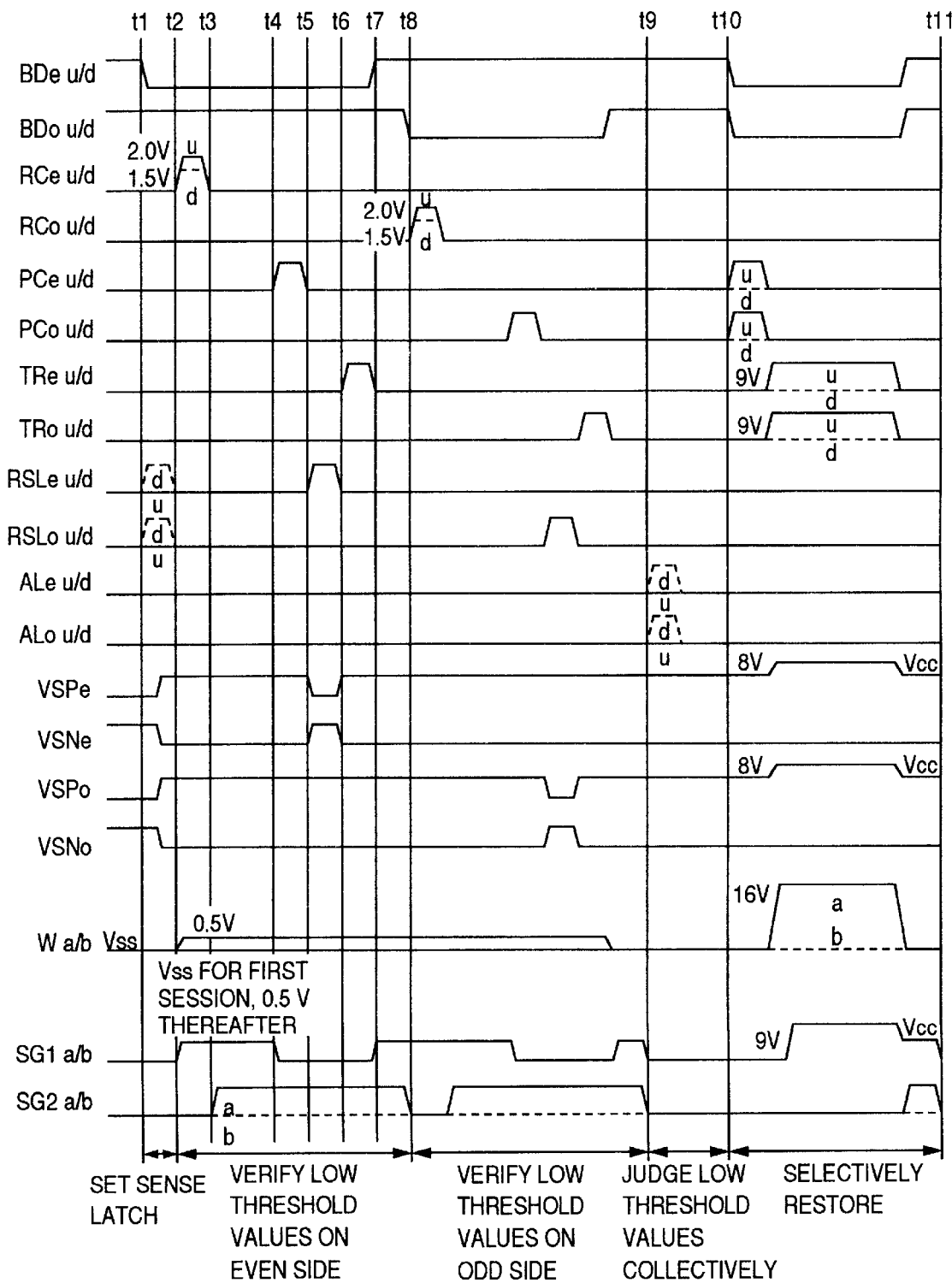
FIG. 26 is a waveform diagram showing the timings of the operation for selectively restoring the threshold voltage of the memory cell in accordance with the data of the flip-flop in the sense latch circuit according to the invention.

FIG. 26 shows timing waveforms of the internal signals of the sense latch circuit SL for the C sequence.

During the time from t1 to t2, the data in the flip-flops are set. The low-threshold verify operation is performed on even side during the time from t2 to t8, and on odd side during the time from t8 to t9. During the time from t9 to t10, judgement is made as to whether the selective restore operation is to be performed or not. During the time from t10 to t11, the selective restore operation is performed.

During the time from t1 to t2, RSLed, RSLod on the non-selected memory mat are selected, and the source voltages VSP e/o, VSN e/o of the flip-flops are activated thereby to set the flip-flop data to the all-bit selection mode.

During the time from t2 to t3, in order to supply the precharge potential to all the bit lines selected and in order to supply the reference potential to the bit lines on the non-selected memory mat, the RCeu voltage is set to 2.0 V, and the RCed voltage is set to 1.5 V. The discharge time of the memory cells for verification on even side lasts from the time point t3 when the gate signal SG2a of the source-side select gate 2 is selected to the time point t4 when the gate signal SG1a of the drain-side select gate 1 is deactivated.

During the time from t4 to t5, PCe u/d is selected and the data in the flip-flop are transmitted to the bit line. After that, during the time from t5 to t6, the flip-flops are reset. During the time from t6 to t7, TRe u/d Is selected and the source voltages VSPe, VSNe of the flip-flops on even side are reactivated, thus making it possible to fetch the in formation from the memory cells after verification into the flip-flops on even side.

Next, the verify operation on odd side Is performed during the time from t8 to t9 In a similar manner to the verify operation on even side. After that, during the time from t9 to t10, judgement Is made as to whether the threshold voltage of the memory cells is restored to not less than a predetermined voltage. If the threshold voltages of all the memory cells are so restored, the flip-flop data represents the potential (high level) of the source voltage VSP e/o, and therefore the threshold voltages of the memory cells can be judged by the flip-flop data. The flip-flop data are verified by activating ALed and ALod on non-selected side. In the case where the flip-flop data is the ground voltage Vss, the selective restore operation is performed from t10. If the result is a high level of the flip-flop data, the operation is terminated. The selective restore operation is accomplished in the same manner as in FIG. 21. At time t11 and subsequent to the completion of the selective restore operation, the operation returns to t2 to continue the operation sequence.

Figure 11:
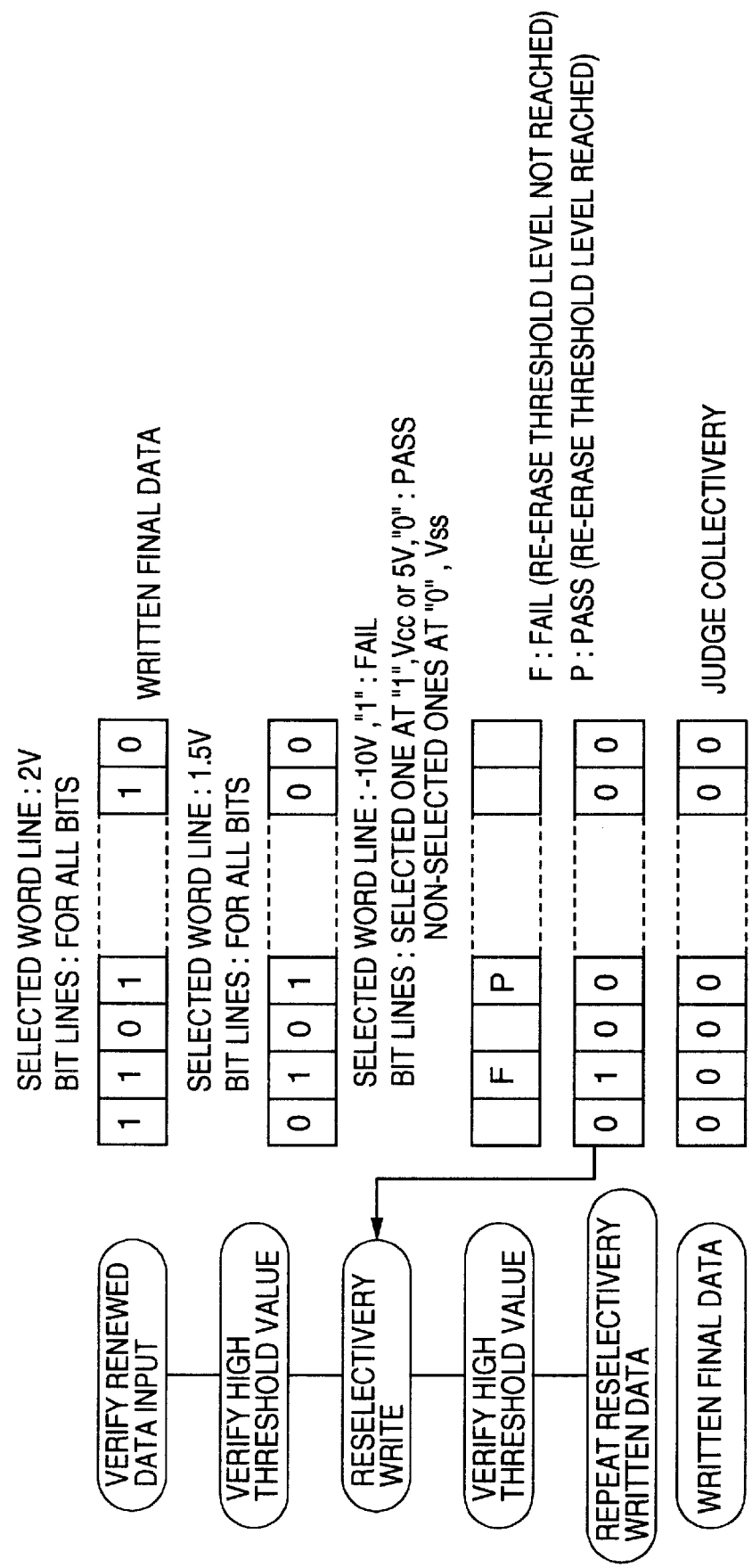
FIG. 11 is a diagram showing data of a flip-flop in a sense latch circuit for performing the operation (write operation) of selectively decreasing the threshold voltage of the memory cell again according to the invention.

FIG. 11 represents the flip-flop data in the D sequence. A voltage of, say, about 2 V is applied as a word line voltage for renewed input data verification, and the write data is latched by the flip-flop. A voltage of, say, about 1.5 V is applied as a word line voltage for the high-threshold verify operation, and the threshold voltage of the memory cell to be written is set to not more than 1.5 V.

The flip-flop data for the reselective write operation is similar to the flip-flop data for the write operation described with reference to FIG. 8.

Figure 27:
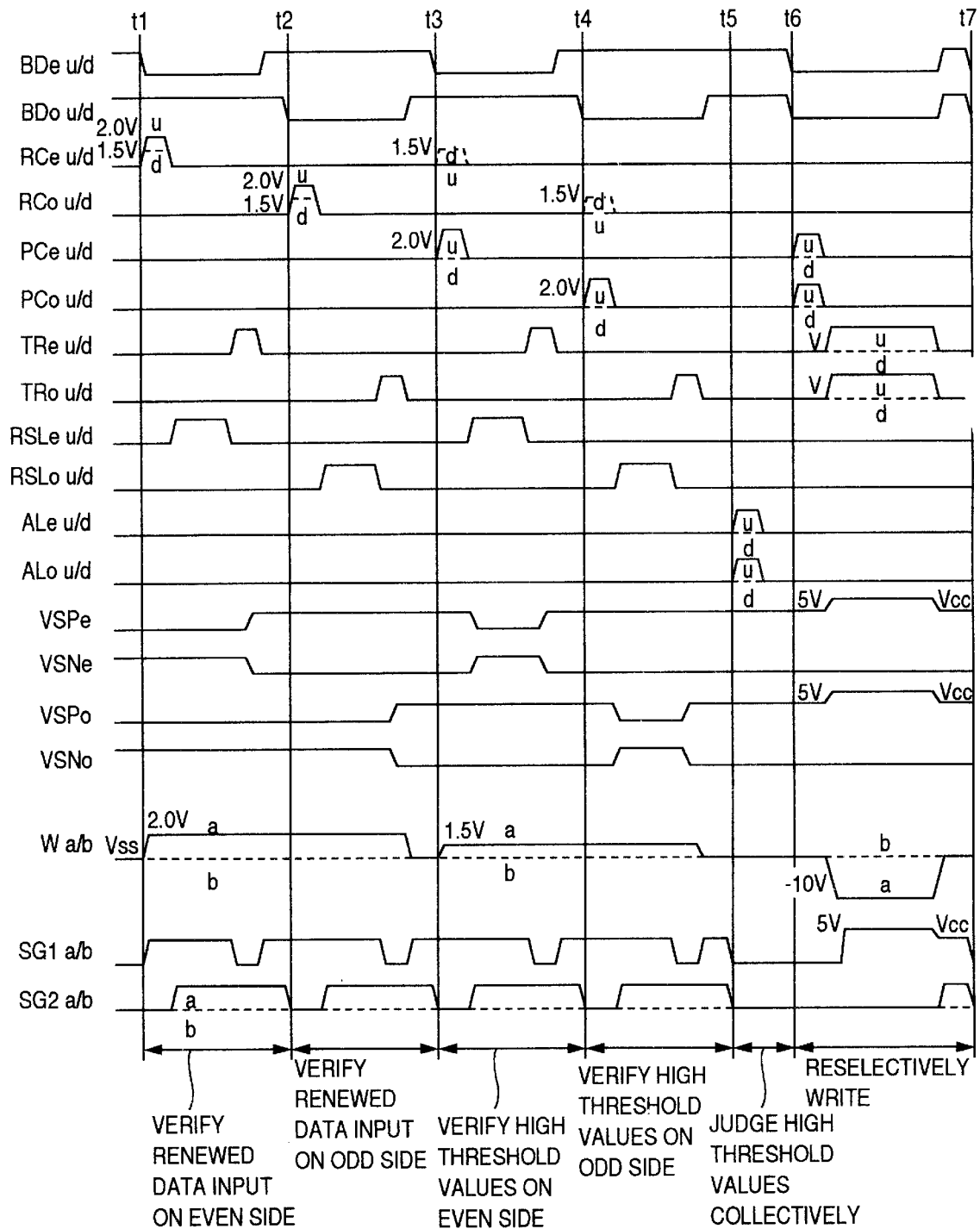
FIG. 27 is a waveform diagram showing the timings of the operation (write operation) for selectively decreasing the threshold voltage of the memory cell again according to the invention.

FIG. 27 is a diagram showing timing waveforms for the internal signals of the sense latch circuit SL for the D sequence. A timing waveform diagram for activating the circuit SL is shown.

During the time from t1 to t3, the operation is performed for verifying the renewed input data of the verify word line voltage 2 V; during the time from t3 to t4, the operation is performed for verifying the high threshold value of the verify word line voltage 1.5 V; during the time from t5 to t6, judgement is made as to whether the reselective write operation is to be performed or not; and during the time from t6 to t7, the reselective write operation is performed. After completion at time t7, the process returns to t2 for continuing the operation sequence.

FIG. 32 shows voltages applied to the terminals of the memory cells at the time of executing the A, B, C and D sequences and at the time of read, erase and erase verify operations.

Embodiments were explained specifically above. The present invention, however, is not limited to the above-mentioned embodiments, and can of course be modified variously without departing from the gist of the invention.

For example, a semiconductor nonvolatile memory apparatus according to the present embodiment was described above as an application to a flash memory (EEPROM). The present invention, however, is not confined to such an embodiment, but can be widely applied to other electrically-rewritable nonvolatile memory apparatuses including EEPROM and EPROM.

Also, a semiconductor nonvolatile memory apparatus according to this embodiment is not only used as a unit of a flash memory, but finds wide applications as a memory apparatus for various systems including a computer system, a digital still camera system and an automotive system. As an example, a computer system will be explained with reference to FIG. 24.

Figure 28:
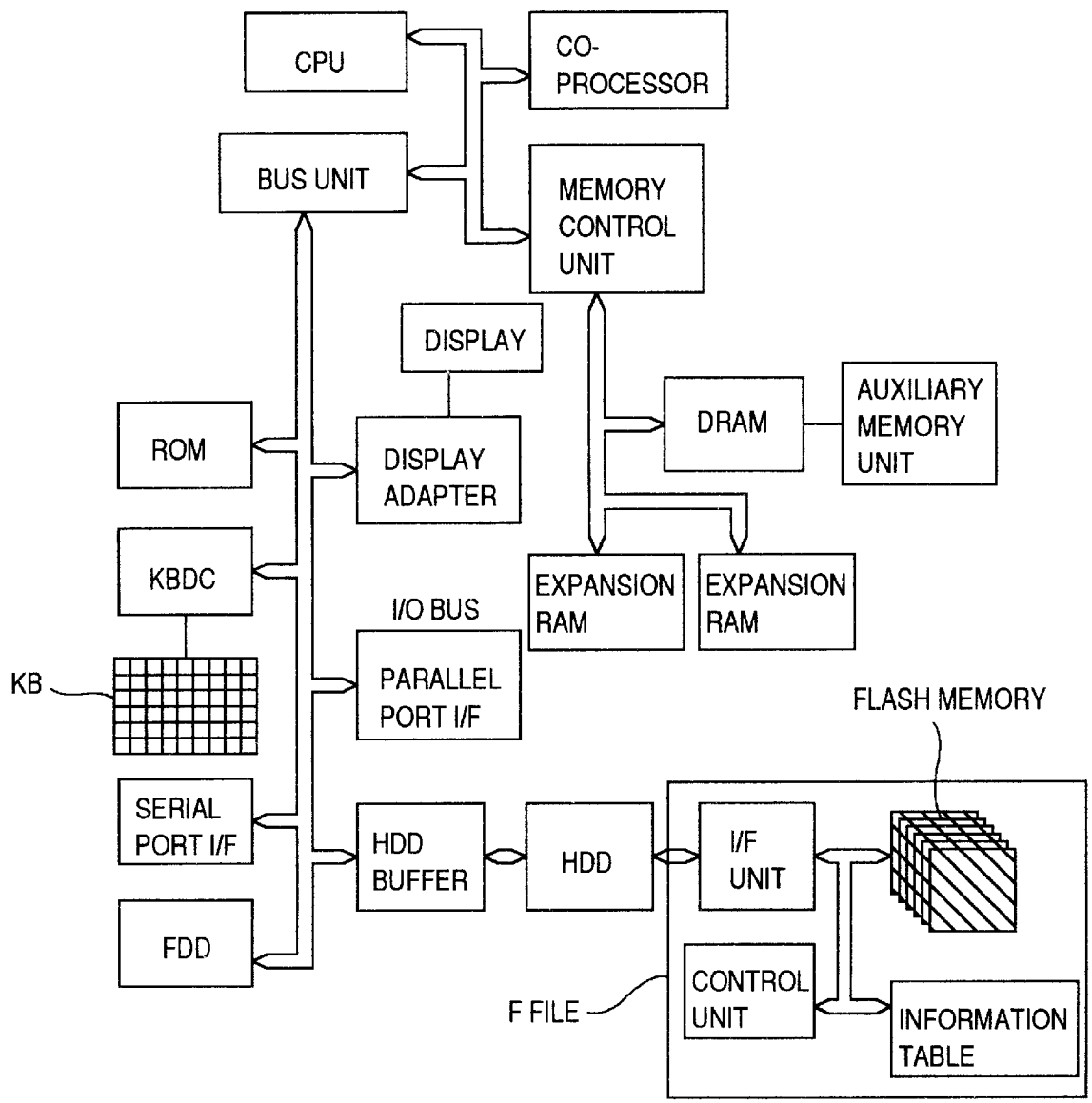
FIG. 28 is a functional block diagram showing a computer system using a semiconductor nonvolatile memory apparatus according to this invention.

In FIG. 28, this computer system is configured of a central processing unit CPU as an information equipment, an I/O bus, a bus unit and a memory control unit for accessing a main memory and a high-speed memory such as an expanded memory configured in the information processing system, a RAM constituting the main memory, a ROM for storing a basic control program (an operating system), and a keyboard controller KBDC with the forward end thereof connected to the keyboard. Further, a display adapter is connected to the I/O bus, and a display is connected to the forward end of the display adapter.

The above-mentioned I/O bus is connected with a parallel port I/F, a serial port I/F such as a mouse, a floppy disk drive FDD, and a buffer controller HDD buffer for converting to a HDD I/F from the above-mentioned I/O bus. Also, expanded RAMs and a DRAM constituting a main memory are connected to the bus from the main memory control unit.

Now, the operation of this computer system will be explained. Once the operation is started by switching on power, the central processing unit CPU first accesses the ROM through the I/O bus for initial diagnosis and for initialization. The system program from an auxiliary memory unit is loaded onto the DRAM constituting a main memory unit. Also, the above-mentioned central processing unit CPU operates for accessing the HDD in the HDD controller through the above-mentioned I/O bus.

Upon completion of loading the system program, the processing is continued in accordance with the user request for processing. Incidentally, the user continues the processing work by the input and output operation through the keyboard controller KBDC and the display adapter on the I/O bus. As required, the user utilizes the input/output units connected to the parallel port I/F and the serial port I/F.

Also, in the case where the capacity of the DRAM is insufficient as a main memory, the main memory capacity is complemented by the expanded RAMs. In the case where the user is desirous of reading or writing a file, on the other hand, the user requests an access to the above-mentioned HDD assumed to be an auxiliary memory unit. A flash file system configured of a flash memory according to this invention receives the request and accesses the file data.

As described above, a semiconductor nonvolatile memory apparatus such as a flash memory according to this embodiment can find wide applications as a flash file system for a computer system.

Further, other embodiments will be explained with reference to FIGS. 33 to 48.

Figure 33:
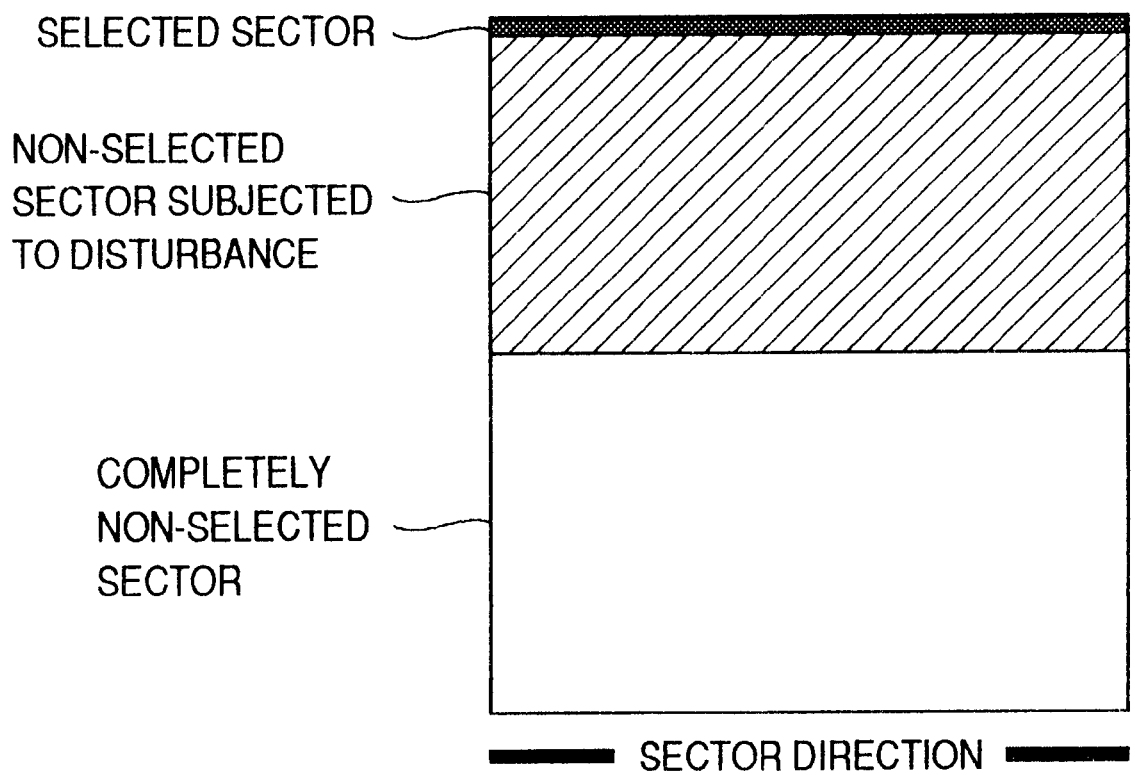
FIG. 33 is a schematic diagram showing a memory mat of a semiconductor nonvolatile memory apparatus according to an embodiment of the invention.
Figure 34A:
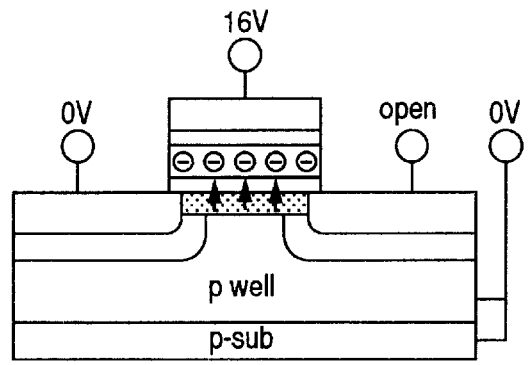
FIGS. 34A and 34B are sectional views of a transistor showing an example of voltage application in the erase operation of a conventional semiconductor nonvolatile memory cell.
Figure 34B:
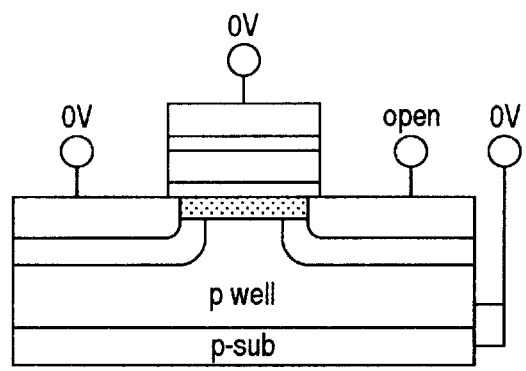
Figure 37:
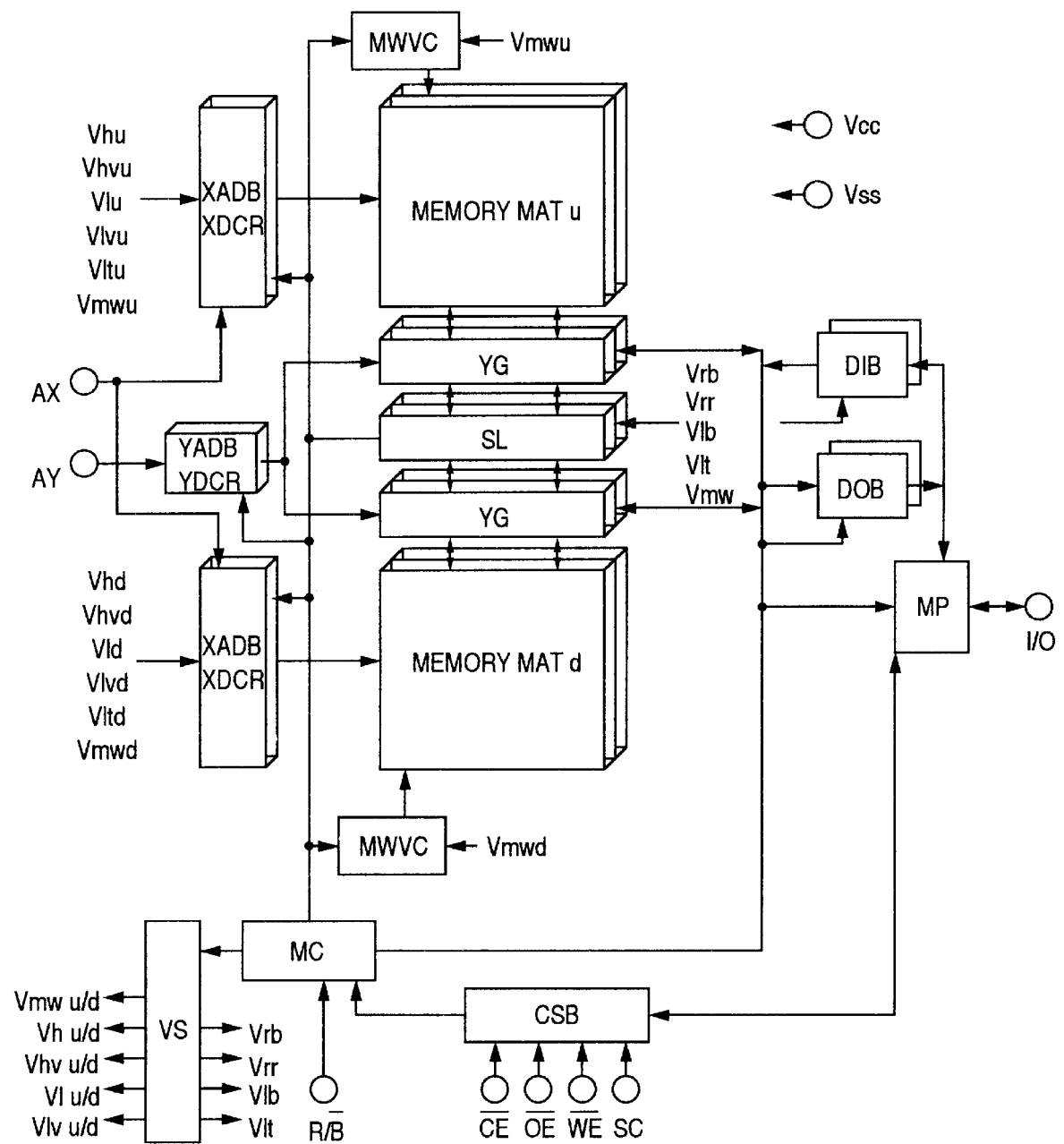
FIG. 37 is a functional block diagram showing a semiconductor nonvolatile memory apparatus according to an embodiment of the invention.
Figure 38:
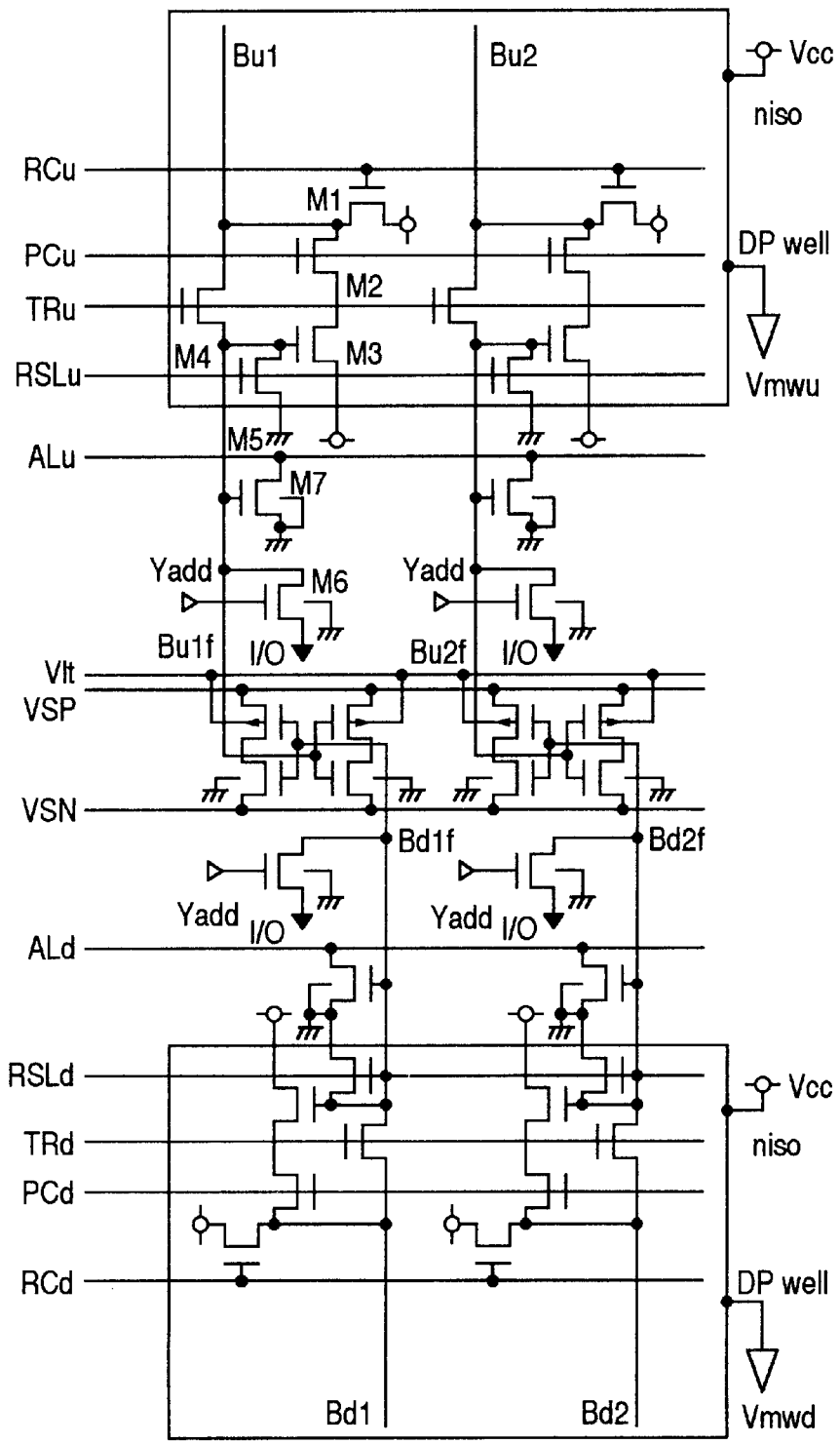
FIG. 38 is a circuit diagram showing a sense latch circuit in detail according to an embodiment of the invention.
Figure 39:
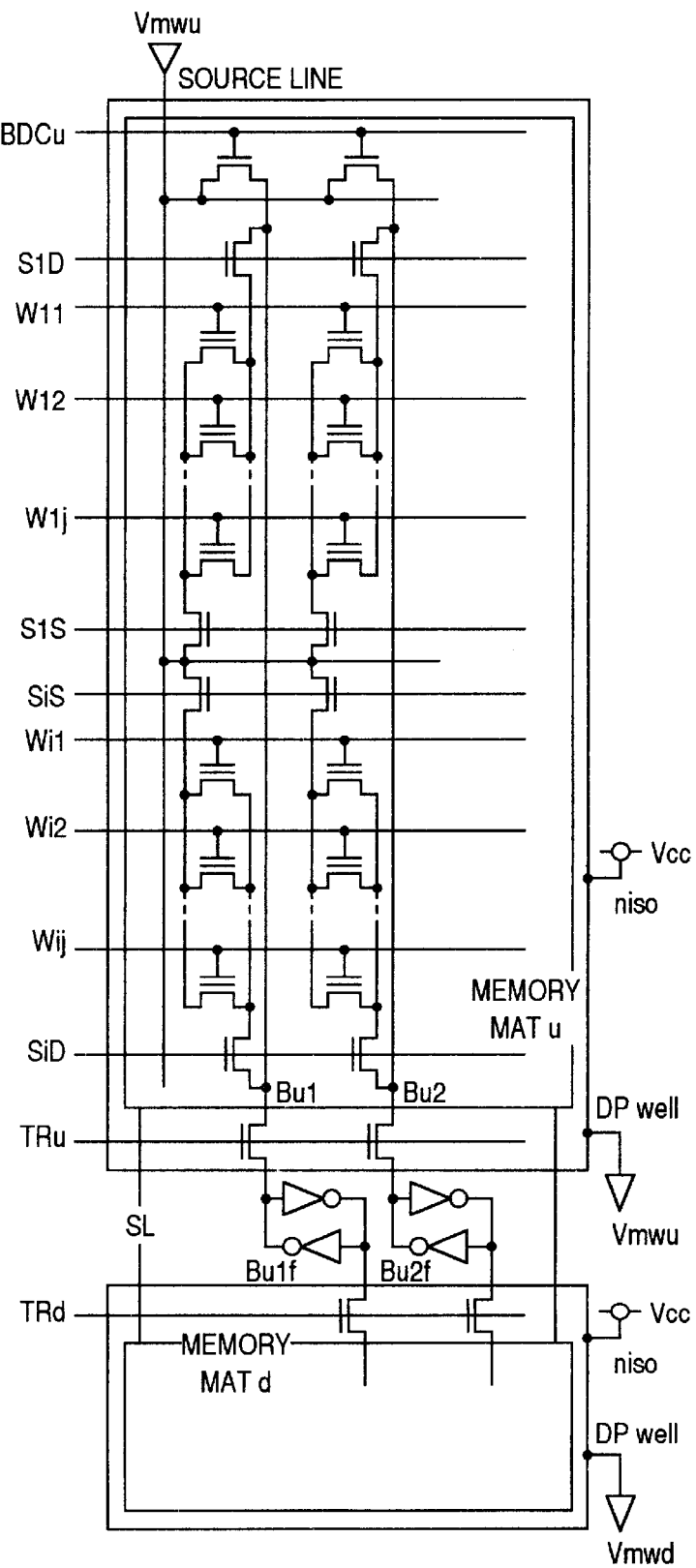
FIG. 39 is a circuit diagram showing in detail memory mats composed of AND-type memory cells according to an embodiment of the invention.
Figure 40:
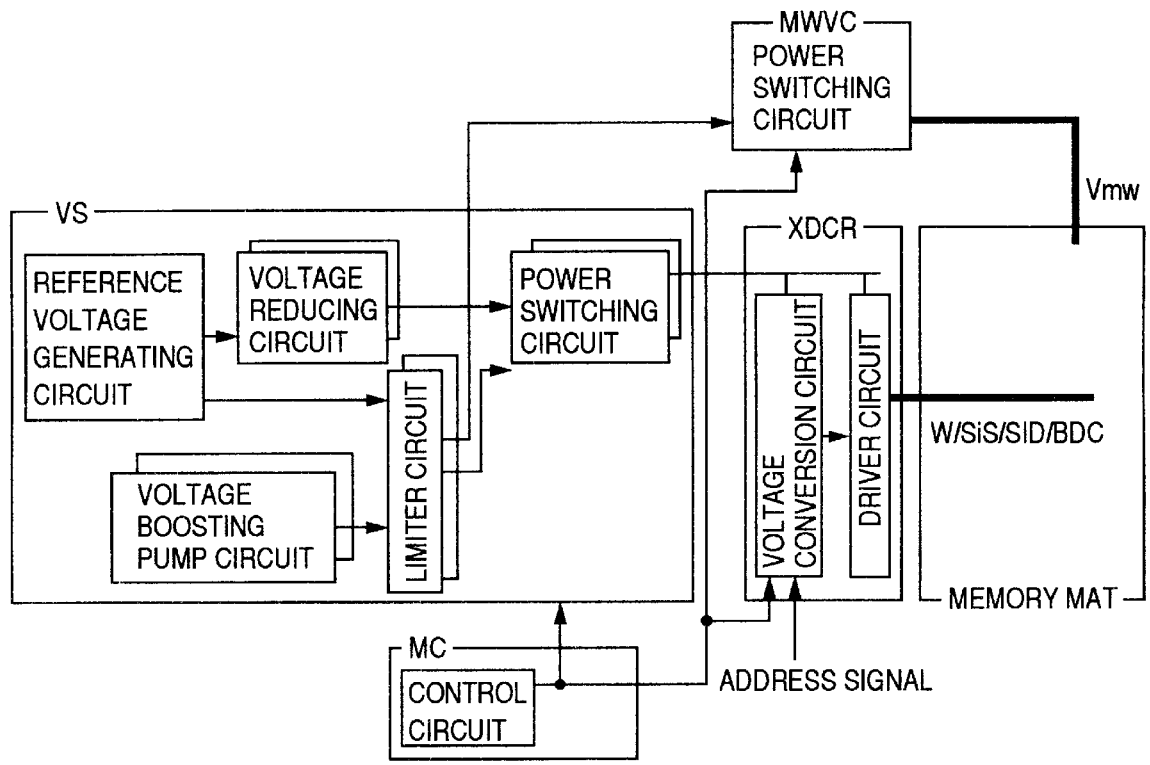
FIG. 40 is a functional block diagram for generating voltages applied to a memory mat in the erase operation according to an embodiment of the invention.
Figure 41:
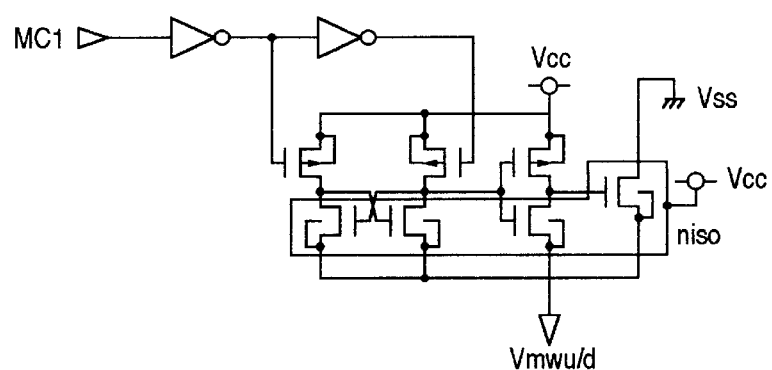
FIG. 41 is a circuit diagram showing a circuit for switching the memory well voltage according to an embodiment of the invention.
Figure 42:
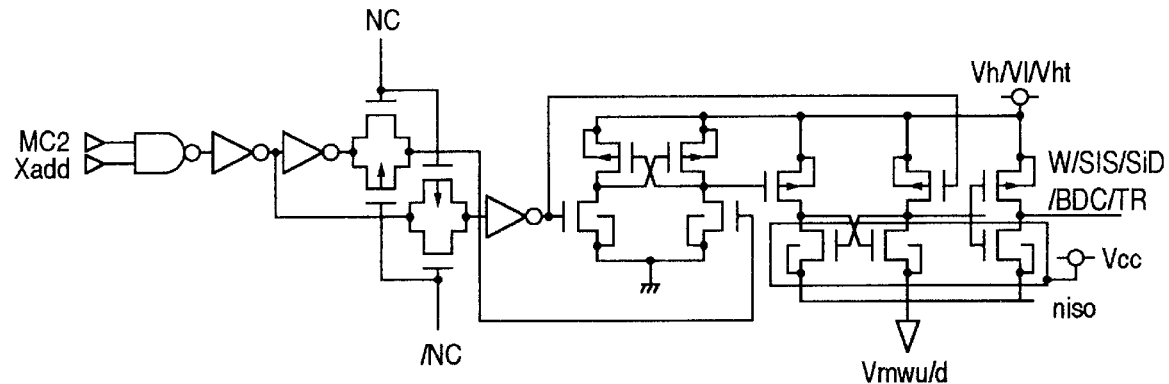
FIG. 42 is a diagram showing a row decoder circuit for selecting a word line according to an embodiment of the invention.

FIG. 33 is a schematic diagram showing a memory mat representing the concept of an embodiment of the present invention; FIGS. 34A, 34B are sectional views of a transistor and an example of voltage application for the erase operation in a conventional semiconductor nonvolatile memory cell; FIGS. 35, 36A, 36B, 36C are diagrams showing examples of voltage application to selected and non-selected memory cells for the erase operation according to this embodiment; FIG. 37 is a functional block diagram showing a semiconductor nonvolatile memory apparatus according to this invention; FIG. 38 is a circuit diagram showing a sense latch circuit according to this invention; FIG. 39 is a circuit diagram showing memory mats according to the present invention; FIG. 40 is a block diagram showing the function of generating a voltage supplied to the memory mats; FIGS. 41 and 42 are circuit diagrams showing a memory well voltage switching circuit and a row decoder circuit, respectively; FIGS. 43 to 47 are waveform diagrams showing the timings of the erase operation; and FIG. 48 is a functional block diagram of a computer system using a semiconductor nonvolatile memory apparatus according to this embodiment.

First, a configuration of a semiconductor nonvolatile memory apparatus according to this embodiment will be explained with reference to FIG. 37. The semiconductor nonvolatile memory apparatus according to this embodiment is a flash memory configured of a plurality of memory mats each including a plurality of transistors of which the threshold voltage can be electrically rewritten, for example. The memory apparatus according to this embodiment thus comprises the memory mats, a memory mat well voltage switching circuit MWVC, a row address buffer circuit XADB, a row address decoder circuit XDCR, a plurality of sense latch circuits SL each functioning both as a sense amplifier and as a data latch, a plurality of column gate array circuits YG, a column address buffer circuit YADB, a column address data circuit YDCR, an input buffer circuit DIB, an output buffer circuit DOB, a multiplexer circuit MP, a mode control circuit MC, a control signal buffer circuit CSB and a built-in power circuit VS.

The memory mats and the sense latch circuits SL according to this embodiment are connected to each other in such a manner that one sense latch circuit SL is arranged for each of the bit lines B1 to Bn. For example, as shown in FIGS. 38 and 39, the sense latch circuits SL1 to SLn are disposed in an open bit line arrangement with respect to the bit lines Bu1 to Bun, Bu1 to Bun of the memory mats u, d.

In the semiconductor nonvolatile memory apparatus shown in FIG. 37, the control signal buffer circuit CSB, though not specifically limited, is supplied with a chip enable signal, an output enable signal, a write enable signal, a serial clock signal, etc. applied to external terminals /CE, /OE, /WE, SC, etc., and in accordance with these signals, generates timing signals as internal control signals. Also, the mode control circuit MC is input with a ready/busy signal from an external terminal R (/B). By the way, "/" in /CE, /OE, /WE, etc. in this embodiment designates a complementary signal.

Further, the built-in power circuit VS, though not specifically limited, is supplied with the source voltage Vcc and the ground voltage Vss from an external source and is adapted to generate such voltages as a word line voltage Vh for erase operation (for increasing the threshold voltage), a verify word line voltage Vhv therefor, a word line voltage V1 for the write operation (for decreasing the threshold voltage), a verify word line voltage Vlv therefor, a memory well voltage Vmw for erase operation, a read bit line voltage Vrb, a read reference bit line voltage Vrr, a drain terminal voltage V1d for write operation and a transfer gate voltage V1t therefor. The suffixes to the voltage names are the same as the suffixes u/d of the memory mats supplied with the voltages. By the way, each of the above-mentioned voltages can alternatively be supplied from an external source.

Each voltage generated this way is such that the word line voltages Vh, Vhv, V1, Vlv and the transfer gate voltage V1t are applied to the row address decoder circuit XDCR, the bit line voltages Vrb, Vrr, V1d and the transfer gate voltage V1t are applied to the sense latch circuits SL, and the memory well voltage Vmw is applied to the memory mat well voltage switching circuit MWVC, the row address decoder XDCR circuit and the sense latch circuits SL.

In this semiconductor nonvolatile memory apparatus, the complementary address signals formed through the row and column address buffer circuits XADB, YADB receiving the row and column address signals AX, AY, respectively, from an external terminal are applied to the row and column address decoder circuits XDCR, YDCR, respectively. Also, though not specifically limited, the row and column address buffer circuits XADB, YADB described above, for example, are activated by a chip enable select signal /CE in the apparatus, fetch the address signals AX, AY from an external terminal, and form complementary address signals including an internal address signal in phase with the address signal supplied from an external terminal and an address signal of opposite phase.

The row address decoder circuit XDCR forms a select signal for the word line W of the memory cell group in accordance with the complementary address signal of the row address buffer XADB, and the column address decoder circuit YDCR forms a select signal for the bit line B of the memory cell group in accordance with the complementary address signal of the column address buffer circuit YADB. As a result, in the memory mats, an arbitrary word line W and an arbitrary bit line B are designated and the desired memory cell is selected.

Though not specifically limited, in the memory cell select operation, 8 or 16 memory cells are selected, for example, by the row address decoder circuit XDCR and the column address decoder circuit YDCR in order to perform the write and read operations in units of 8 bits or 16 bits. Assume that each data block contains m memory cells along the word lines (along the rows) and n memory cells along the bit lines (along the columns). Eight or 16 data blocks each having m×n memory cells are configured.

The above-mentioned memory cells, though not specifically limited, are configured in a manner similar to the memory cells of the EPROM, for example, and each constitutes a well-known memory cell having a control gate and a floating gate or a well-known memory cell having a control gate, a floating gate and a select gate.

As shown in FIG. 37, assume that the apparatus has two memory mats, for example, each including 512 bytes (one byte=8 bits) by 64M bits and that the unit block j has 64 bits. In the memory connection of AND type shown in FIG. 19, each of the bit lines Bn (B1 to B4096) is connected, through a selected MOS transistor input with a gate signal SiD, to i (=128) memory cells including j (=64) memory cells connected in parallel for each mat. A common source line is connected with sub-source lines for each unit block through a selected MOS transistor supplied with a gate signal SiS.

The erase operation according to this invention will be explained below. FIGS. 35, 36A, 36B, 36C are sectional views of a memory cell showing an example of voltage application to a selected memory cell and a non-selected memory cell for explaining the erase operation according to the present invention. The memory cell shown in FIGS. 35, 36A, 36B, 36C is formed in a DP well in an element isolation layer niso region for isolating the memory cell from the substrate p-sub of the memory apparatus. The voltage of the substrate p-sub is the ground voltage Vss in the prior art, and though not specifically limited, the voltage of the element isolation layer niso supplies voltage values higher than the source-drain terminal voltage, for example, the source voltage Vcc and the ground voltage Vss. According to this invention, the voltage of the element isolation layer niso is assumed to be the source voltage Vcc.

Figure 35:
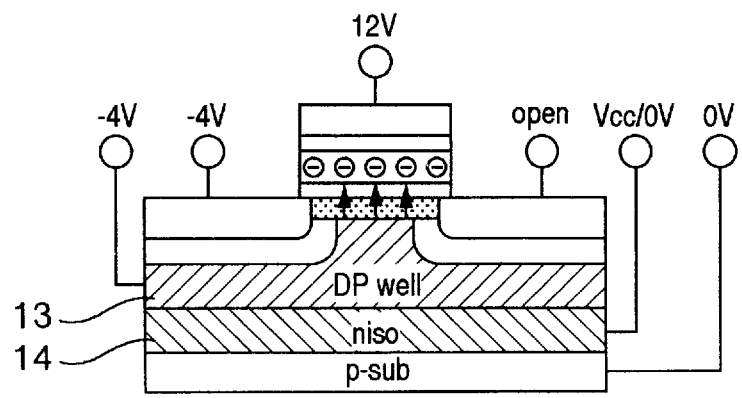
FIG. 35 is a sectional view of a transistor showing an example of voltage application to a selected memory cell in the erase operation according to an embodiment of the present invention.

The voltages for erase operation of the selected memory cell in FIG. 35 are such that 12 V is applied to the control gate and a negative voltage of −4 V is applied to the DP well and the source terminal. A voltage difference occurs between the floating gate and the channel, so that the electrons in the channel are injected into the floating gate by the Fowler-Nordheim tunnel phenomenon. By the way, the drain electrode of the memory cell is kept open to prevent a steady current from flowing through the memory cell.

By setting the channel voltage to −4 V, the erase operation can be accomplished within the same erase time (about 1 ms) as in the prior art in spite of the fact that the word line voltage is 12 V.

As a result, the threshold voltage of the memory cell at erase time can be increased to or beyond the upper limit Vccmax of the source voltage Vcc providing the voltage of the selected word line for read operation. In the erase operation, erase pulses are repeatedly applied in several sessions, and after each erase operation, the operation is performed for verifying the threshold voltage of the memory cell. The voltage of the word line for the erase verification is set to about 4.2 V.

Figure 36A:
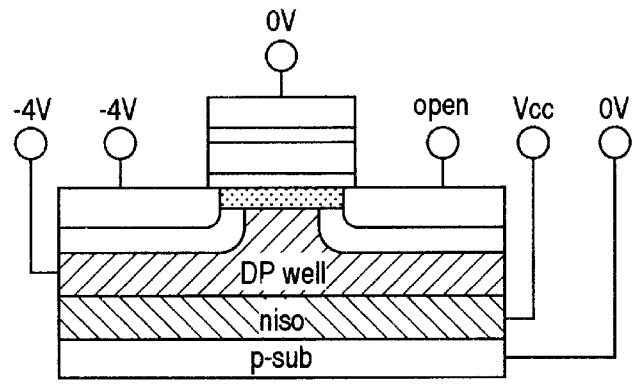
FIGS. 36A, 36B, 36C are sectional views showing a transistor illustrating examples of voltage application to a non-selected memory cell in the erase operation of a semiconductor nonvolatile memory apparatus according to an embodiment of the invention.
Figure 36B:
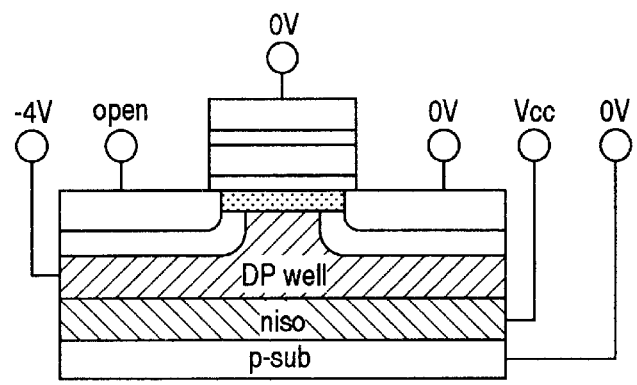
Figure 36C:
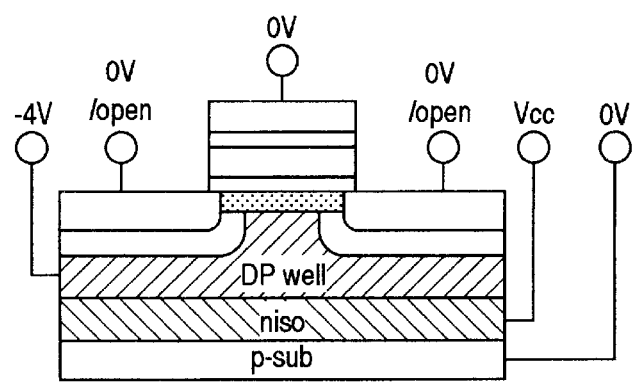

FIGS. 36A, 36B, 36C show a method of applying a voltage to non-selected memory cells.

In the method of FIG. 36A, it is assumed that the control gate is supplied with 0 V, the DP well and the source terminal are supplied with −4 V, and the drain terminal is kept open. The non-selected memory cell is subjected to a disturbance due to the channel voltage of −4 V. This voltage applied for disturbance is similar to the voltage applied inversely for disturbance of the word line at the time of read operation. The source voltage for the selected word line at the time of read operation is equal to Vcc. The maximum value Vccmax of this source voltage is 3.6 V, or an ordinary guaranteed voltage of 3.9 V with a guaranteed time of ten years ($3 \times 10^8$ seconds).

Now, let us calculate the time subjected to the erase disturbance taking the case of 512 bytes (1 byte=8 bits) by 64 Mbits as an example. Assume that the memory mat is configured as shown in FIG. 8, etc. in an open bit line system with respect to the sense latch circuits SL. The memory mat thus is divided into two portions. The number of bits of the memory cells connected to the same bit line on the same memory mat is 8k bits (1k=1024). For example, let the number j of parallel bits making up a unit block be 64 bits, the maximum erase time be 10 ms, and the number of rewrite operations be $10^6$. The memory cells in the non-selected sector of the same memory mat having a selected sector are subjected to the erase disturbance equivalent to the word line voltage of 4 V for $8 \times 10^7$ seconds.

Consequently, the voltage value of the erase disturbance life is about the same as the guaranteed value of the source voltage Vcc, and the maximum guaranteed time is included in the read guaranteed time.

In the system of FIG. 36B, the control gate is impressed with 0 V, the DP well is impressed with −4 V, the source terminal is kept open and the drain terminal is impressed with 0 V. Since the control gate voltage is equal to the channel voltage at 0 V in potential, injection of electrons into the floating gate of the non-selected memory cells is completely prevented.

With the system of FIG. 36C, on the other hand, 0 V is applied to the control gate and the DP well, and the drain terminal and the source terminal are impressed with 0 V or kept open. Like in the system of FIG. 36B, the control gate voltage is at the same potential of 0 V as the channel voltage, so that the electrons are completely prevented from being injected into the floating gate of the non-selected memory cells. Assume that the memory cells are connected as shown in FIG. 19 or 20 and that the system of FIG. 36B is applied to the memory cells of the non-selected sectors of the same block, for example. The maximum guaranteed time of erase disturbance can be reduced to $6.3 \times 10^5$ seconds.

FIG. 33 is a schematic diagram showing a memory mat according to this invention. The sectors making up the memory mat of a semiconductor nonvolatile memory apparatus include a sector (selected sector) selected for erase operation and having word lines impressed with a positive voltage, a sector (non-selected sector) not selected for erase operation and having a memory well voltage different from the word line voltage, and a sector (completely non-selected sector) not selected for erase operation and having a word line voltage equal to the source-drain voltage (channel voltage) of the memory cell.

Next, a circuit diagram of the memory mats with memory cells connected in AND type of FIG. 19 is shown in FIG. 39, a functional block diagram for generating a voltage supplied to the memory mats is shown in FIG. 40, a circuit diagram of a memory well power switching circuit MWVC is shown in FIG. 41, and a voltage conversion circuit such as a row decoder circuit XDCR and a driver circuit are shown in FIG. 42.

A built-in power circuit VS shown in FIG. 40 includes a reference voltage generating circuit, a voltage reduction circuit, a voltage boosting pump circuit, a limiter circuit and a power switching circuit, and is controlled by a mode control circuit MC. A write verify word line voltage V1v (1.5 V) can be generated by use of the reference voltage of the reference voltage generating circuit and the voltage reduction circuit configured of a current mirror circuit or the like. Also, the word line voltage Vh of 12V for erase operation, the memory well voltage Vmw of −4 V and the word line voltage V1 of −9 V for write operation are generated in the voltage boosting circuit, after which the reference voltage of the reference voltage generating circuit is used for the limiter circuit.

The memory well power switching circuit MWVC of FIG. 41 is a circuit for switching the memory well voltage between the ground voltage Vss and a negative voltage of −4 V. At the time of erase operation when the input signal MC1 is low, the source voltage of −4 V in the built-in power circuit VS is also activated. The waveform of the memory well voltage thus rises within several μs to several tens of As due to the coupling capacitance between the memory DP well and the element isolation layer niso.

The voltage conversion circuit and the driver circuit of FIG. 42 are connected to the word lines W, the gate signals SiD, SiS of the MOS transistors selected on the drain and source sides, the gate signal BDC of the MOS transistor for discharging the potential of the bit lines, the MOS transistors making up the sense latch circuits SL in the same well as the memory mat such as the gate signal TR, etc. This circuit is for switching between a voltage higher than the source voltage, the erase word line voltage Vh of 12 V or the transfer gate voltage V1h of 5 V for write operation on the one part and a negative voltage such as the erase well voltage Vmw of −4 V or the word line voltage V1 of −9 V for write operation on the other hand.

Take the word line W as an example by way of explanation. The source voltage of the PMOS transistor of the driver circuit and the voltage conversion circuit is connected to the source voltage Vcc at the time of write operation and connected to the erase word line voltage Vh of 12 V at the time of erase operation. The source voltage of the NMOS transistor in the element isolation layer niso region in the same circuit is connected to the erase well voltage Vmw which assumes −4 V only at the time of erase operation.

At the time of erase operation, the control signals MC2 and NC are activated to high level, so that only the word line W with the address signal thereof selected at high level assumes a voltage of 12 V while the voltage of the non-selected word lines assumes the ground voltage Vss. At the time of write operation, on the other hand, the control signals MC2 and /NC are activated to high level, so that only the word line W with the address signal thereof selected assumes a voltage of −9 V while the voltage of the non-selected word lines assumes the source voltage of Vcc.

The word line voltage Vh for the erase operation is raised from the source voltage Vcc to 12 V after sector selection. Due to the word line load capacitance of several pF, the waveform rises within several $\mu$s to several tens of $\mu$s. This prevents the breakdown of the MOS transistor which would otherwise be caused by the fact that if the gate signal providing the sector address is switched after the rise of the built-in source voltage, the minimum drain-source breakdown voltage BVdsmin of the MOS transistor is exceeded.

Also, in a semiconductor nonvolatile memory apparatus, the electric field for rewriting the threshold voltage of the memory cell can be prevented from being suddenly imposed and the number of rewrite operations is improved by setting the rise waveform of the voltage applied to the word line and the memory well at several $\mu$s to several tens of $\mu$s for each sector selected for erasure.

Figure 43:
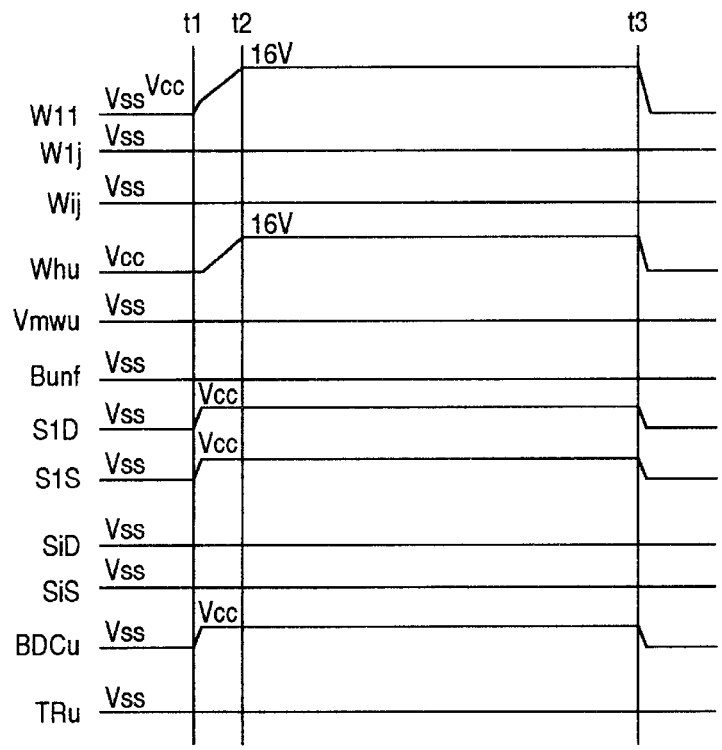
FIG. 43 is a waveform diagram showing timings of the erase operation according to the prior art.

Timing waveform diagrams for one erase pulse of the word line W11 selected at the time of erase operation are shown in FIGS. 43 to 47. These waveform diagrams are based on the circuit diagram of the memory mat shown in FIG. 39. FIG. 43 shows the erase timing waveforms according to the prior art, and FIGS. 44 to 47 show the erase timing waveforms according to the invention.

As shown in FIG. 43, the waveform for the selected word line W11 is picked up at timing t1, and rises at the leading edge of the erase word line voltage Vh. In order to reduce the channel voltage of the drain and source to the ground voltage Vss of Vmwu, S1D, S1S and BDCu are set to the source voltage Vcc. At timing t3, the word line is set to non-selected state, and the activation of the erase word line voltage Vh is terminated. The time from t2 to t3 represents the erase time for one pulse.

Figure 44:
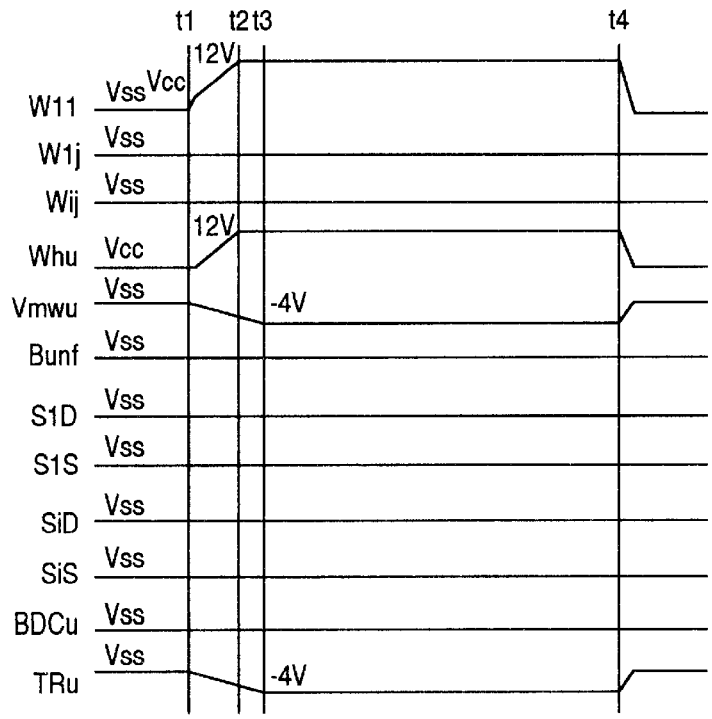
FIG. 44 is a waveform diagram showing timings of a first erase operation according to an embodiment of the invention.

FIG. 44 shows a timing waveform diagram for a first erase operation according to this embodiment. At timing t1, the word line W11 and the memory well of the selected sector are picked up and the voltages Vh and Vmwu are turned on. Even when S1D, S1S, SiD, SiS, BDCu assume Vss, the on-state of the MOS transistor keeps the channel voltage of the memory cell on the selected sector side at Vmwu of −4 V. Also, by setting the voltage of TRu to −4 V, the voltage shorting with Bunf is prevented. At timing t4, the word line is set to non-selected state and the activation of the erase word line voltage Vh and the memory well voltage Vmwu is terminated. The time from t3 to t4 represents the erase time for one pulse.

Figure 45:
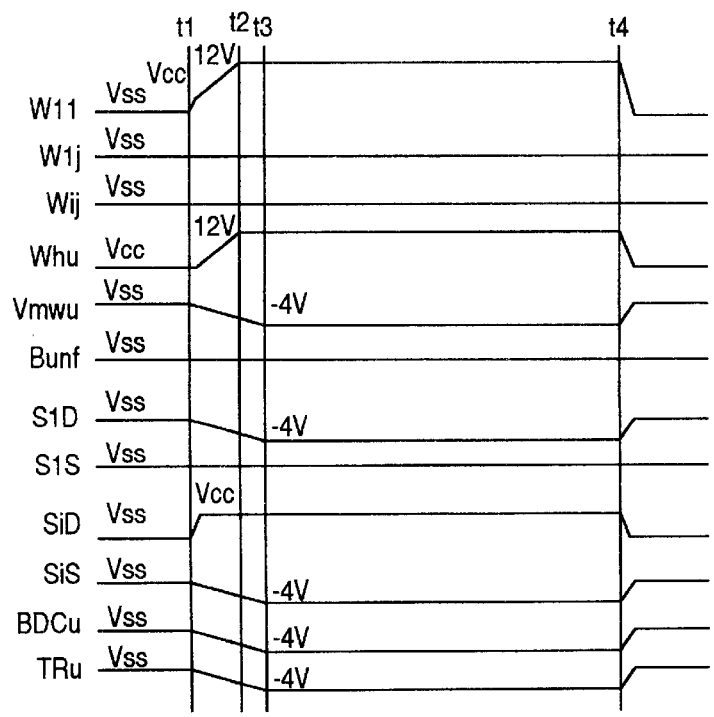
FIG. 45 is a waveform diagram showing timings of a second erase operation according to an embodiment of the invention.

FIG. 45 shows a timing waveform diagram for a second erase operation according to the present embodiment. The voltages Vh and Vmwu are raised the same way as in FIG. 44. In order to define only the same block of the selected sector as a sector to be disturbed, the channel voltage in the same block is set to −4 V and the channel voltage of the other blocks is set to Vss. TRu and BDCu are set to −4 V, and Vss of Bunf supplied from the sense latch side is connected to the bit line Bn. S1S is set to Vss and S1D is set to −4 V so that the channel voltage in the selected block is set to −4 V. SiD is set to Vcc and SiS is set to −4 V with the channel voltage set to Vss. At timing t4, the word line is set to non-selected state, and the erase word line voltage Vh and the memory well voltage Vmwu cease to be activated. The time from t3 to t4 represents the erase time for one pulse.

Figure 46:
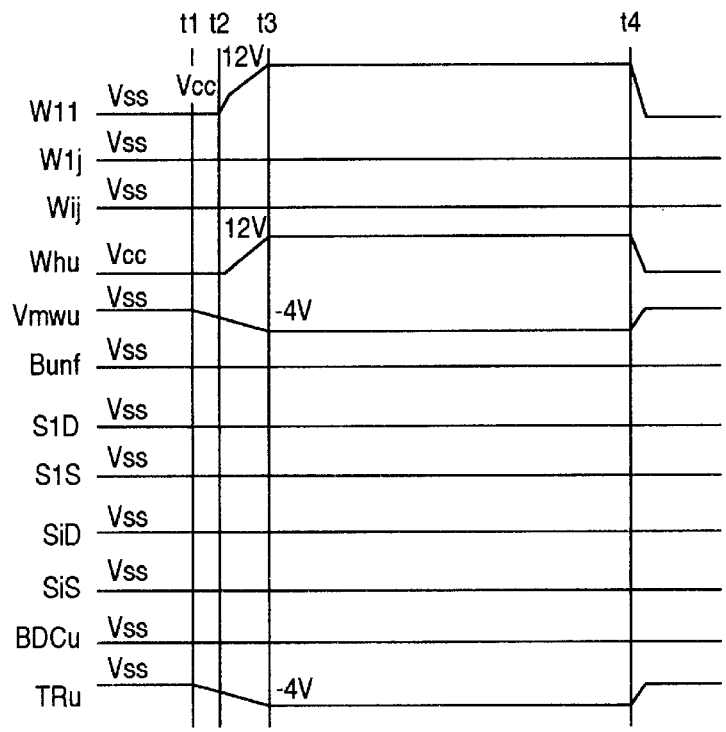
FIG. 46 is a waveform diagram showing timings of a third erase operation according to an embodiment of the invention.
Figure 47:
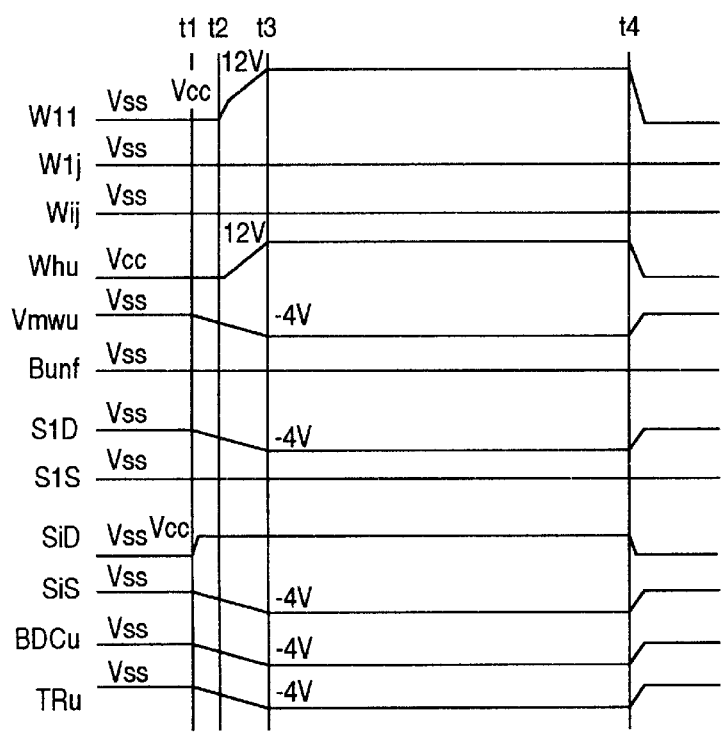
FIG. 47 is a waveform diagram showing timings of a fourth erase operation according to an embodiment of the invention.
Figure 48:
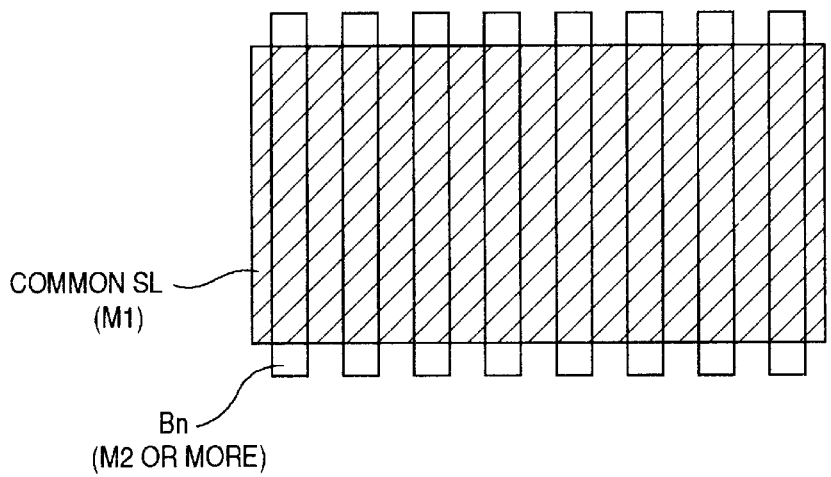
FIG. 48 is a diagram showing a layout of a metal wiring layer of a memory cell array mat section according to the present invention.

FIGS. 46 and 47 show waveforms with Vh raised at t2. The other timings are identical to those in FIGS. 15 and 16. The time before reaching a predetermined potential is varied depending on the current supply capability of the built-in source voltage and the load capacitance. For this reason, the erase start time is clarified by activating the voltage generating circuit at a timing when the time before reaching the predetermined voltage for the rise of the memory well voltage is equal to the time before reaching a predetermined word line voltage.

Next, the write operation for the memory cells will be explained. The control gate, i.e., the word line at the time of write operation is impressed with a negative voltage of, say, about −9 V, and the drain terminal of the memory cell for write operation is impressed selectively with a voltage of about 4 V. A voltage difference occurs between the floating gate and the drain, so that the electrons in the floating gate are drawn toward the drain side by the Fowler-Nordheim tunnel phenomenon. By applying 0 V to the drain terminal of the non-selected memory cells, the voltage difference between the floating gate and the drain is suppressed thereby to prevent the electrons from being discharged from the floating gate.

By the way, at the time of write operation, the source voltage Vcc is impressed as a voltage of the non-selected word lines in order to prevent the disturbance (discharge of electrons) due to the drain voltage. For this purpose, the source electrode of each memory cell is kept open to prevent a steady current from flowing through the memory cell.

The threshold voltage of the memory cell at the time of write operation is required to be between the lower limit Vccmin of the source voltage Vcc providing the selected word line voltage for read operation and the ground voltage Vss of 0 V providing the non-selected word line voltage. In the case where the threshold voltage of a non-selected memory cell drops to a negative value, a current flows in the non-selected memory cell and therefore an erroneous read operation would result. In view of this, the write operation is performed by applying write pulses repeatedly in several sessions, and each time a write operation is complete, the verify operation, i.e., the operation for verifying the threshold voltage of the memory cell is performed. The word line voltage for verifying the write operation is set to about 1.5 V so that the threshold voltage of all the memory cells to be written may not assume 0 V.

The voltage information applied to the drain terminal of the memory cell described above is stored as data in the flip-flop in the sense latch circuit connected to the drain terminal through the bit line.

A circuit diagram of the sense latch circuits SL will be explained. A circuit diagram of the sense latch circuits SL connected with the memory mats arranged in the open bit line sysmtem of FIG. 37 is shown in FIG. 38.

In FIG. 38, the sense latch circuits SL each including a flip-flop are connected to the bit lines Bun and Bdn. The sense latch circuits have the same (equivalent) configuration for connection to the bit lines Bun and Bdn. Further, the sense latch circuits SL can be connected so as to be supplied with different control signals for even-numbered and odd-numbered bit lines. This is in order to prevent the capacitance between parasitic lines of the bit lines from having an effect on the sense operation. During the sense operation of a memory cell connected to an even-numbered bit line, for example, the memory cells on the even-numbered bit lines are read at a constant value of the capacitance between parasitic lines with the odd-numbered bit lines set to potential Vss.

The configuration of the sense latch circuits SL shown in FIG. 38 will be explained, taking the bit line Bu1 of the memory mat u as an example. The bit line Bu1 is connected to a MOS transistor M1 supplied with the gate signal RCu for precharging the bit line potential, and a MOS transistor M2 for gating the precharge signal PCu through a MOS transistor M3 having the flip-flop information as a gate input signal. The connection between M2 and M3 is not limited to this. Instead, M2 can be on the source voltage Vcc side, and M3 on the bit line side. A MOS transistor M4 supplied with the gate signal TRu is connected between the bit line Bu1 and the wiring Bu1f on flip-flop side. The wiring Bu1f on flip-flop side is connected to a MOS transistor M5 supplied with the gate signal RSLu for discharging the flip-flop potential to the ground voltage Vss, a MOS transistor M6 supplied with the column gate signal Yadd according to the column address and producing the flip-flop information as a data output, and a MOS transistor M7 having a gate input signal as the flip-flip information. The drain of the MOS transistor M7 is connected to a common signal ALu and the source thereof is set to the ground voltage Vss, thus constituting a multi-input NOR circuit connection. Specifically, the information of all the flip-flops connected is judged to assume the ground voltage Vss.

Also, as shown in the circuit diagram of FIG. 39 showing the memory mat configuration, the bit line Bun is connected to a MOS transistor supplied with a gate signal BDu for discharging the potential of the bit line Bun to the source line voltage.

In FIGS. 38 and 39, the well of the MOS transistors having at least the diffusion layers of the source and drain thereof supplied with a negative voltage is formed in the same memory well as the memory cell.

The invention was explained above specifically based on embodiments. The present invention, however, is not limited to the above-mentioned embodiments, and can of course be modified variously without departing from the gist thereof.

Also, the semiconductor nonvolatile memory apparatus according to this invention not only finds application as a flash memory used for each memory unit, but is widely used as a memory apparatus of various systems including a computer system, a digital still camera system and an automotive system. A computer system will be explained as an example with reference to FIG. 19.

As described above, a semiconductor nonvolatile memory apparatus such as a flash memory according to this embodiment is applicable widely as a flash file system for a computer system.

Still another embodiment of the invention will be described in detail below with reference to FIGS. 49 to 60.

Explanation will be made about a configuration of a semiconductor nonvolatile memory apparatus according to this embodiment with reference to FIG. 57.

A semiconductor nonvolatile memory apparatus according to this embodiment is a flash memory, for example, configured of a plurality of memory mats each including transistors having a threshold voltage that can be electrically rewritten. This semiconductor nonvolatile memory apparatus comprises memory mats, a row address buffer circuit XADB, a row address decoder circuit XDCR, sense latch circuits SNS having dual function of a sense amplifier and a data latch, column gate array circuits YG, a column address buffer circuit YADB, a column address decoder circuit YDCR, an input buffer circuit DIB, an output buffer circuit DOB, a multiplexer circuit MP, a mode control circuit MC, a control signal buffer circuit CSB and a built-in power circuit VS, etc.

Figure 58:
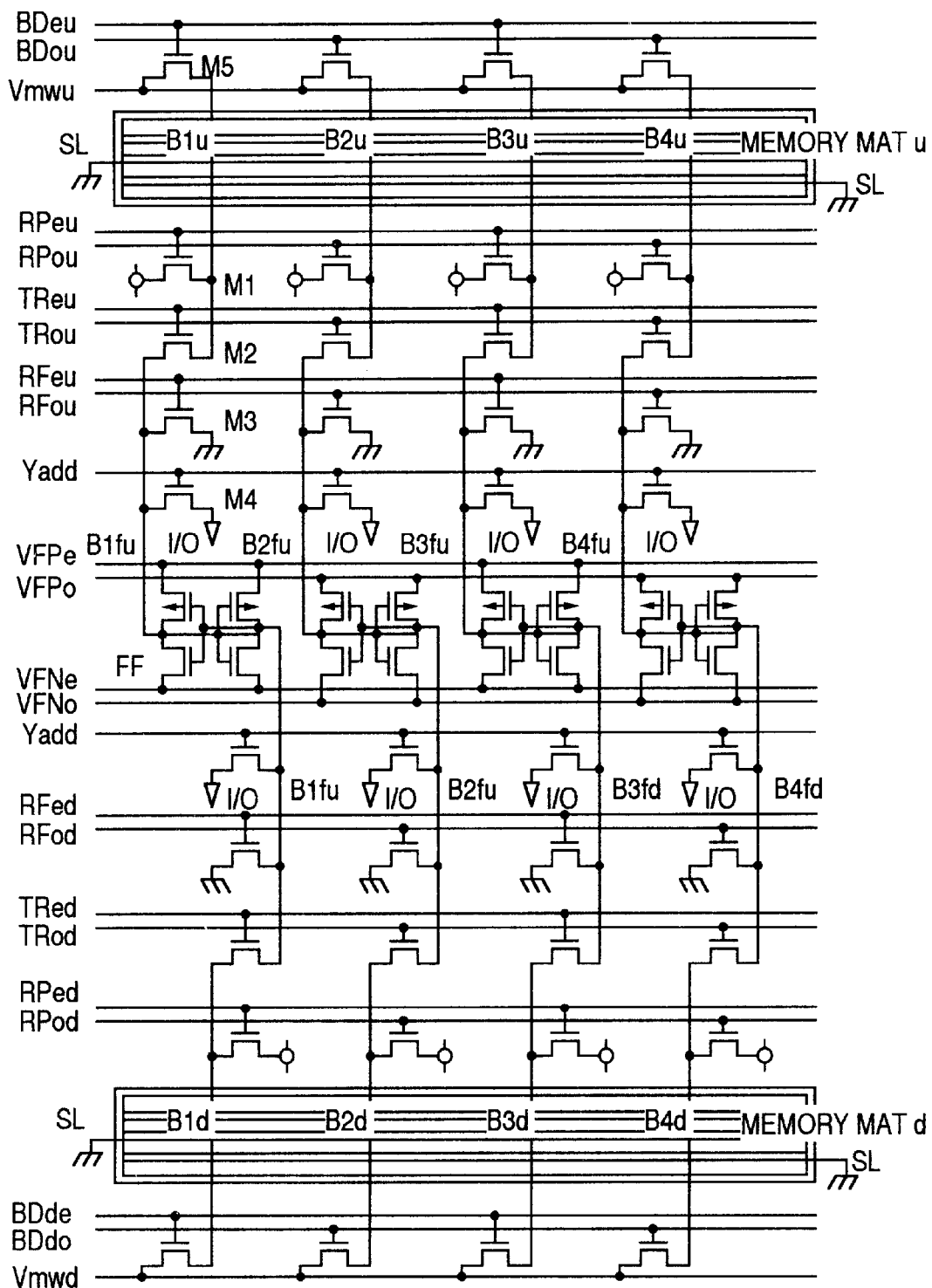
FIG. 58 is a circuit diagram showing a sense latch circuit in detail according to this embodiment.

The memory mats and the sense latch circuits SNS according to this embodiment are connected to each other in such a manner that a single sense latch circuit SNS is provided for each of the bit lines B1 to Bn. As shown in FIG. 58, for example, the sense latch circuits SNS1 to SNSn are arranged as an open bit line system on the bit lines B1u to Bnu, B1d to Bnd of the memory mats u, d.

Figure 57:
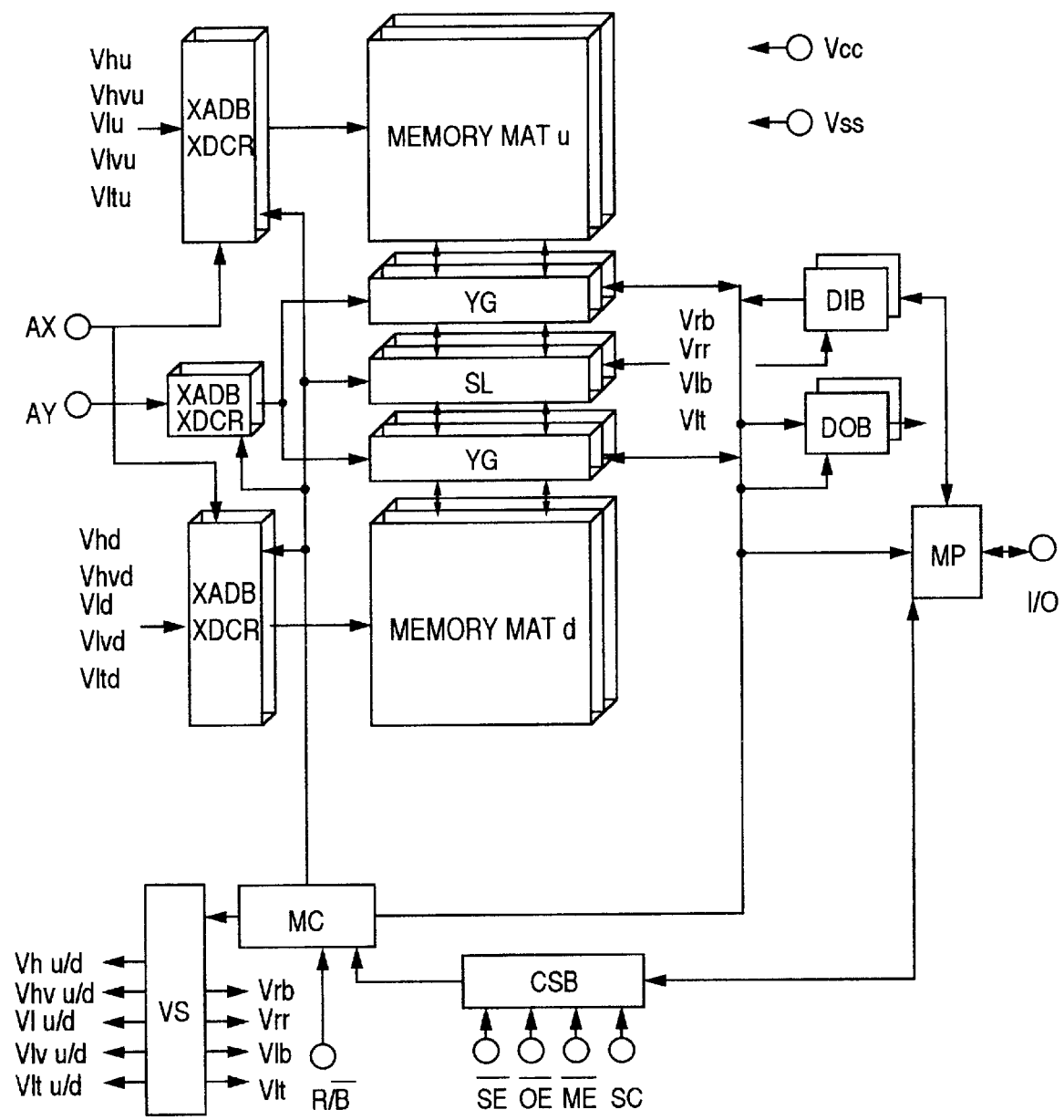
FIG. 57 is a functional block diagram showing a semiconductor nonvolatile memory apparatus according to this embodiment.

In the semiconductor nonvolatile memory apparatus shown in FIG. 57, the control signal buffer circuit CSB, though not specifically limited, is supplied with a chip enable signal, an output enable signal, a write enable signal, a serial clock signal, etc., applied to the external terminals /CE, /OE, /WE, SC, etc. In accordance with these signals, timing signals constituting internal control signals are generated. Also, the mode control circuit MC is supplied with a ready/busy signal from the external terminal R/ (/B). By the way, "/" in /CE, /OE, /WE, etc. in this embodiment designates a complementary signal.

Further, the built-in power circuit VS, though not specifically limited, is supplied with the source voltage Vcc and the ground voltage Vss from an external source, for example, and is adapted to generate a word line voltage Vh for the erase operation (for raising the threshold voltage), a verify word line voltage Vhv therefor, a word line voltage V1 for the write operation (for reducing the threshold voltage), a verify word line voltage V1v therefor, a read bit line voltage Vrb, a read reference bit line voltage Vrr, a drain terminal voltage V1d for the write operation, a transfer gate voltage V1t therefor, etc. The suffixes attached to each voltage name represent the same meaning as the suffix u/d for the memory mats supplied with the respective voltages. Incidentally, each of the above-mentioned voltages can alternatively be supplied from an external source.

Each voltage generated as described above is applied in such a manner that the word line voltages Vh, Vhv, V1, V1v and the transfer gate voltage V1t are supplied to the row address decoder circuit XDCR, and the bit line voltages Vrb, Vrr, V1d and the transfer gate voltage V1t are supplied to the sense latch circuits SNS.

In this semiconductor nonvolatile memory apparatus, complementary address signals formed through the row and column address buffer circuits XADB, YADB receiving the row and column address signals AX, AY, respectively, supplied from an external source, are applied to the row and column address decoder circuits XDCR, YDCR, respectively. Also, though not specifically limited, the row and column address buffer circuits XADB, YADB described above, for example, are activated by the chip enable select signal /CE in the apparatus, fetch the address signals AX, AY from an external terminal, and form a complementary address signal including an internal address signal in phase with the address signal supplied from an external terminal and an address signal in opposite phase.

The row address decoder circuit XDCR forms a select signal for the word lines W of a memory cell group in accordance with the complementary address signal of the row address buffer XADB, while the column address decoder circuit YDCR forms a select signal for the bit lines B of a memory cell group in accordance with the complementary address signal of the column address buffer circuit YADB. As a result, an arbitrary word line W and an arbitrary bit line B are designated and a desired memory cell is selected in the memory mats.

Though not specifically limited, in memory cell selection, for example, 8 memory cells or 16 memory cells are selected by the row address decoder circuit XDCR and the column address decoder circuit YDCR for performing the write and read operations in units of 8 bits or 16 bits, respectively. Assume that each data block contains m memory cells along the word lines (along the rows) and n memory cells along the bit lines (along the columns). Then, 8 to 16 data blocks are configured each containing m×n memory cells.

The above-mentioned memory cells, though not specifically limited, have a configuration similar to the memory cells of the EPROM, for example, and constitute well-known memory cells each having a control gate and a floating gate or well-known memory cells each having a control gate, a floating gate and a select gate. These memory cells, for example, have the same structure as the transistors of the memory cells of the flash memory announced in "International Electron Devices Meeting Tech. Dig." pp.560–563, issued in 1987, for example.

Figure 52:
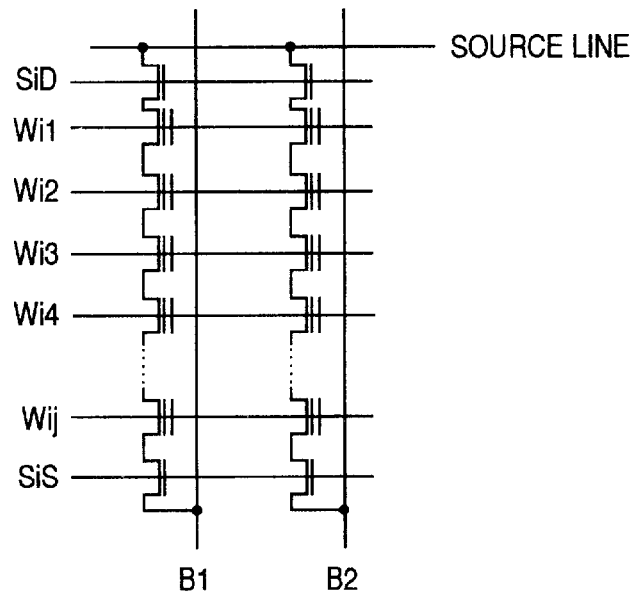
FIG. 52 is a circuit diagram showing an example connection of memory cells of NAND type.
Figure 53:
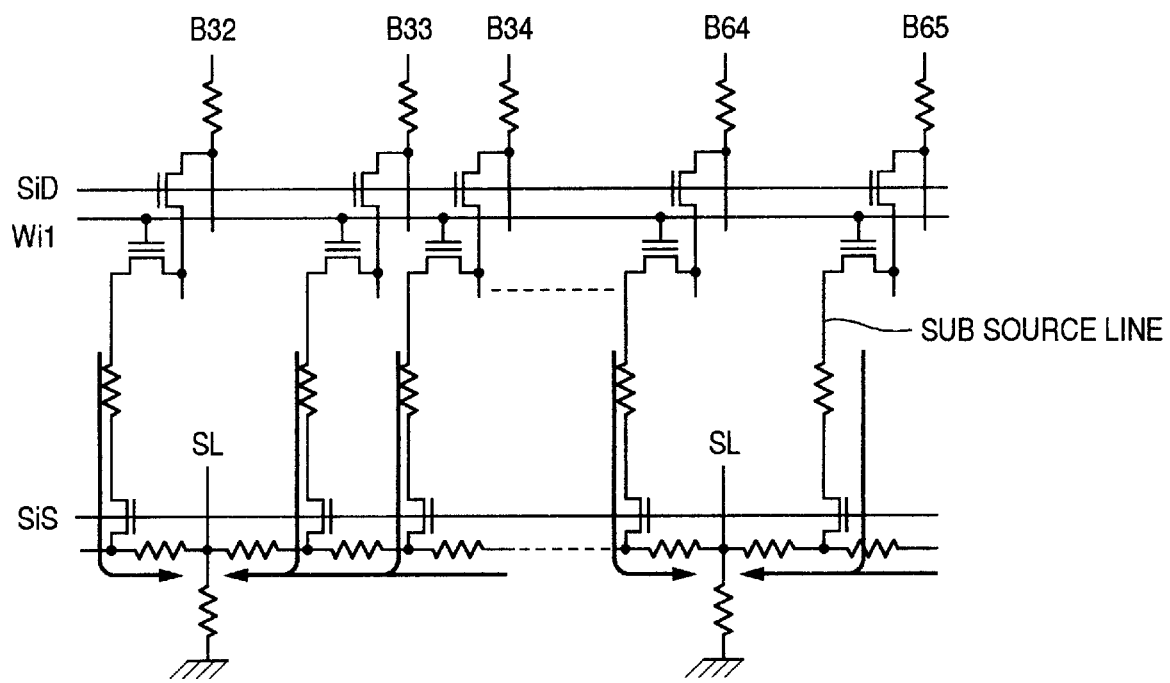
FIG. 53 is a diagram showing an equivalent circuit of a conventional memory cell array.

The NAND type structure shown in FIG. 52 has a unit block including a plurality of memory cells connected in series, which are connected through a MOS transistor on both the bit line side and the source line side.

Figure 51:
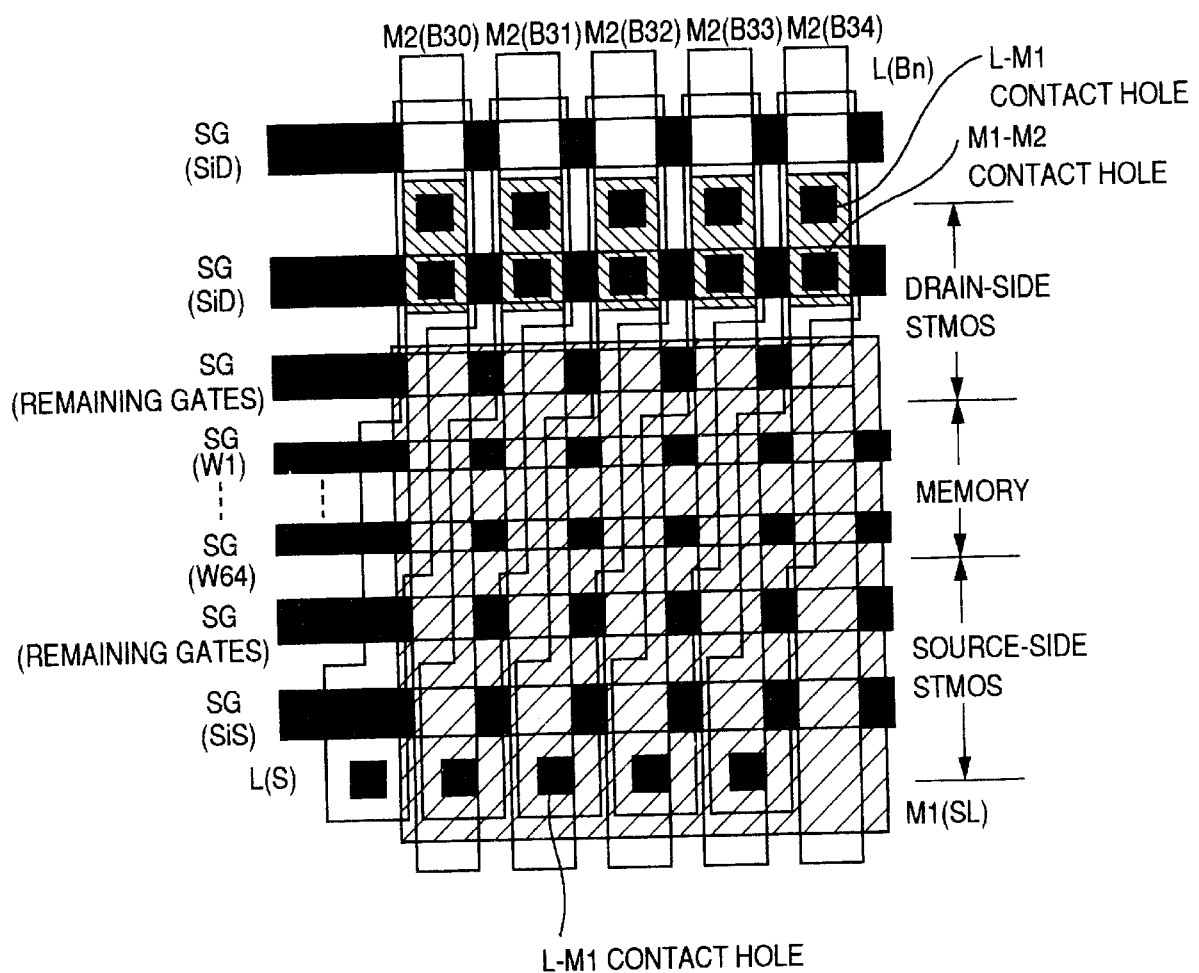
FIG. 51 is a diagram schematically showing a layout of a memory cell array section according to the present invention.

A layout of a memory mat configuration according to this embodiment will be explained below. FIG. 51 is a schematic diagram showing a layout according to the invention as compared with the schematic layout diagram of FIG. 50 described in JP-A-7-176705 as a prior art. As shown in FIG. 51, the bit lines Bn are made of metal wiring layers M2, and a common source line SL is arranged as a wide metal wiring layer M1 in parallel to the word lines. This layout is such that the sources of each unit block are connected to the common source line SL.

Figure 49:
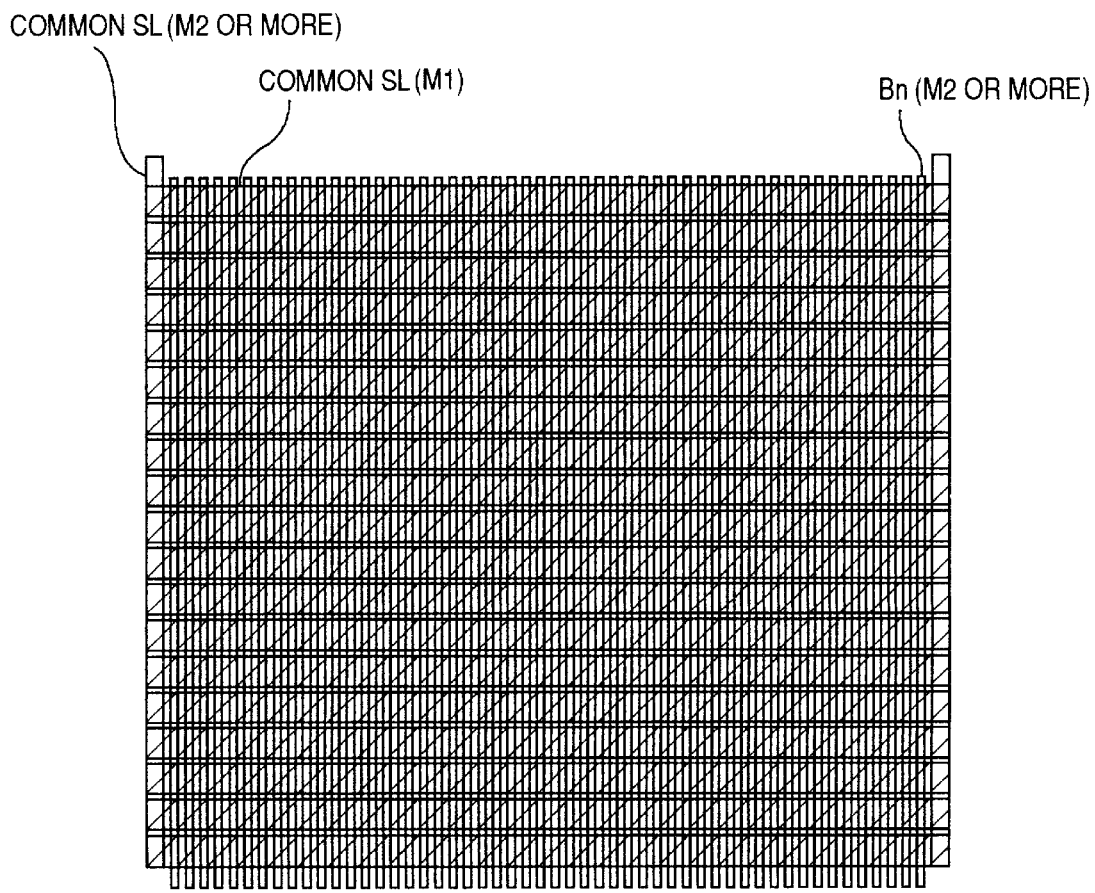
FIG. 49 is a diagram showing a layout of a metal wiring layer of a memory cell array mat section according to the present invention.
Figure 50:
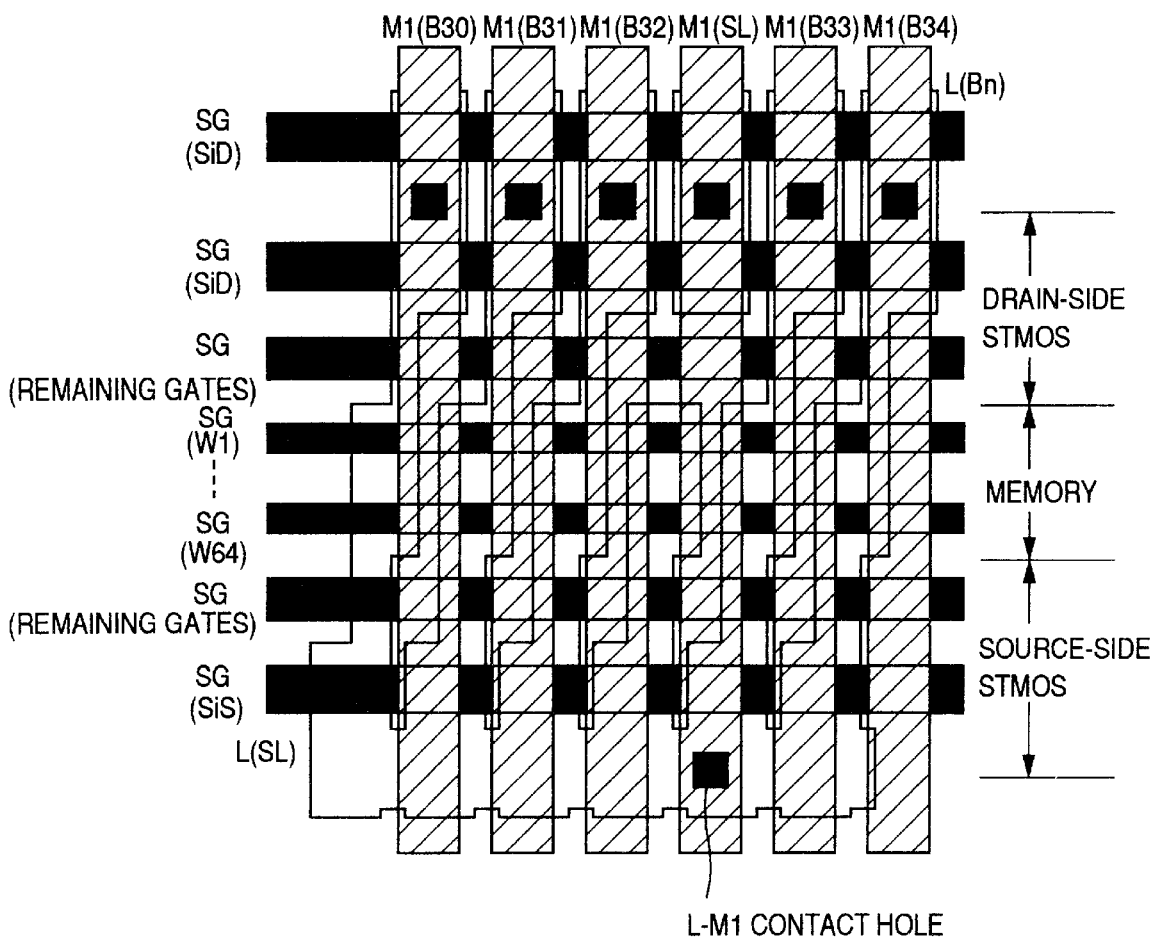
FIG. 50 is a diagram schematically showing a layout of a conventional memory cell array section.

The width of the common source line is approximately 100 times as large as the width of the bit line. FIG. 48 shows a model diagram showing a layout of a metal wiring layer with a plurality of unit blocks arranged along the bit lines, and FIG. 49 is a model diagram showing a layout of a metal wiring layer of the memory mat.

In the memory mat having a memory cell array of a semiconductor nonvolatile memory apparatus, a common source line is configured in a layout parallel to the word lines but not arranged between the bit lines. The metal wiring layer of the common source line is formed in a fabrication step before the metal wiring layer used for the bit lines. A common source line along the columns (parallel to the bit lines) making up the same metal wiring layer as the bit lines is arranged at the end of the memory mat including a dummy memory cell column.

Figure 54:
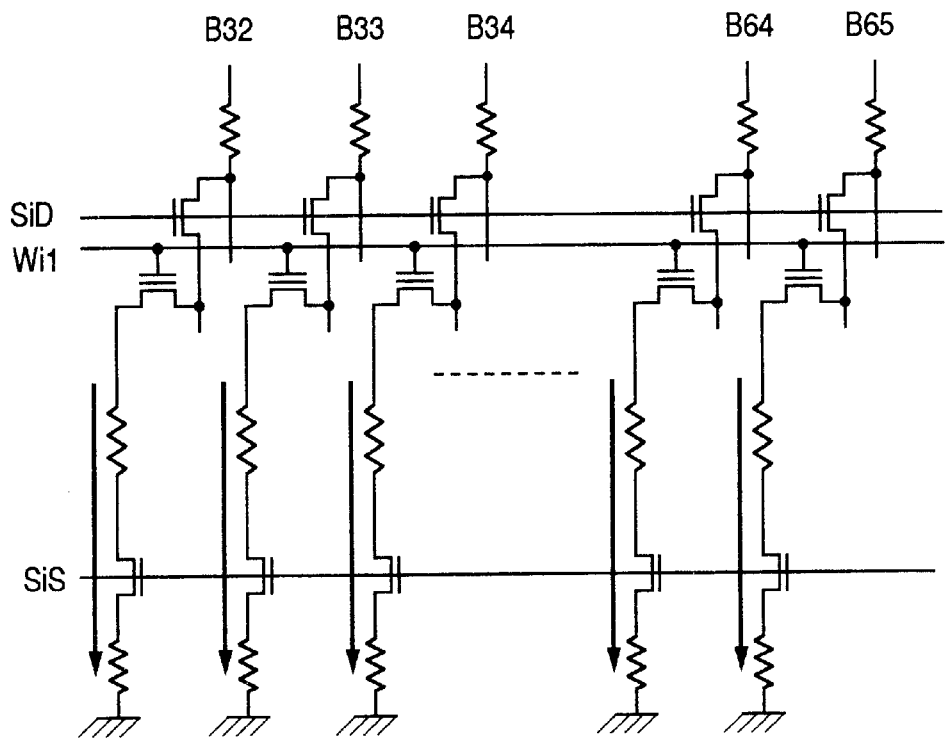
FIG. 54 is a diagram showing an equivalent circuit of a memory cell array according to this invention.
Figure 55:
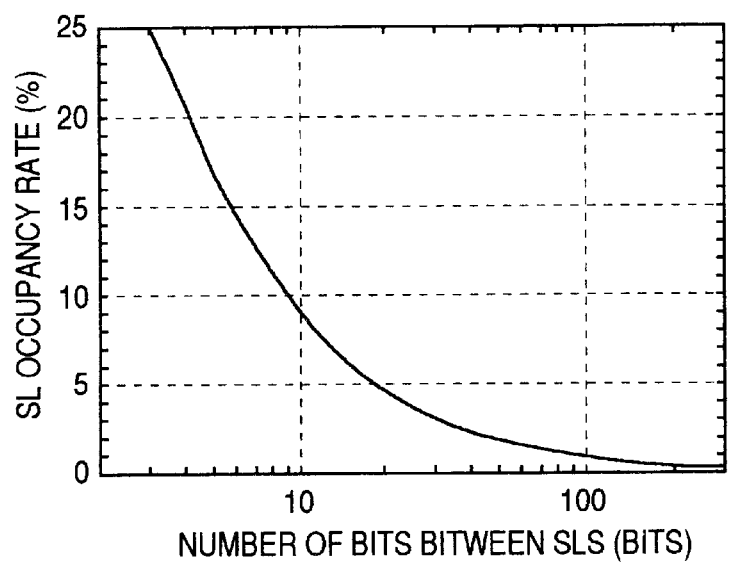
FIG. 55 is a diagram showing the ratio of the area of source lines to the number of bit lines between the source lines.

FIG. 54 shows an equivalent circuit of a memory cell array in the case where the width of the common source line is sufficiently large with a small resistance. In view of the fact that the wiring of the common source line SL has a sufficiently large width with a small resistance, the source resistance of and subsequent to the MOS transistor on source side assumes a constant value. Consequently, the threshold voltage of the memory cells due to the substrate bias effect is not varied from one word line to another, i.e., from one sector to another. Also, by removing the dummy memory cell column which has been formed under the common source line of FIG. 50, the apparatus size can be reduced.

A method of fabricating a semiconductor nonvolatile memory apparatus according to this embodiment, in addition to the steps of the conventional fabrication method described in JP-A-7-176705, includes the step of forming a metal wiring layer and a contact hole connected to the metal wiring layer.

Next, explanation will be made about the erase operation and the write operation. If the threshold voltage of a memory cell after the erase operation is to be increased to not less than the upper limit Vccmax of the source voltage Vcc providing the word line voltage for read operation, the word line constituting the control gate of the memory cell is supplied with a high voltage of about 16 V, so that the electrons in the channel are injected into the floating gate by the Fowler-Nordheim tunnel phenomenon. Also, the word line voltage can be reduced to 12 V by applying a negative voltage of −4 V to the memory well.

In write operation, the word line is impressed with a negative voltage of about −9 V, and the drain terminal of the memory cell to be written is supplied with a voltage of, say, about 4 V selectively. In this way, a voltage difference occurs between the floating gate and the drain, so that the electrons in the floating gate are drawn toward the drain side by the Fowler-Nordheim tunnel phenomenon. The drain terminal of the non-selected memory cells is supplied with 0 V, whereby the voltage difference between the floating gate and the drain is suppressed and the electrons are prevented from being discharged from the floating gate.

The threshold voltage of the memory at the time of write operation is required to be between the lower limit Vccmin of the source voltage Vcc providing the selected word line voltage for read operation and the ground voltage Vss of 0 V providing the non-selected word line voltage. In the case where the threshold voltage of a non-selected memory cell drops to a negative value, a current flows in the non-selected memory cell, resulting in a reading error. In view of this, the write operation is performed by applying a write pulse in several sessions, and after each write operation, the threshold voltage of the memory cell is verified as a verify operation. The word line voltage for verifying the write operation is set to about 1.5 V at which the threshold voltage of all the memory cells to be written is not 0 V.

By the way, the voltage information applied to the drain terminal of the memory cells described above are stored as data in the flip-flop FF in the sense latch circuit connected to the drain terminal through the bit lines.

Figure 59:
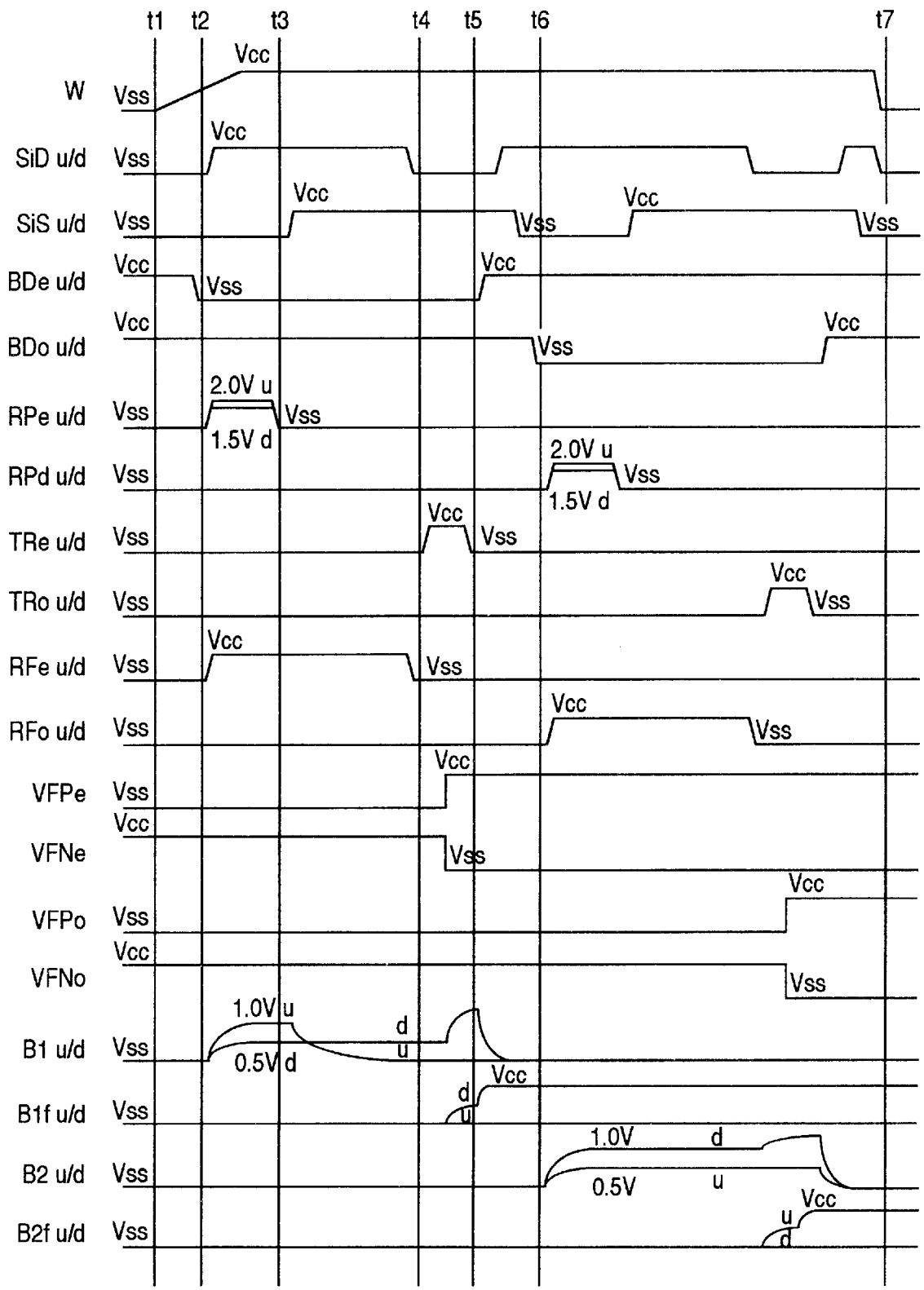
FIG. 59 is a waveform diagram showing timings of the read operation according to this embodiment.

Now, the read operation and the verify operation will be explained. In the verify operation, the voltage value for verifying the word line voltage is set to, say, 4.2 V for the write verification and to 1.5 V for the erase verification. These verify operations are performed in a manner similar to the read operation. FIG. 58 shows a circuit diagram of sense latch circuits SNS, and FIG. 59 shows a timing waveform diagram for the read operation. As shown in FIG. 58, the memory mats u/d and the sense latch circuit SNS are connected in an open bit line arrangement. The bit lines Bnu and Bnd are connected with the sense latch circuit SNS each including a flip-flop FF. The bit lines Bnu and Bnd have the same (equivalent) configuration for connection. Further, the sense latch circuits SNS are connected with different control signals for even-numbered and odd-numbered bit lines. This is in order to prevent the capacitance between parasitic lines of the bit lines from having an effect on the sense operation. As shown in the timing waveform diagram of FIG. 59, during the sense operation of a memory cell connected to an even-numbered bit line, for example, the memory cells on the even-numbered bit line side are read at a constant value of the capacitance between the parasitic lines with the potential of the odd-numbered bit lines set to Vss.

The configuration of the sense latch circuits SNS shown in FIG. 58 will be explained with reference to the bit line B1u of the memory mat u as an example. The bit line B1u is connected to a MOS transistor M1 supplied with the gate signal RPeu for precharging the bit line potential and a MOS transistor M5 supplied with the gate signal BDeu for discharging the bit line potential. A MOS transistor M2 supplied with the gate signal TReu is connected between the bit line B1u and the wiring B1fu on the flip-flop FF side. The wiring B1fu on the flip-flop side is connected to a MOS transistor M3 supplied with the gate signal RFeu for discharging the flip-flop potential to the ground voltage Vss and a MOS transistor M4 supplied with the column gate signal Yadd in accordance with the column address for producing information on the flip-flop FF as output data.

The read operation will be explained with reference to the timing waveform diagram of FIG. 59. Assume that the memory mat u is selected, and that the threshold voltage of the memory cells connected to the even side of the bit lines is that of the memory cells to be written and the threshold voltage of the memory cells connected to the odd side of the bit lines is that of the memory cells to be erased.

A word line is selected at t1 and a precharge voltage is applied to the bit lines and the sub-bit lines at t2 before t3 when the word line potential rises up to maximum. Specifically, the reset signal BDe u/d for the bit lines is deactivated and the gate signal SiD u/d for the MOS transistors on the bit line side are activated at t2, while the precharge signal RPe u/d is activated during the time from t2 to t3. In order to set the drain voltage of the selected memory cell to 1 V, i.e., in order to set the potential of the bit line Bnu to 1 V and the potential of the bit lines on the non-selected side to 0.5 V, the potential of RPeu is set to 2.0 V and the potential of RPed to 1.5 V taking the threshold voltage of the transfer MOS transistors into consideration.

During the time from t3 to t4 when the voltages of the word lines and the bit lines have reached a predetermined potential, the potential of the bit lines is discharged by the threshold voltage of the memory cell. Thus, the gate signal SiS u/d of the MOS transistors on the source line side is activated at t3, and the gate signal SiD u/d of the MOS transistors on the bit line side is deactivated at t4. Also, during the time from t2 to t4, the reset signal RFe u/d of the flip-flops FF is activated.

During the time from t4 to t5, the threshold voltage information of the memory cells is fetched by the flip-flops FF. TRe u/d is selected and the source voltages VEPe, VFNe of the flip-flops FF on even side are activated, thereby making it possible to fetch the data. Specifically, in the case where the threshold voltage providing the information on the memory cells is low, the potential of the bit lines is discharged, and when this potential is not higher than the reference voltage, the data of the flip-flops FF assumes the ground voltage Vss. In the case where the threshold voltage of the memory cells is high, on the other hand, the precharge voltage is held and therefore the data of the flip-flops FF assumes the source voltage Vcc.

During the time from t5 to t6, the bit lines, the sub-bit lines and the sub-source lines on even side are discharged to the ground voltage Vss.

Next, the read operation on odd side is performed during the time from t6 to t7 in a manner similar to the read operation on even side.

At the time point when the data of the memory cells is completely fetched by the flip-flops FF on even and odd sides, a column address of the gate signals of the column gate array circuits YG is selected and the information of a memory cell is read out at the input/output terminal I/O.

Figure 56:
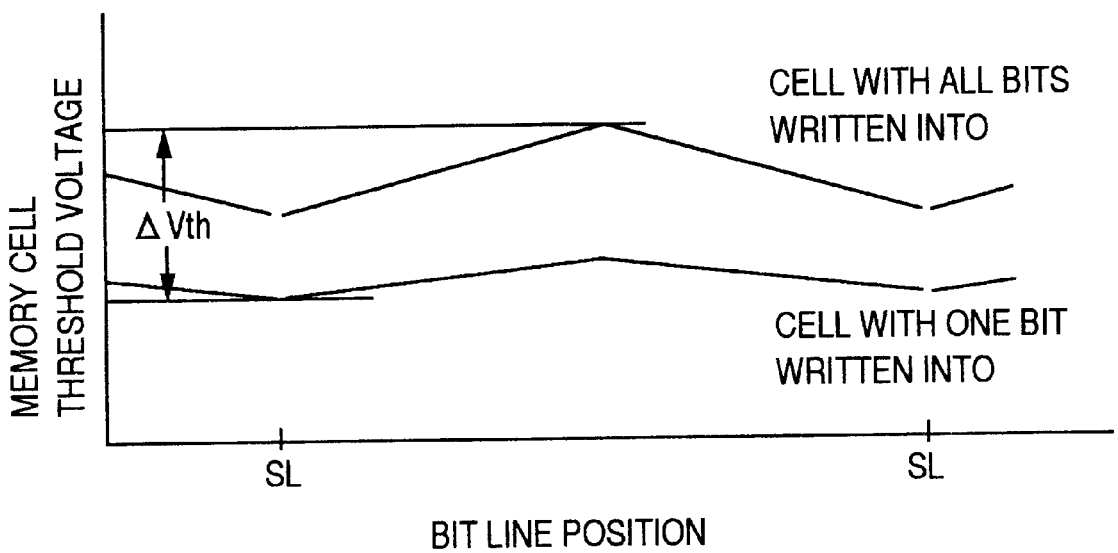
FIG. 56 is a diagram showing the dependency of the threshold voltage of the memory cells on the bit line position.

According to this embodiment, during the reading of the memory cell information, the threshold voltage difference ΔVth shown in FIG. 56 can be reduced and the information can be read in stable fashion by sector. In other words, the variations in the threshold voltage can be reduced and further the space of the apparatus can be reduced.

The invention was explained above specifically on the basis of embodiments. The invention, however, is not limited to the above-mentioned embodiments, and can of course be modified variously without departing from the gist of the invention.

Figure 60:
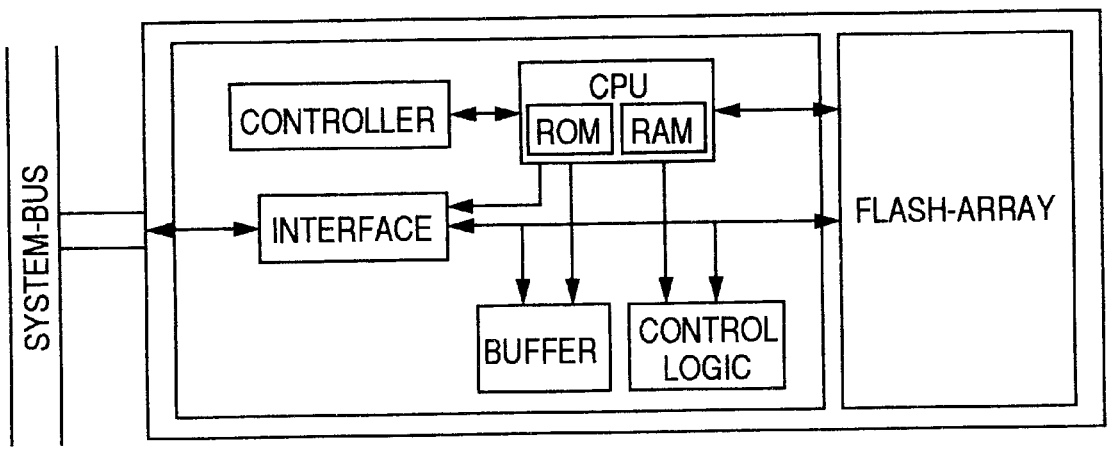
FIG. 60 is a block diagram showing an example application of a PC card.

Further, a note-sized personal computer or a computer system such as a portable information terminal uses a PC card adapted to be inserted in the system. This PC card, as shown in FIG. 60, for example, includes a central processing unit CPU having a ROM and a RAM, a flash array connected in such a manner as to be capable of transmitting data to and receiving data from the CPU, a controller, a control logic circuit connected in such a manner as to be capable of data transmission, a buffer circuit and an interface circuit.

Also, with this PC card, data can be transmitted and received between the flash array, the control logic circuit, the buffer circuit and the interface circuit. The PC card, when inserted in the system body, is adapted to be connected to the system bus through the interface circuit.

The central processing unit CPU is responsible for general management with an 8-bit data format, and thus performs such operations as interface control, rewrite and read operation control and arithmetic operation. Also, the flash array is formed of a flash device array of 32 Mbits, for example, and each sector thereof includes a 512-byte data area and a 16-byte utility area, with 8192 sectors constituting one device.

Also, the controller is formed of a cell base or a discrete IC and includes a sector table formed of a DRAM or a SRAM. Timing signals and control signals are generated from the control logic circuit. Further, the buffer circuit is used for temporarily storing data at the time of rewrite operation.

As described above, the memory unit such as a flash memory can be used also with a PC card or the like, and further this nonvolatile semiconductor memory apparatus can find wide applications in various systems requiring electrical rewrite operation.

INDUSTRIAL APPLICABILITY

The erratic phenomenon can be suppressed by adding the low-threshold verify operation and the selective restore operation to the write operation (the operation for decreasing the threshold voltage) sequence. Consequently, it is possible to improve the number of rewrite operations remarkably without setting the limitation of the number of rewrite operations taking the erratic phenomenon into consideration.

The threshold voltage of a memory cell to be written into can be suppressed within the range of a word line voltage for low-threshold verify operation to a word line voltage for high-threshold verify operation by adding the operation sequence including the low-threshold verify operation, the selective restore operation, the high-threshold verify operation and the reselective write operation to the write operation (the operation for decrasing the threshold voltage) sequence. It is thus possible to improve the read operation margin.

Especially, in an electrically rewritable semiconductor nonvolatile memory apparatus, low voltages can be supplied from a single power supply for the rewrite operation, the selective restore operation and reselective write operation by taking advantage of the Fowler-Nordheim tunnel phenomenon. Further, the erratic phenomenon can be suppressed. Especially, in a computer system or the like using this semiconductor nonvolatile memory apparatus, the power consumption and the reliability of the system can be improved by the lower voltage.

A voltage of 16 V applied to the memory cell as required for erase operation can be saved by applying 12 V to the selected word line and −4 V to the memory well. The maximum voltage for erase operation can thus be reduced to the same level as the maximum voltage for write operation. In this way, a MOS transistor with a gate insulation film of 19 nm and a gate length of about 1 $\mu$m can be used, thereby making it possible to reduce the chip size of the semiconductor nonvolatile memory apparatus.

The rise waveform of the voltage applied to the word line and the memory well for the sector selected for erase operation is set to several $\mu$s to several tens of $\mu$s, whereby an abrupt imposition of the electric field can be prevented for rewriting the threshold voltage of the memory cell and the number of rewrite operations can be improved.

Especially in an electrically rewritable semiconductor nonvolatile memory apparatus, the Fowler-Nordheim tunnel phenomenon can be utilized in the rewrite operation to accommodate low voltages in a single power supply. Further, by improving the number of rewrite operations, the resulting lower voltage can reduce the power consumption and can improve the reliability of a computer system using this semiconductor nonvolatile memory apparatus.

A common source line of memory array mats is connected for each memory cell column of a unit block, and no dummy memory cell column is arranged between bit lines. As a result, the size of the memory mat can be reduced by 3% for a reduced chip size of the semiconductor nonvolatile apparatus.

The wiring width of the common source line is increased by a factor of about 100 with respect to the wiring width of the bit line. As a consequence, the substrate bias imposed on the memory cells connected to the same word line, i.e., the same sector becomes constant. Therefore the reading of information by sector can be stabilized, i.e., the variations in threshold voltage can be reduced.

We claim:

1. A semiconductor nonvolatile memory apparatus characterized by comprising operating means for collectively or selectively decreasing the threshold voltages of a plurality of memory cells each including a control gate (1), a drain (2) and a source (3), after which the threshold voltages are collectively verified for each memory cell group connected to word lines (WL) and, after that, memory cells having a threshold voltage lower than a predetermined threshold voltage value are selected and the threshold voltages of said selected memory cells are increased collectively.

2. A semiconductor nonvolatile memory apparatus as described in claim 1, characterized by comprising operating means, in which the operation for increasing a threshold voltage in accordance with the particular threshold voltage level is divided into a plurality of sessions, and the verify operation is performed repeatedly, after which the threshold voltage value is increased for each memory cell in accordance with the threshold value of the memory cell.

3. A semiconductor nonvolatile memory apparatus as described in claim 2, characterized in that the selected word line voltage at the time of said verification is such that the word line voltage at the time of the first verify operation is not necessarily coincident with the word line voltage for the repeated verify operations.

4. A semiconductor nonvolatile memory apparatus as described in claim 2, characterized by comprising operating means for reading the written data again at a voltage higher than the word line voltage for the write verification and decreasing again the threshold voltage of a memory cell higher than the word line voltage for the write verify operation.

5. A semiconductor nonvolatile memory apparatus as described in claim 4, characterized in that said operation of increasing the threshold voltage and said operation of decreasing the threshold voltage again are repeated a preset number of times in the apparatus.

6. A semiconductor nonvolatile memory apparatus characterized by comprising a memory cell array having a plurality of nonvolatile semiconductor memory cells arranged in array each having a control gate (1), a drain (2) and a source (3), a plurality of word lines (WL) connected in common to the control gates (1) of a plurality of said memory cell groups (sectors), and a plurality of bit lines (BL) connected in common to the drains of a plurality of said memory cells, and characterized by further comprising what is generally called a sense latch circuit (SL) including at least a flip-flop (FF) for performing the sense operation and the operation of latching the written data and the data for increasing the threshold voltage for each bit line (BL) and a circuit for automatically setting the data again in the flip-flop (FF) for each bit in accordance with the threshold value of the memory cell after verification.

7. A computer system using a semiconductor nonvolatile memory apparatus as described in claims 1, 2, 3, 4 or 5, characterized by comprising at least a central processing unit and peripheral circuits in addition to said semiconductor nonvolatile memory apparatus.

8. A semiconductor nonvolatile memory apparatus characterized by comprising a plurality of memory mats each including a plurality of nonvolatile semiconductor memory cells arranged in array, each of said memory cell including a control gate (1), a drain (2) and a source (3), and characterized in that in the erase operation of collectively increasing the threshold voltages of the memory cells of the sectors associated with each of a plurality of word lines (WL) connected in common to the control gates (1) of a plurality of said memory cell groups (sectors), the voltage for said erase operation is distributed between a positive voltage applied to the word line (WL) and a negative voltage applied to the memory well and the source of each of a plurality of said memory cells, and the information in the memory cells are rewritten with the drains of a plurality of said memory cells kept open.

9. A semiconductor nonvolatile memory apparatus as described in claim 8, characterized in that the absolute value of the positive voltage applied to said word line (WL) of said semiconductor nonvolatile memory apparatus is larger than the absolute value of the negative voltage applied to said memory well.

10. A semiconductor nonvolatile memory apparatus as described in claim 8, characterized in that the sectors making up each of the memory mats includes a sector (selected sector) selected for the erase operation and having at least a word line (WL) supplied with a positive voltage, a sector (non-selected sector) not selected for the erase operation and having a word line (WL) voltage different from the memory well voltage, and a sector (completely non-selected sector) not selected for the erase operation and having a word line (WL) voltage equal to the voltage (channel voltage) between the source (3) and the drain (2) of the memory cell.

11. A semiconductor nonvolatile memory apparatus as described in claim 8, characterized in that the absolute value of the memory well voltage for the erase operation of said semiconductor nonvolatile memory apparatus is not more than the word line voltage for the read operation.

12. A semiconductor nonvolatile memory apparatus as described in claim 10, characterized by being segmented into a plurality of mats, and characterized in that a selected sector and non-selected sectors are included in the same memory mat, and in that the sectors constituting the remaining mats are completely non-selected sectors.

13. A semiconductor nonvolatile memory apparatus as described in claim 10, characterized in that said completely non-selected sectors of said semiconductor nonvolatile memory apparatus each includes at least a memory cell for applying a negative voltage to the memory well and reducing the channel voltage and the word line (WL) voltage to the ground voltage in the erase operation, or a memory cell of which the memory well voltage, the channel voltage and the word line voltage are the ground voltage in the erase operation.

14. A semiconductor nonvolatile memory apparatus as described in claim 13, characterized by comprising a plurality of unit blocks each having a plurality of memory cells connected in parallel, said memory cell having the drain (2) thereof connected to a bit line through a MOS transistor, said memory cell having the source (3) thereof connected to a source line through a MOS transistor, the same unit block containing both a selected sector and non-selected sectors, the sectors constituting the remaining blocks being completely non-selected sectors.

15. A semiconductor nonvolatile memory apparatus as described in claim 13, characterized by being formed on a P-type semiconductor substrate, and characterized in that the memory well and the well of the MOS transistor described in claim 7 are electrically isolated from said substrate.

16. A semiconductor nonvolatile memory apparatus as described in claim 8, 11 or 13, characterized in that the rise waveform of the voltage applied to the word line (WL) and the memory well of a sector of said semiconductor nonvolatile memory apparatus selected for erasure is several $\mu$s to several tens of $\mu$s.

17. A semiconductor nonvolatile memory apparatus as described in claim 16, characterized in that the time before reaching a predetermined voltage for the rise of the memory well voltage of said semiconductor nonvolatile memory apparatus is equal to the time before reaching the word line (WL) voltage.

18. A computer system using said semiconductor nonvolatile memory apparatus as described in claim 8, 11, 13, or 17, characterized by comprising at least a central processing unit and peripheral circuits thereof in addition to said semiconductor nonvolatile memory apparatus.

19. A semiconductor nonvolatile memory apparatus characterized in that a plurality of unit blocks each including a plurality of nonvolatile semiconductor memory cells each having a control gate (1), a drain (2) and a source (3) are arranged along the columns in a memory cell array, said memory cells having the drains thereof arranged on the bit line (BL) through a MOS transistor, characterized in that the metal wiring layer used for the bit line (BL) is fabricated after the metal wiring layer of a common source line (SL) arranged along the rows (parallel to the word lines (WL)), and characterized in that a common source line (SL) along the columns (parallel to the bit lines) is arranged at the end of the memory array including a dummy memory cell train and electrically connected to said common source line (SL) arranged along the rows.

20. A semiconductor nonvolatile memory apparatus as described in claim 19, characterized in that the memory cell read operation and the verify-read operation for the threshold voltage of the rewritten memory cells are performed collectively for each word line (WL) connected in common to the control gates (1) of the memory cells, and characterized by comprising a sense latch circuit for performing the sense operation and the operation of latching the rewritten data for each bit line (BL).

21. A semiconductor nonvolatile memory apparatus as described in claim 19, characterized in that the width of the metal wiring of said common source line (SL) arranged along the rows is not less than 100 times larger than the metal wiring width of said bit line.

22. A semiconductor nonvolatile memory apparatus as described in claim 19, characterized in that the source of each memory cell of said unit blocks is connected to a common source line (SL) through a MOS transistor.

* * * * *